US006784949B1

(12) United States Patent
Nagata et al.

(10) Patent No.: US 6,784,949 B1
(45) Date of Patent: Aug. 31, 2004

(54) ACTIVE MATRIX SUBSTRATE, METHOD OF MANUFACTURING THE SAME, AND IMAGE SENSOR INCORPORATING THE SAME

(75) Inventors: Hisashi Nagata, Nara (JP); Yoshihiro Izumi, Kashihari (JP); Takayuki Shimada, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/520,609

(22) Filed: Mar. 7, 2000

(30) Foreign Application Priority Data

Mar. 11, 1999 (JP) .......................................... 11-065520
Feb. 22, 2000 (JP) ...................................... 2000-045034

(51) Int. Cl.[7] .......................................... G02F 1/1343
(52) U.S. Cl. .......................................... 349/39; 349/38
(58) Field of Search .............................. 349/38, 39, 43, 349/42, 199

(56) References Cited

U.S. PATENT DOCUMENTS

| | | | | |
|---|---|---|---|---|
| 5,182,620 A | * | 1/1993 | Shimada et al. | 257/72 |
| 5,379,336 A | | 1/1995 | Kramer et al. | |
| 5,760,854 A | * | 6/1998 | Ono et al. | 349/38 |
| 5,808,706 A | * | 9/1998 | Bae | 349/38 |
| 5,923,390 A | | 7/1999 | Jung Mok et al. | |
| 5,953,084 A | | 9/1999 | Shimada et al. | |
| 6,175,393 B1 | * | 1/2001 | Ban et al. | 349/39 |
| 6,215,154 B1 | * | 4/2001 | Ishida et al. | 257/347 |

FOREIGN PATENT DOCUMENTS

| | | |
|---|---|---|
| DE | 198 28 591 A1 | 1/1999 |
| EP | 0 523 783 A | 1/1993 |
| EP | 0 602 475 A | 6/1994 |
| EP | 0 685 756 A2 | 12/1995 |
| EP | 0 783 177 A | 7/1997 |
| JP | 58-172685 A | 10/1983 |
| JP | 60-160173 A | 8/1985 |
| JP | 3-288824 A | 12/1991 |
| JP | 4-212458 A | 8/1992 |
| JP | 9-152628 A | 6/1997 |

OTHER PUBLICATIONS

Patent Abstract of Japan, vol. 016, No. 131 (P–1332), Apr. 3, 1992 & JP 03 294824 A (NEC CORP), Dec. 26, 1991.
Patent Abstracts of Japan, vol. 017, No. 332 (P–1562), Jun. 23, 1993 & JP 05 040271 A (NEC CORP), Feb. 19, 1993.
Den Boer et al., Similarities Between TFT Arrays for Direct–Conversion X–ray Sensors and High–Aperture AMLCOs:, 1998 SID International Symposium, Digest of technical Papers, vol. 29, Proceedings of SID '98, Internation Symposium, Ahaneim, CA, USA, May 17–22, 1998, pp 371–374.

(List continued on next page.)

*Primary Examiner*—Tanifur R. Choadhury
*Assistant Examiner*—Thoi V. Duong
(74) *Attorney, Agent, or Firm*—Nixon & Vanderhye P.C.

(57) ABSTRACT

A signal line and a pixel capacitor wire that doubles as a pixel capacitor electrode are fabricated parallel to each other from the same electrode layer through patterning thereof. Therefore, no additional steps are required to form the pixel capacitor wire. In such an arrangement, the pixel capacitor wire and the signal line are disposed parallel to each other; therefore, delays of signal transmission in the signal line and crosstalk between pixels are prevented from occurring. The active matrix substrate incorporating this arrangement is suitably used in liquid crystal display devices, image sensors, and the like. Similar advantages are available with an arrangement in which the signal line and the pixel capacitor wire are disposed parallel to each other, and the storage capacitor electrode, which will constitute a storage capacitor with the pixel electrode therebetween, and the scanning line are fabricated from the same electrode layer through patterning thereof.

10 Claims, 31 Drawing Sheets

OTHER PUBLICATIONS den Boer et al, "25.1: Similarities Between TFT Arrays for Direct–Conversion X–Ray Sensors and High Aperture AMLCDs", SID 98 Digest, 1998, pp. 371–374.

USSN 09/542,485, filed Apr. 3, 2000 entitled "Active Matrix Substrate, Method of Manufacturing Same and Flat–Panel Image Sensor".

USSN 09/239,855, filed Jan. 29, 1999, entitled "Two–Dimensional Image Detecting Device and Manufacturing Method Thereof".

USSN 09/229,269, filed Jan. 13, 1999, entitled "Two–Dimensional Image Detector and Process for Manufacturing the Same".

"A new digital detector for projection radiography," (Denny L. Lee, et al., Proc. SPIE vol. 2432, pp. 237–249 Medical Imaging 1995, May 1995).

Japanese KOKAI (Published unexamined patent application) No. 342098/1994 (Tokukaihei 6–342098, Published Dec. 13, 1994)—with partial translation.

* cited by examiner

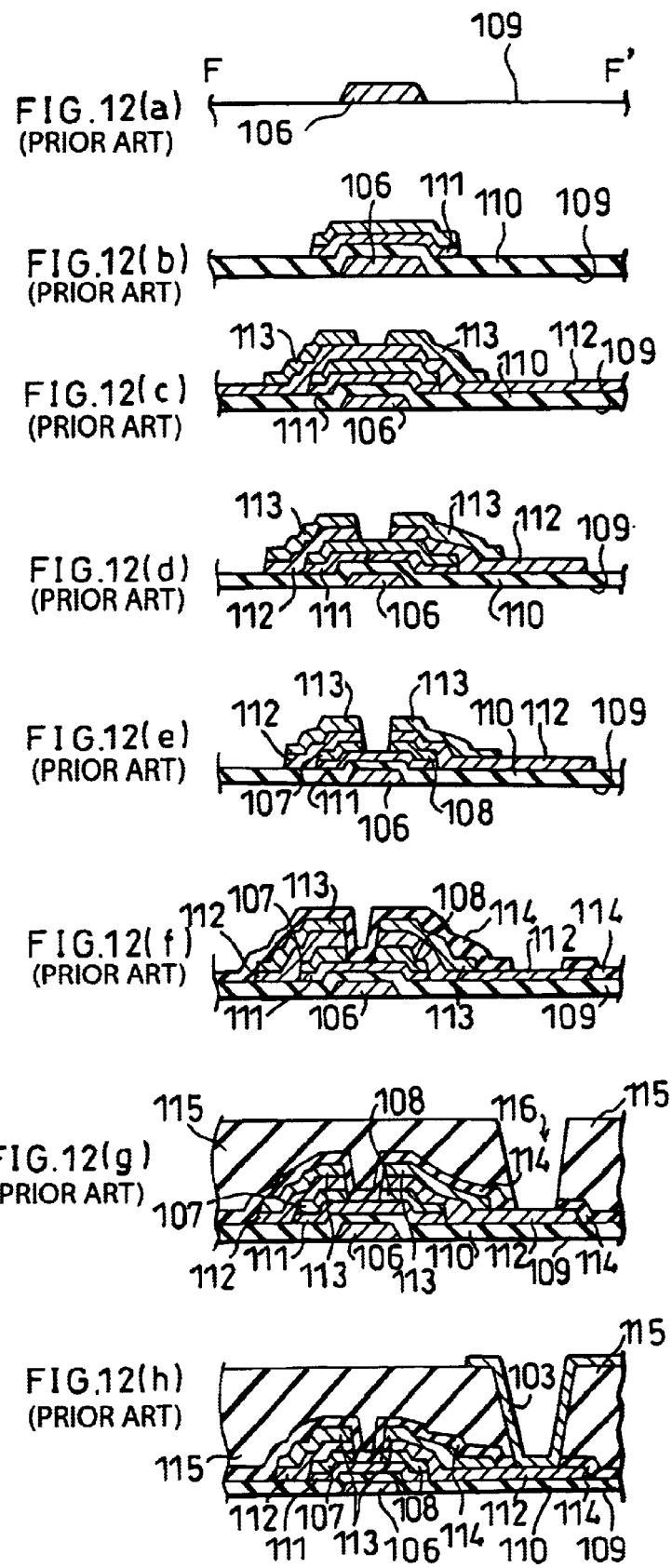

ACTIVE MATRIX SUBSTRATE, METHOD OF MANUFACTURING THE SAME, AND IMAGE SENSOR INCORPORATING THE SAME

FIELD OF THE INVENTION

The present invention relates to active matrix substrates for use in, for example, liquid crystal display devices and flat-panel-type image sensors, and methods of manufacturing such substrates, and further relates to image sensors incorporating such active matrix substrates.

BACKGROUND OF THE INVENTION

An active matrix substrate for use in, for example, a liquid crystal display device is primarily constituted by electrode wires that are signal lines and scanning lines disposed in a matrix, pixel electrodes each provided for a pixel that is encircled by the signal lines and the scanning lines, and switching elements.

Each of the switching elements, if it is of a double terminal type, is connected to one of the pixel electrodes as well as to either one of the signal lines or one of the scanning lines, and if it is of a triple terminal type, is connected to one of the pixel electrodes, one of the signal lines, and one of the scanning lines. AS the scanning line receives a predetermined voltage signal, the switching element is turned on, causing the image signal (electric potential) applied to the signal line to be transmitted to the pixel electrode. Well-known examples of switching elements for selectively driving pixel electrodes typically include TFT (Thin Film Transistor) elements of a triple terminal type and MIM (metal-insulating film-metal) elements of a double terminal type.

As shown in FIG. 9 through FIG. 11, in an active matrix substrate constituting a part of a liquid crystal display device that includes TFT elements (hereinafter, will be referred to simply as TFTs) as switching elements, the pixel is primarily constituted by electrode wires that are two signal lines 101 and two scanning lines 102 disposed in a matrix, a pixel electrode 103 provided for a pixel area that is encircled by the signal lines 101 and the scanning lines 102, and a TFT 104.

Note that FIG. 10 is a cross-sectional view taken along line F–F' in FIG. 9 and that FIG. 11 is a cross-sectional view taken along line G—G' in FIG. 9.

The TFT 104 has a gate electrode 106 connected to one of the scanning lines 102, a source electrode 107 connected to one of the signal lines 101, and a drain electrode 108 connected to the pixel electrode 103 and also to one of two terminals (transparent electrode layer 112) of a pixel capacitor (storage capacitor) 105a which will be discussed later. As a scanning signal is coupled to the scanning line 102, it drives the TFT 104, causing an image signal (video signal) coupled to the signal line 101 to be transmitted through a source electrode 107 and a drain electrode 108 and applied to the pixel electrode 103.

In the foregoing active matrix substrate, as shown in FIG. 11, the pixel capacitor 105a for storing the image signal applied to the pixel electrode 103 is constituted by a gate insulation film 110, as well as a pixel capacitor electrode (storage capacitor electrode) 105 and a transparent electrode layer 112 that are disposed opposing each other across a gate insulation film 110. The pixel capacitor electrode 105 doubles as a pixel capacitor common wire (storage capacitor common wire) that commonly connects a plurality of the pixel capacitors 105a together that are located parallel to the scanning lines 102, and is coupled to an opposite electrode on an opposite substrate (not shown) when incorporated in a liquid crystal cell.

FIG. 12(a) through FIG. 12(h) and FIG. 13(a) through FIG. 13(h) illustrate a manufacturing process of the active matrix substrate, where gate electrodes 106 and pixel capacitor electrodes 105 are formed on an insulating transparent substrate 109, and subsequently, a gate insulation film 110, a semiconductor layer 111, a $n^+$-Si layer (corresponding to source electrodes 107 and drain electrodes 108), a transparent conductive layer 112, a metal layer 113, a protection film 114, an interlayer insulation film 115, and a transparent conductive layer constituting pixel electrodes 103 are deposited and patterned in this order. The transparent conductive layer 112 and the metal layer 113 connected to the source electrodes 107 of the TFTs 104 constitute signal lines 101.

In the active matrix substrate, the pixel electrode 103 is connected to the drain electrode 108 of the TFT 104 through a contact hole 116 formed through the interlayer insulation film 115. Meanwhile, the pixel electrode 103 (see FIG. 9) is separated from the signal lines 101 and the scanning lines 102 by the interlayer insulation film 115, permitting the pixel electrode 103 to overlap the signal lines 101 and the scanning lines 102 (see FIG. 9 and FIG. 10). It is known that this structure allows improvements on the aperture ratio and prevents insufficient alignment (disclination) from occurring in the liquid crystal, which would otherwise be caused by the shielding of the electric field generated by the signal lines 101 and the scanning lines 102.

Another typical, simpler method omits the step of forming the interlayer insulation film 115 and the pixel electrodes 103 which is provided on the film 115; the transparent conductive layer 112 is provided as pixel electrodes, and a large aperture for a pixel is formed in the protection film 114 which is deposited on the transparent conductive layer 112. This structure does not give as high an aperture ratio as the foregoing structure, but enables the active matrix substrate to be fabricated by a fewer steps and provides an advantage in terms of manufacturing costs.

The active matrix substrate prepared as above can find a wide range of applications which includes liquid crystal display devices. A specific example is a photosensor, serving as a photodiode, constituted by a semiconductor-layer-deposited element formed on the pixel electrode 103 so as to provide a PIN connection and a shot key connection; the pixel capacitor (storage capacitor) 105a of each pixel stores data in the form of electric potential as the diode increases its conductivity where it is irradiated with light while applying a predetermined d.c. voltage to the other terminal of the diode.

Another example is a sensor for sequentially reading electric charges that are generated by an conversion layer provided in place of the photodiode so as to directly convert light, x-ray, etc. to electric charges and then stored in the pixel capacitor 105a using a high voltage. An embodiment is disclosed, for example, in Japanese Laid-Open Patent Application No. 4-212458/1992 (Tokukaihei 4-212458; published on Aug. 4, 1992) where each pixel stores in its pixel capacitor 105a those electric charges generated by the conversion layer as data in the form of electric charges (as data in the form of electric potential) in accordance with the characteristics of an object. Similarly to a liquid crystal display device, by sequentially scanning the scanning lines 102, for example, the data stored in a pixel selected through the scanning lines 102 is read and transmitted through an active element (corresponding to the TFT 104) to a data line (corresponding to the signal line 101). At the other end of the data line, there is provided a circuit, such as an OP amplifier, for recovering a signal from the data; a set of image data is thus obtained from the object by the sensor.

The active matrix substrate, which is a precursor to the sensor in the foregoing example with no photodiode and no light-to-electricity conversion layer, can be manufactured at low costs without new investments in manufacturing tools and facilities, because the manufacturing process for liquid crystal display devices is applicable to sensors only by adjusting the dimensions of the pixel capacitor 105a and the time constants of the active element so as to obtain optimal results when used in a sensor.

For example, there is a demand for liquid crystal display devices used as computer display elements (monitors) to handle an increasingly large amount of information. To meet the demand, the display element (display section) is inevitably growing larger in size. Besides those applications as computer monitors, larger liquid crystal display devices are increasingly popular as monitors in AV (Audio Visual) and industrial systems. Meanwhile, display elements of medium to small sizes are increasingly required to produce highly clear images. In actual practice, these tasks are hard to tackle by means of designs.

Referring to FIG. 9 through. FIG. 11, the following description will explain problems in solving the tasks more specifically. As the signal lines 101 and the scanning lines 102 are extended in response to the growing size of the display element, signal delays in the wires become no longer ignorable. Meanwhile, in medium to small sized display elements, the wires (signal lines 101 and scanning lines 102) inevitably come to have great resistance as the wires are scaled down in breadth to ensure a high aperture ratio with the already narrow pitches remaining unchanged, which results in more signal delays.

The problem of signal delays can be effectively solved by reducing the electrostatic capacity between wires, which is another factor to determine signal delays in the wires. However, the gate insulation film 110, which separates the signal lines 101 from the scanning lines 102, has further functions to decide the properties of the TFTs 104 and to constitute the pixel capacitors 105a; therefore, we cannot readily accept the use of a thinner gate insulation film 110 to reduce the electrostatic capacity per unit area.

The active matrix substrate for use in a sensor needs to clear more strict standards than the active matrix substrate for use in a liquid crystal display device; namely, noise, as well as signal delays, presents a problem that cannot be overlooked. Specifically, referring to FIG. 9 through FIG. 11, the pixel capacitor electrode 105, upon reading a signal from a target pixel, also receives a signal from an adjacent pixel that is connected commonly to the pixel capacitor electrode 105, which behaves as a noise superimposed on the target signal. Resolution is degraded by the noise, i.e., the signal obtained from the adjacent pixel, interfering with the target signal due to the electrostatic capacity between the pixel capacitor electrode 105 and the target pixel electrode 103. Alternatively, the electrostatic capacity between the pixel capacitor electrode 105 and the signal line 101 behaves as a noise in the signal line 101, and amplified by an amplifier for detecting the target signal, raising an obstruction in getting correct data. To obtain highly precise and accurate signals, the data is typically stored in greater amounts without causing an unnecessarily great increase in the pixel electric potential. This is effectively realized by setting the pixel capacitor to a great value; however, that setting would increase the impedance of a pixel capacitor common wire, resulting in aggravation of the aforementioned problems.

A more detailed explanation is given in the following about reasons that the impedance of a pixel capacitor common wire needs to be kept at a low value. In a case where the scanning line is disposed parallel to the pixel capacitor common wire, at an instant when the scanning line for a certain line is selected, all the pixels connected by means of electric capacity to the pixel capacitor common wire for that line behave as a load to the pixel capacitor common wire. In other words, in both cases of writing electric charges to a pixel and reading electric charges from a pixel, at an instant when the scanning line for a certain line is selected, the electric potentials of the pixels corresponding to the scanning line and the pixel capacitor common wire change all together, and therefore the electric potential of the pixel capacitor common wire constituting electrostatic capacitors with the pixels oscillates or shifts greatly off the value at which the electric potential of the pixel electrode common wire is desirably maintained. The electric potential of the pixel electrode common wire, if oscillates or shifts, can interfere with data, i.e., the electric potentials, for the pixels and thereby cause crosstalk.

Further, if the pixel electrode common wire crosses, and are connected by means of electric capacity to, numerous signal lines, the oscillating or shifting electric potential of the pixel electrode common wire negatively affects signals flowing through the signal line. The phenomenon is particularly manifest with liquid crystal display devices where the numerous signal lines are driven by high frequency alternating current.

For these reasons, in order to avoid negative effects on the electric potentials of the pixels and the signals flowing through the signal line and to stabilize the electric potential of the pixel capacitor common wire, the impedance of the pixel capacitor common wire needs to be kept at an extremely low value. This is achieved by, for example, composing the pixel capacitor common wire of a material of a small resistance.

Accordingly, a structure was conceived in which pixel capacitor common wires are disposed parallel to signal lines, whereas pixel capacitor common wires are disposed parallel to scanning lines in a typical structure. FIG. 14 and FIG. 15 illustrate, as an example, such a structure of an active matrix substrate for use in an x-ray sensor as disclosed in *SID 98 DIGEST* on pages 371 to 374. In the example, each pixel is surrounded by signal lines 201 and scanning lines 202 that are disposed in a matrix, and is provided with a pixel capacitor 205a in which a pixel electrode 203 opposes a pixel capacitor electrode 205 across a gate insulation film 210b. Further, pixel capacitor common wires 205b are disposed parallel to the signal lines 201.

In the foregoing structure, the signal lines 201 do not cross the pixel capacitor common wires 205b; therefore, the electrostatic capacity (load capacity) on the signal lines 201 can be decreased. The impedance of the pixel capacitor common wires 205b can also be decreased. As a result, the signal delays that occur in the signal lines 201 can be greatly diminished. In addition, crosstalk, which often raises a problem in a display device, can be prevented from happening. The structure, if adopted in an active matrix substrate for use in a sensor, can prevent the degradation in resolution caused by the noise generated by data from an adjacent pixel. Specifically, when a certain line is selected (a row of pixels parallel to the scanning line 202 to which a scanning signal is coupled so as to turn on the TFT 204 are selected) by means of a scanning line 202, the noise generated in the pixel capacitor common wire 205b may propagate along the signal line 201, but does not propagate along the scanning line 202, affecting no pixels connected to that scanning line 202. Therefore, the data obtained through the target pixel is free from negative effects from the other, simultaneously selected pixels.

However, to manufacture an active matrix substrate structured as above, additional steps should be included in the manufacturing process of an active matrix substrate shown in FIG. 12(a) through FIG. 12(h) and FIG. 13(a) through FIG. 13(h) before the formation of the pixel capacitor common wires 205b between the step of forming the scanning lines 202 (corresponding to those steps shown in FIG. 12(a) and FIG. 13(a)) and the step of forming the gate insulation film 210b (corresponding to those steps shown in FIG. 12(b) and FIG. 13(b)): namely, the additional steps are (a) the step of forming (depositing, patterning by photolithography, and etching) a transparent electrode film that is provided as the pixel capacitor electrodes 205 opposing the pixel electrodes 203 across the gate insulation film 210b, (b) the step of forming an underlying gate insulation film 210a prior to the formation of the pixel capacitor electrode 205, and (c) the step of depositing, patterning by photolithography and etching the gate insulation film 210b so as to form a contact section 205c between the pixel capacitor common wire 205b made of metal and the pixel capacitor electrode 205. Further, the gate insulation film 210b needs to be patterned for each pixel, separately from the other pixels; this requires a high level of precision in the patterning which can be achieved only through the use of costly photomasks and precise control of conditions in exposure to light and etching.

No protection film (corresponding to, for example, the protection film 114 in FIG. 10) is provided to protect the TFT 204; however, to improve the reliability of the device, such as an x-ray sensor, an inorganic protection film is preferably interposed between the TFT 204 and an interlayer insulation film 215 typically constituted by an organic film. In actual practice, an inorganic film composed of silicon nitride, for example, is interposed in the active matrix substrate for use in a conventional device. Consequently, the same number of steps are required after the completion of the formation of the gate insulation film 210b as in the conventional method shown in FIG. 9.

Therefore, the total cost will increase by the addition of the steps of depositing and patterning the transparent electrode film that will serve as the pixel capacitor electrodes 205, the addition of the steps of depositing and patterning (etching) the gate insulation film 210b, and the additionally required precision in the patterning of the gate insulation film 210b. Besides, if viewed in the balance with mass production, we cannot benefit a lot from the adoption of the above process and an resultant increase in the number of steps in the manufacture of active matrix substrates of small to medium sizes where design rules are relatively simple: the adoption would create another problem of reduced productivity of the manufacturing line because of the need for the manufacturing line to be adjusted so as to handle various processes depending on the sizes of active matrix substrates.

Besides, if the pixel capacitor electrodes 105 are provided below the gate insulation film 110 as shown in the arrangement shown in FIG. 10 and FIG. 11, a simple method of providing a transparent conductive layer 112 as pixel electrodes become applicable as previously mentioned, except the step of forming the interlayer insulation film 115 and the pixel electrodes 103 thereon. By contrast, if the pixel capacitor common wires 205b are provided on the gate insulation film 210b as shown in the arrangement shown in FIG. 14 and FIG. 15, such an simple method cannot be applied.

Further, in the active matrix substrate shown in FIG. 14 and FIG. 15, a through hole which is large enough to form a supplementary capacitor is provided in the interlayer insulation (polymer) film 215 that is deposited in a thickness of 2 $\mu$m or more; if such an active matrix substrate is used in a liquid crystal display device, since the through hole is located in an important part for image display (the part where light passes in the case of a liquid crystal display device of a transparent type), the through hole disturbs alignment of the liquid crystal. Therefore, contrast degradation and other serious problems in terms of display quality are highly likely to occur.

Meanwhile, U.S. Pat. No. 5,182,620. (corresponding to Japanese Laid-Open Patent Application No. 3-288824/1991 (Tokukaihei 3-288824), published on Dec. 19, 1991) discloses an active matrix substrate including TFTs of a top gate structure (normal stagger structure) as switching elements, wherein pixel electrodes are disposed on an interlayer insulation film to achieve a high aperture ratio, and supplementary capacitor wires are disposed parallel to signal lines. Besides, the semiconductor layer of TFTs and the lower electrodes constituting capacitors are fabricated from a polycrystalline silicon thin film through patterning and other steps. Gate bus wires, gate electrodes, and upper electrodes constituting capacitors are also fabricated from a polycrystalline silicon thin film through patterning and other steps. Each of the supplementary capacitor is formed by providing a lower electrode constituting the capacitor so as to oppose an upper electrode constituting the capacitor across an insulation film.

However, the arrangement cannot be applied to an active matrix substrate with TFTs of an amorphous silicon type for the following reasons. If at least either of the lower and upper electrodes constituting a capacitor are formed from amorphous silicon, stable capacity properties are not available due to the replacement of the polycrystalline silicon thin film for an amorphous silicon thin film. More specifically, amorphous silicon has a lower conductance than polycrystalline silicon, and the capacity is more likely to be changed by voltage in a TFT of an amorphous silicon type.

Besides, an active matrix substrate including TFTs of an amorphous silicon type better restrains leak currents from TFTs caused by light projection onto the active matrix substrate, if the TFTs are of an inverted stagger structure, instead of a normal stagger structure.

SUMMARY OF THE INVENTION

In order to solve the foregoing problems, the present invention has an object to offer an active matrix substrate capable of preventing signal transmission delays in signal lines and crosstalk between pixels without an increase in the number of manufacturing steps, and to offer a method of manufacturing such an active matrix substrate. The present invention has another object to offer an image sensor incorporating such an active matrix substrate.

An active matrix substrate in accordance with the present invention, in order to achieve the objects, includes:

a pixel electrode provided for each pixel constituted by a scanning line and a signal line that are disposed in a matrix as a whole;

a switching element located near a point where the scanning line crosses the signal line, so as to be connected to the scanning line, the signal line, and the pixel electrode;

a storage capacitor electrode for constituting a storage capacitor with the pixel electrode therebetween; and a storage capacitor common wire disposed parallel to the signal line, wherein the signal line, the storage capacitor electrode, and the storage capacitor common wire are fabricated from a single electrode layer through patterning thereof.

With the arrangement, the signal lines can be fabricated concurrently with the storage capacitor electrodes and the storage capacitor common wires; therefore, the active matrix substrate can be manufactured with its storage capacitor common wires disposed parallel to the signal line without an increase in the number of manufacturing steps or in the manufacturing cost of the active matrix substrate.

More specifically, for example, a conventional manufacturing line for liquid crystal display devices (in which the signal lines cross the storage capacitor common wires at right angles) can be used without modifying the process in order to manufacture high-performance active matrix substrates for use in liquid crystal display devices, sensors, and the like; therefore, no investment is required for new equipment and tools and the productivity of the line is no likely to decline.

Besides, if the active matrix substrate of such a structure is used in, for example, a liquid crystal display device, image sensor, or other similar devices, the signal lines cross the scanning lines alone (in other words, the signal lines do not cross the storage capacitor common wires); therefore noise and delays in signal transmission can be effectively prevented. Pixels are hence charged quickly. Further, since the switching elements connected to pixels that share a single storage capacitor common wire do not simultaneously turned on, crosstalk can be prevented.

That is, active matrix substrates can be manufactured that are capable of preventing delays in signal transmission from occurring in signal lines and crosstalk from occurring between pixels without an increase in the number of steps.

As laid out above, the active matrix substrate in accordance with the present invention can prevent delays in signal transmission in signal lines because of a relatively low time constant of the signal lines, which is derived from the electrostatic capacity between the signal lines and the other wires that is reduced by the signal lines crossing none of the storage capacitor common wires unlike in conventional active matrix substrates.

Incidentally, as is often found in conventional liquid crystal display devices, a signal of a constant amplitude and 180° out of phase with the signal supplied to the signal lines is in some cases supplied to the storage capacitor common wires and the opposite electrodes that are disposed opposing the pixel electrodes in order to reduce the amplitude of the signal supplied to the signal lines. When this is the case, signal delays in the storage capacitor common wires are another problem.

However, since so-called floating gate drive is carried out whereby a signal of an identical amplitude to, and in phase with, the signal supplied to the storage capacitor common wires is superimposed on the off electric potential of the scanning lines; therefore, the voltage difference between the scanning lines and the storage capacitor common wires is always constant in a case in accordance with the present invention.

In other words, no capacitor components other than a stray capacity contribute to an increase in the time constant of the storage capacitor common wires; therefore, the invention has an advantage that there are substantially no signal delays in the storage capacitor common wires.

Note that the storage capacitor electrodes and the storage capacitor common wires may be fabricated from the same electrode layer through patterning thereof so that the storage capacitor common wires interconnect the storage capacitor electrodes of adjacent pixels, or may be fabricated so that each of the storage capacitor common wires is commonly connected to a plurality of pixels and provided on the storage capacitor electrodes that are formed individually for each of the plurality of pixels.

In the former event, if the signal lines have a single layer structure, the signal lines, the storage capacitor electrodes, and the storage capacitor common wires can be fabricated from the same electrode layer through patterning thereof. In the latter event, if the signal lines have a double layer structure, the signal lines, the storage capacitor electrodes, and the storage capacitor common wires can be fabricated concurrently by fabricating the storage capacitor electrodes and the layer below the signal lines from the same electrode layer through patterning thereof and fabricating the storage capacitor common wires and the layer on the signal lines from the same electrode layer through patterning thereof; therefore, the foregoing advantages of the present invention are still available.

Another active matrix substrate in accordance with the present invention includes:

a pixel electrode provided in each pixel area bounded by a scanning line and a signal line that are disposed in a matrix as a whole;

a switching element connected to the scanning line, the signal line, and the pixel electrode;

a storage capacitor electrode for constituting a storage capacitor with the pixel electrode therebetween; and a storage capacitor common wire disposed parallel to the signal line so as to be connected to the storage capacitor electrode, wherein the signal line and the storage capacitor electrode may be fabricated from a single electrode layer through patterning thereof.

As laid out above, the storage capacitor electrodes and the storage capacitor common wires may be fabricated from the same electrode layer through patterning thereof so that the storage capacitor common wires interconnect the storage capacitor electrodes of adjacent pixels, or may be fabricated so that each of the storage capacitor common wires is commonly connected to a plurality of pixels and provided on the storage capacitor electrodes that are formed individually for each of the plurality of pixels.

In either event, if the signal lines and at least the storage capacitor electrodes are fabricated from the same electrode layer through patterning thereof, conventional manufacturing steps can be used as they are and the same advantages are still available.

A further active matrix substrate in accordance with the present invention, in order to achieve the objects, includes:

a pixel electrode provided in each pixel area bounded by a scanning line and a signal line that are disposed in a matrix as a whole;

a switching element connected to the scanning line, the signal line, and the pixel electrode;

a storage capacitor electrode for constituting a storage capacitor; and a storage capacitor common wire disposed parallel to the signal line so as to be connected to the storage capacitor electrode, wherein the storage capacitor is formed between the pixel electrode and the storage capacitor electrode, and the scanning line and the storage capacitor electrode may be fabricated from a single electrode layer through patterning thereof.

The arrangement offers the same advantages as those derived from the active matrix substrate characterized by the inclusion of the signal lines, the storage capacitor electrodes, and the storage capacitor common wires that are fabricated from a single electrode layer through patterning thereof.

Specifically, since the signal lines have smaller electrostatic capacitors, the S/N ratio improves, and the signal lines cause smaller signal delays. Besides, since crosstalk of signals in the storage capacitor common wires can be prevented from degrading resolution, and the load on the storage capacitor common wires is greatly reduced, little work is needed in design to reduce the impedance of the storage capacitor common wires to improve on the precision of signals.

Besides, the active matrix substrate in accordance with the present invention is extremely advantageous in terms of cost, since a conventional manufacturing device for active matrix substrates for use in liquid crystal display devices can be used only with slight modification in pattern design.

Besides, the active matrix substrate in which the scanning lines and the storage capacitor electrodes constituting storage capacitors with the pixel electrodes are fabricated from the same layer is advantageous when it is used in an image sensor of a large pixel capacitor by incorporating expanded storage capacitor electrodes, since the aperture area of the pixel electrodes formed by providing a conversion layer on the pixel electrodes is not affected by a possible light blocking property of the storage capacitor electrodes owing to the formation of the pixel electrodes on the insulation film subsequently to the formation of the scanning lines and the storage capacitor electrodes.

An image sensor having a large pixel capacitor value can efficiently collect the electric charges generated by the projection of an x-ray onto the conversion layer, and prevent inconveniences such as electric charges leaking from a switching element due to an abnormally increased pixel electric potential or a broken switching element per se.

Alternatively, the pixel electrode, constituting a storage capacitor with the storage capacitor electrode therebetween, may be replaced with a conductive body layer provided separately from the pixel electrode so that the conductive body layer and the storage capacitor electrode sandwich the insulation layer (e.g., gate insulation layer).

In other words, the active matrix substrate in accordance with the present invention may include:

a pixel electrode provided in each pixel area bounded by a scanning line and a signal line that are disposed in a matrix as a whole;

a switching element connected to the scanning line, the signal line, and the pixel electrode;

a storage capacitor electrode for constituting a storage capacitor; and a storage capacitor common wire disposed parallel to the signal line so as to be connected to the storage capacitor electrode, wherein the active matrix substrate further includes a conductive layer provided so that the conductive layer and the storage capacitor electrode sandwich an insulation layer, the storage capacitor is formed between the conductive layer and the storage capacitor electrode, and the scanning line and the storage capacitor electrode are fabricated from a single electrode layer through patterning thereof.

The active matrix substrate arranged in accordance with the present invention is suitable when the switching element has a bottom gate structure.

Further, the active matrix substrate arranged in accordance with the present invention is suitable when the switching element is a thin film transistor of an amorphous silicon type (TFT of an a-Si type).

Still another active matrix substrate in accordance with the present invention, in order to achieve the objects, includes:

a pixel electrode provided in each pixel area bounded by a scanning line and a signal line that are disposed in a matrix as a whole;

a switching element connected to the scanning line, the signal line, and the pixel electrode;

a storage capacitor electrode for constituting a storage capacitor with the pixel electrode therebetween; and a storage capacitor common wire disposed parallel to the signal line so as to be connected to the storage capacitor electrode, wherein the scanning line and the pixel electrode may be fabricated from a single electrode layer through patterning thereof.

The arrangement offers the same advantages as those derived from the active matrix substrate characterized by the inclusion of the signal lines, the storage capacitor electrodes, and the storage capacitor common wires that are fabricated from the same electrode layer through patterning thereof.

In addition, after depositing a gate insulation film on the layer constituted by the scanning lines and the pixel electrodes, forming the switching elements, the signal lines, the storage capacitor electrodes, and the storage capacitor common wires, and forming a protection film, the protection film and the gate insulation film can be concurrently patterned using the same photomask and the like to form aperture sections in the pixel electrodes.

Therefore, when the scanning lines and the pixel electrodes are fabricated from the same electrode layer through patterning thereof as in the foregoing, the use of the single photomask and the patterning of the protection film and the gate insulation film in a single step results in combination in reducing manufacturing cost by great amounts.

In addition, the pixel electrodes are kept protected by the gate insulation film up to the step of patterning the protection film; therefore, the surfaces of the pixel electrodes are hardly contaminated. As a result, if a conversion layer is deposited on an active matrix substrate of such an arrangement so as to constitute an image sensor, the conversion layer can be deposited on the aperture sections in the pixel electrodes in a stable manner; therefore, the image sensor shows high performance and gives good yields in manufacture.

Another active matrix substrate in accordance with the present invention, in order to achieve the objects, includes:

a first pixel electrode provided for each pixel area bounded by a scanning line and a signal line that are disposed in a matrix as a whole;

a switching element connected to the scanning line, the signal line, and the first pixel electrode;

a second pixel electrode connected to the first pixel electrode;

a storage capacitor electrode for constituting a storage capacitor with the second pixel electrode therebetween; and a storage capacitor common wire disposed parallel to the signal line so as to be connected to the storage capacitor electrode, wherein the scanning line and the second pixel electrode may be fabricated from a single electrode layer through patterning thereof.

The arrangement offers the same advantages as those derived from the active matrix substrate characterized by the inclusion of the signal lines, the storage capacitor electrodes, and the storage capacitor common wires that are fabricated from the same electrode layer through patterning thereof.

In addition, the second pixel electrodes require only a small area when no large storage capacitors are required; therefore, even if the second pixel electrodes are formed from a metal or other light blocking material as are the scanning lines, the light blocking area can be minimized. Further, since the first pixel electrodes can be formed from ITO (Indium Tin Oxide) or other light passing materials, the active matrix substrate incorporating such pixel electrodes is suitably used in a liquid crystal display device of a transparent type which has large aperture sections. Further, since ITO or other such materials constituting the first pixel electrodes is stable, when the active matrix substrate of the foregoing arrangement is used to constitute an image sensor, a conversion layer can be deposited on the first pixel electrodes in a stable manner.

Besides, when the conversion layer needs to be refreshed through projection of light, since the light blocking area is minimized as laid out above, a sufficient amount of light can be projected on the conversion layer from a desired direction.

A method of manufacturing an active matrix substrate in accordance with the present invention, in order to achieve the objects, is a method of manufacturing an active matrix substrate arranged in the foregoing manner, and includes the step of fabricating the signal line, the storage capacitor electrode, and the storage capacitor common wire from a single electrode layer through patterning thereof.

According to the method, the storage capacitor electrodes and the storage capacitor common wires can be formed concurrently with the signal lines; therefore, active matrix substrates can be manufactured that include storage capacitor common wires parallel to signal lines without an increase in the number of steps. Specifically, for example, a conventional manufacturing line for liquid crystal display devices (in which the signal lines cross the storage capacitor common wires at right angles) can be used without modifying the process in order to manufacture high-performance active matrix substrates for use in liquid crystal display devices, sensors, and the like; therefore, no investment is required for new equipment and tools and the productivity of the line is no likely to decline.

Another method of manufacturing an active matrix substrate in accordance with the present invention, in order to achieve the objects, is a method of manufacturing an active matrix substrate including:

a pixel electrode provided in each pixel area bounded by a scanning line and a signal line that are disposed in a matrix as a whole;

a switching element connected to the scanning line, the signal line, and the pixel electrode;

a storage capacitor electrode for constituting a storage capacitor with the pixel electrode therebetween; and a storage capacitor common wire disposed parallel to the signal line so as to be connected to the storage capacitor electrodes, and includes the steps of:

depositing an electrode layer on the active matrix substrate and patterning the electrode layer so as to fabricate the scanning line and the pixel electrode;

depositing a gate insulation film;

fabricating the signal line, the switching element, the storage capacitor electrode, and the storage capacitor common wire, and subsequently depositing a protection film; and concurrently patterning the gate insulation film and the protection film so as to form an aperture section in the pixel electrode.

With the arrangement, the conventional steps of manufacturing an active matrix substrate are applicable without modification, including the step of forming the scanning lines in which the pixel electrodes are formed concurrently. Therefore, a conventional manufacturing line for liquid crystal display devices (in which the signal lines cross the storage capacitor common wires at right angles) can be used without modifying the process in order to manufacture high-performance active matrix substrates for use in liquid crystal display devices, sensors, and the like, that include storage capacitor common wires disposed parallel to signal lines; therefore, no investment is required for new equipment and tools and the productivity of the line is no likely to decline.

In addition, after depositing a gate insulation film on the layer constituted by the scanning lines and the pixel electrodes, forming the switching elements, the signal line, the storage capacitor electrode, and the storage capacitor common wires, and forming a protection film, the protection film and the gate insulation film can be concurrently patterned using the same photomask and the like to form aperture sections in the pixel electrodes. Therefore, the use of the same photomask and the patterning of the protection film and the gate insulation film in the same step results in combination in reducing manufacturing cost by great amounts.

In addition, the pixel electrodes are kept protected by the gate insulation film up to the step of patterning the protection film; therefore, the surfaces of the pixel electrodes are hardly contaminated. As a result, a conversion layer can be deposited on the aperture sections in the pixel electrodes in a stable manner so as to form an image sensor; therefore, the image sensor shows high performance and gives good yields in manufacture.

An image sensor in accordance with the present invention, in order to achieve the objects, includes:

an active matrix substrate having the foregoing arrangement;

a conversion section for converting incident magnetoelectric radiation to electric charges; and bias voltage application means for causing a storage capacitor to store the electric charges.

With the arrangement, the magnetoelectric radiation received by the image sensor is converted by the conversion section into electric charges which are subsequently stored in an electrostatic capacitor (storage capacitor). In a typical image sensor, requirements on the storage capacitor and noise are very demanding. An image sensor including the foregoing active matrix substrate is capable of restraining them sufficiently so as not to affect properties of read-out signals from an electrostatic capacitor. Besides, no additional steps are required to form the active matrix substrate constituting the image sensor. Besides, a conventional manufacturing line for liquid crystal display devices (in which the signal lines cross the storage capacitor common wires at right angles) can be used without modifying the process in order to manufacture active matrix substrates constituting image sensors; therefore, no investment is required for new equipment and tools and the productivity of the line is no likely to decline in production of image sensors.

Besides, if an active matrix substrate is used in which the storage capacitor electrodes are fabricated from a transparent electrode film, the light blocking area can be reduced in size between the transparent substrate and the conversion layer in the image sensor; therefore, the conversion layer can be refreshed efficiently by the method of projecting light to the entirety of the image sensor.

Further, if an active matrix substrate is used in which the storage capacitor common wires, as well as the storage capacitor electrodes, are fabricated from a transparent electrode film, the light blocking area can be further reduced in size; therefore, the foregoing effect is enhanced.

Further, if an active matrix substrate is used that includes such an arrangement that the pixel electrodes are disposed opposing the storage capacitor electrodes across the insulation film covering the switching elements, image sensors can be manufactured without additional steps. If an active matrix substrate is used that includes the foregoing arrangement as well as such an additional arrangement that an interlayer insulation film is interposed between the pixel electrodes and the insulation film, and the pixel electrodes are disposed opposing the storage capacitor electrodes in contact holes formed through the interlayer insulation film, image sensors can be manufactured that have reduced affection between the pixel electrodes and the electrode lines (referring to the scanning lines, the signal lines, the connection electrodes, and other electrode wires disposed below the pixel electrodes) and that can control the value of storage capacitors very precisely.

For a fuller understanding of the nature and advantages of the invention, reference should be made to the ensuing detailed description taken in conjunction with the accompanying drawings.

BRIEF DESCRIPTION OF THE DRAWINGS

FIG. 12(a) through FIG. 12(h) are cross-sectional views showing manufacturing steps of the conventional active matrix substrate shown in FIG. 9, taken along line F–F'.

DESCRIPTION OF THE EMBODIMENTS

[Embodiment 1]

Figure 1:
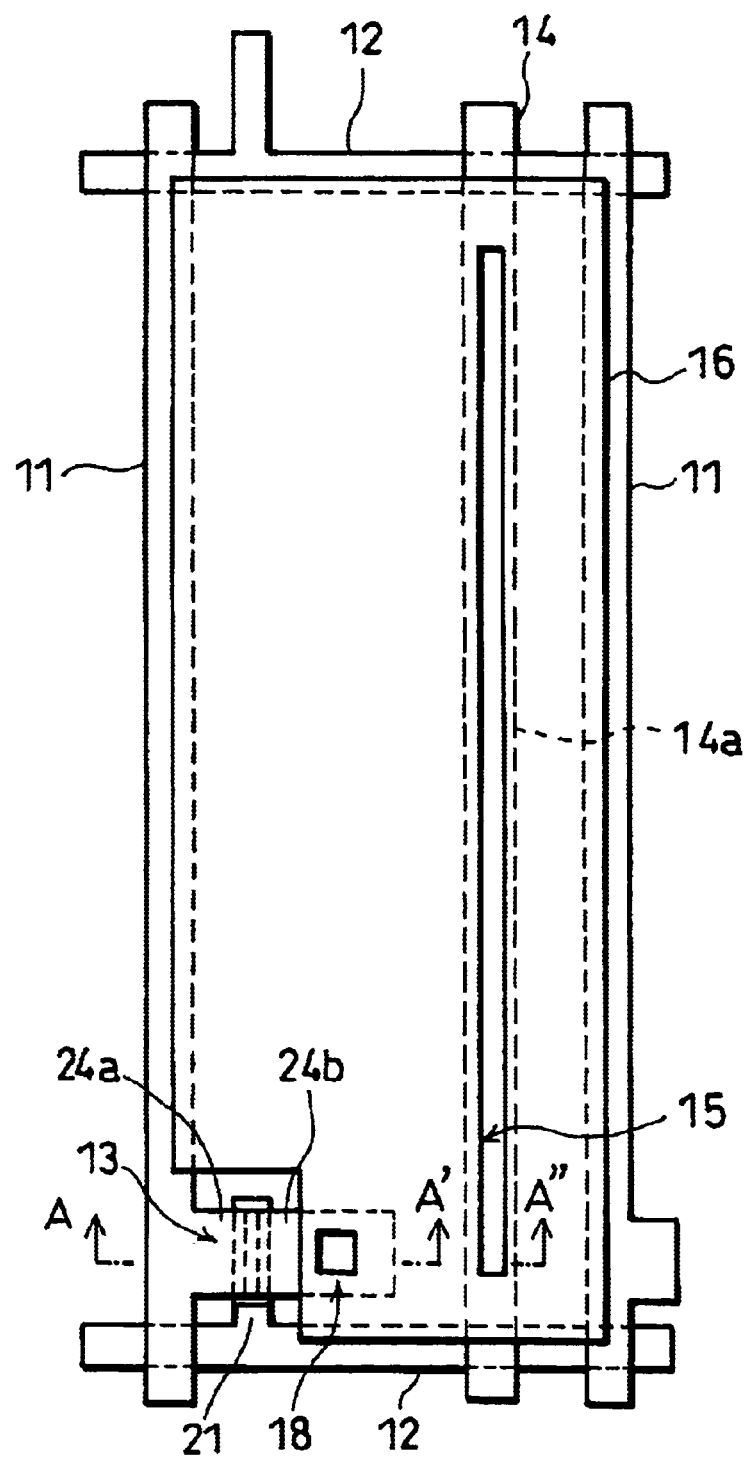
FIG. 1 is a schematic plan view showing an arrangement of an active matrix substrate of an embodiment in accordance with the present invention.
Figure 2:
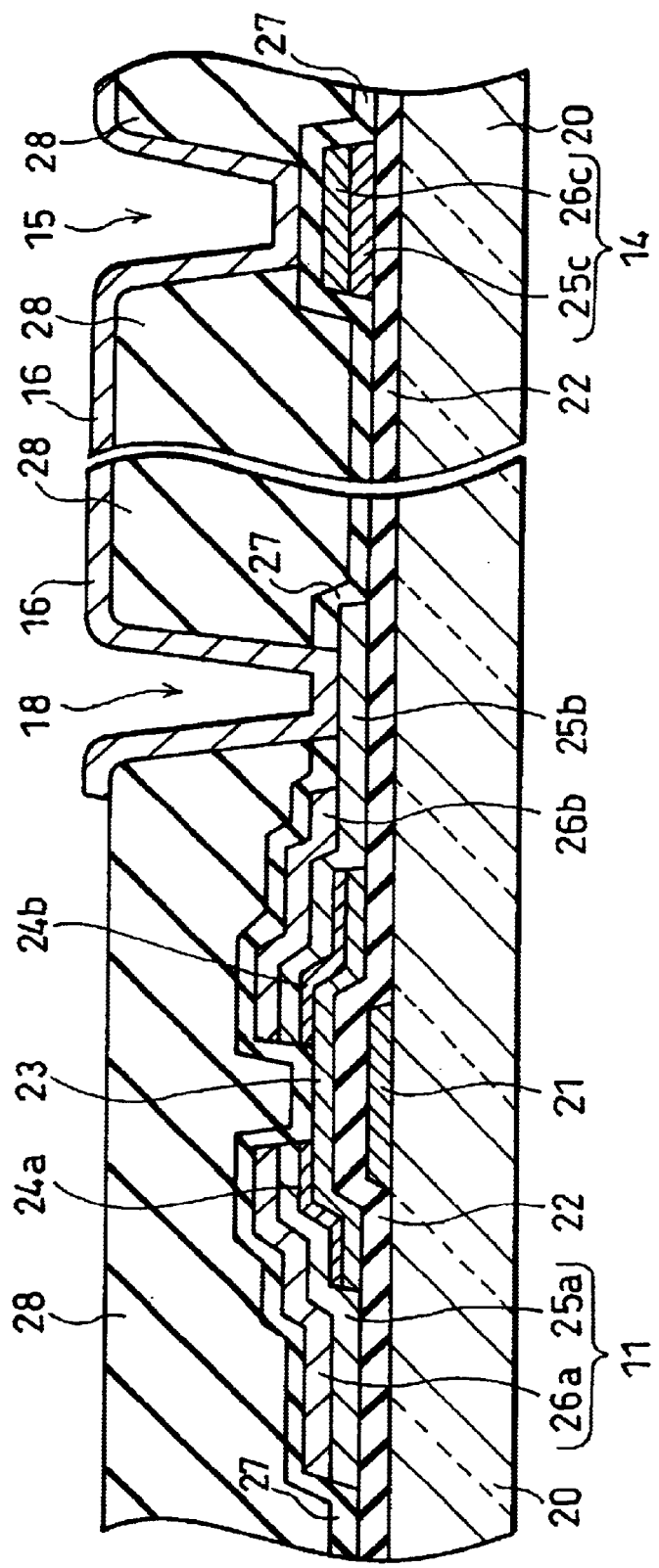
FIG. 2 is a cross-sectional view of the active matrix substrate shown in FIG. 1, taken along line A–A".
Figure 3:
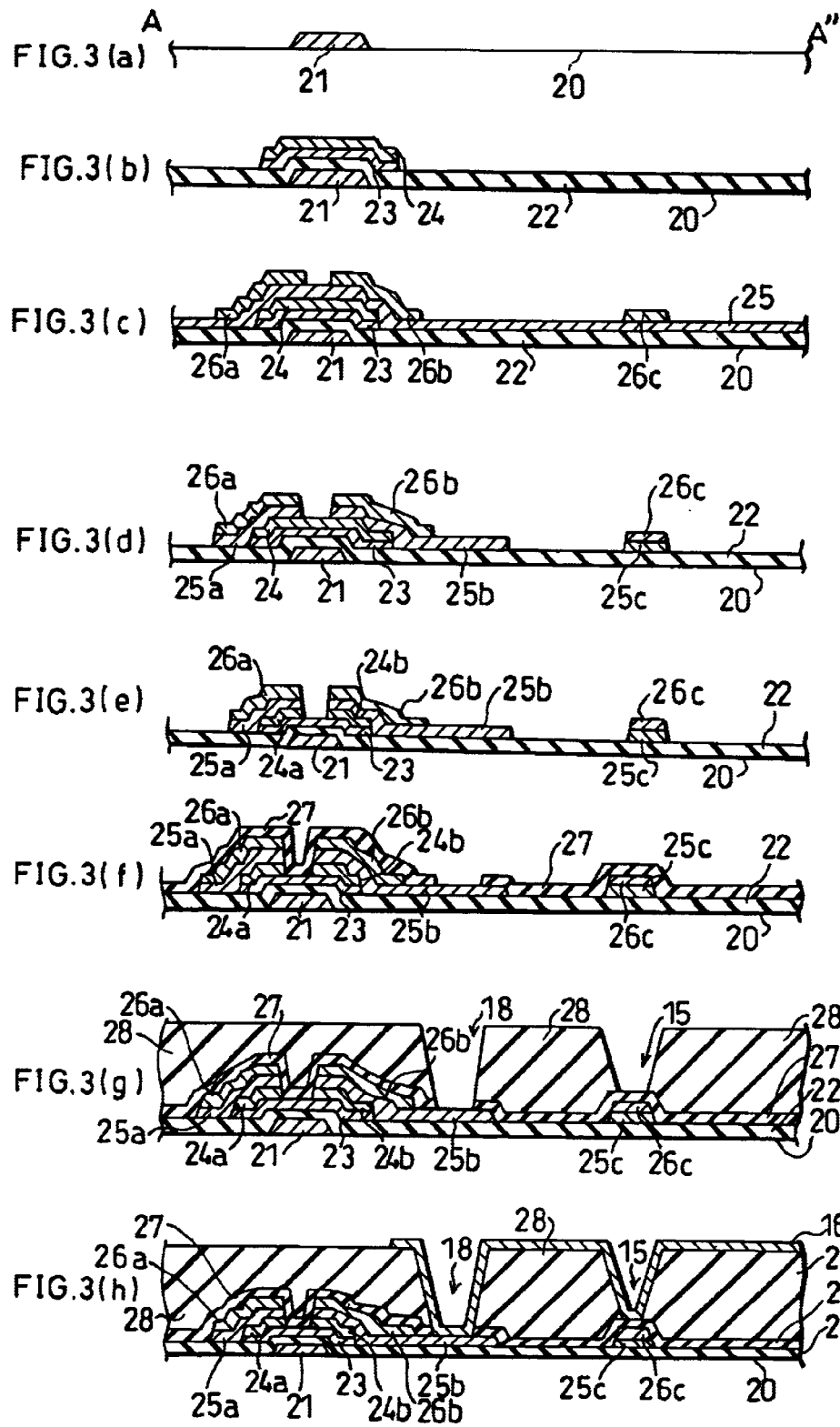
FIG. 3(a) through FIG. 3(h) are cross-sectional views showing manufacturing steps of the active matrix substrate shown in FIG. 1, taken along line A–A".

Referring to FIG. 1 through FIG. 3, the following description will discuss an embodiment in accordance with the present invention. The manufacturing process of an active matrix substrate shown in FIG. 12(a) through FIG. 12(h) and FIG. 13(a) through FIG. 13(h) is applicable to the active matrix substrate of the present embodiment, and this is one of features of the active matrix substrate of the present embodiment. The following description is made based on these drawings and will focus on differences of the present embodiment from what is illustrated in them. Conventional materials and manufacturing method are applicable to the layers constituting the active matrix substrate of the present embodiment; therefore, description thereof in detail is omitted.

As shown in FIG. 1 and FIG. 2, the active matrix substrate of the present embodiment includes pixels (pixel area) each encircled by signal lines 11 and scanning lines 12 that are provided in a matrix, and each pixel has a TFT 13 as a switching element near the point where the signal line 11 crosses the scanning line 12.

A pixel capacitor wire (storage capacitor common wire) 14, disposed parallel to the signal lines 11, is a pixel capacitor common wire for connecting together a plurality of pixel capacitors (storage capacitors) 14a provided to those pixels that are in a row parallel to the signal lines 11. For example, the pixel capacitor wire 14 is connected to a common electrode (not shown) of an opposite substrate if the active matrix substrate is used in a liquid crystal display device. Through a contact hole 15, the pixel capacitor wire 14 opposes a pixel electrode 16 across a protection film (insulation film) 27 so as to form the pixel capacitor 14a. That is, the pixel capacitor wire 14 functions not only as a common wire, but also as one of two electrodes (pixel capacitor electrode) constituting the pixel capacitor 14a.

Further, as will be mentioned below in the description about manufacturing steps, the pixel capacitor wire 14, constituted by a metal wire 26c and a transparent electrode 25c, is patterned concurrently with the formation of metal wire 26a and a transparent electrode 25a constituting the signal line 11. That is, the metal wire 26c constituting the pixel capacitor wire 14 and the metal wire 26a constituting the signal line 11 are fabricated from a single layer, while the transparent electrode 25c constituting the pixel capacitor wire 14 and the transparent electrode 25a constituting the signal line 11 are fabricated from another single layer.

Subsequently, referring to FIG. 3(a) through FIG. 3(h), the following description will discuss manufacturing steps for an active matrix substrate of the present embodiment specifically.

As shown in FIG. 3(a), a metal film is deposited on an insulating transparent substrate 20 made of glass, for example, and subsequently, subjected to photolithography and dry or wet etching so as to form a gate electrode 21 constituting a TFT 13 and a scanning line 12 (see FIG. 1). In the manufacture of a conventional active matrix substrate (hereinafter, will be referred to as a conventional substrate), the pixel capacitor wire 105 is fabricated from a metal film at the same time (see FIG. 12(a) and FIG. 13(a)); however, in the present embodiment, the pixel capacitor wire 105 is not fabricated at this stage yet.

Next, a gate insulation film 22, a semiconductor layer (amorphous silicon layer) 23, and an n$^+$-Si layer (n$^+$-amorphous silicon layer) 24 are successively deposited and patterned as shown in FIG. 3(b). The n$^+$-Si layer 24 will be later fabricated into a source electrode 24a and a drain electrode 24b constituting the TFT 13. The deposition and patterning methods for these layers, as well as the pattern into which the layers are fabricated, are identical to those for the conventional substrate.

Specifically, among the deposited films (layers), the semiconductor layer 23 and the n$^+$-Si layer 24 can be concurrently patterned into the shape that the semiconductor layer 23 should be etched. The gap of the n$^+$-Si layer 24, which will serve as a channel section of the TFT 13, is yet to be formed. Next, the gate insulation film 22 is patterned. The patterning step is, however, for the purpose of providing an external contact section to the scanning line 12 (see FIG. 1) near a terminal, as well as a contact section required to supply signals to the pixel capacitor wire 14 (see FIG. 1 and FIG. 2), for example, a contact section with a common electrode of the opposite substrate, and is not shown in FIG. 3.

Next, a transparent electrode layer (electrode layer) 25 and a metal layer (corresponding to an electrode layer; the layer is shown in FIG. 3(c) only in its patterned form) are deposited successively. Thereafter, the metal layer is patterned so as to form the metal wires 26a, 26b, and 26c as shown in FIG. 3(c). Subsequently, the transparent electrode layer 25 is patterned so as to form transparent electrodes 25a, 25b, and 25c as shown in FIG. 3(d). The transparent electrode 25a and the metal wire 26a correspond to the signal line 11, the transparent electrode 25b and the metal wire 26b correspond to a connection electrode for establishing connection between the TFT 13 and the pixel electrode 16 via a later-detailed contact hole 18, and the transparent electrode 25c and the metal wire 26c correspond to the pixel capacitor wire 14.

The wires and the patterns have a double layer structure as in the foregoing, for the purpose of allowing for a broken wire caused by dust accumulated during deposition of a layer and preventing the transparent electrode layer 25 from being damaged during the patterning of the overlying metal layer. The wires and the patterns may have a single layer structure in some cases. When the wires and the patterns have a single layer structure, the materials that compose them are limited in no manner. Also, in some cases, the transparent electrode layer 25 may be disposed on the metal layer. In the present embodiment, the pixel capacitor wire 14, since having a double layer structure, has a reduced resistance in comparison to a pixel capacitor wire structured from a single layer constituted by a transparent electrode film alone.

Note further that the contact section for connecting the TFT 13 to the pixel electrode 16 is fabricated from the transparent electrode 25b as in the foregoing, because a contact section fabricated from a transparent electrode layer is less damaged in the step (detailed later) of forming the contact hole 18 and provided with better contact properties than a contact section fabricated from a metal layer.

Subsequently, as shown in FIG. 3(e), in a transistor section that will later serve as a TFT 13, the n$^+$-Si layer 24 is etched using the metal wires 26a and 26b and the transparent electrodes 25a and 25b as a mask to form a channel for the TFT 13. Next, as shown in FIG. 3(f), a protection film 27 for protecting the exposed semiconductor layer 23 is deposited and partly removed through etching in a contact section where the protection film 27 is connected to the pixel electrode 16.

The structure in which, as in the TFT 13, a source electrode 24a and a drain electrode 24b are disposed on a gate electrode 21 with a semiconductor layer 23 being interposed in between is called an inverted stagger structure or a bottom gate structure.

Further, as shown in FIG. 3(g), the interlayer insulation film 28 is deposited and patterned in the contact sections (corresponding to the contact holes 15 and 18). In the manufacture of a conventional substrate, nothing more than a contact hole 116 for connecting the TFT 104 to the pixel electrode 103 is formed in the contact section in the interlayer insulation film 115 as shown in FIG. 12(g); however, in the present embodiment, a contact hole 15 is additionally formed that will serve as an area (detailed later) where the pixel capacitor 14a is formed.

Subsequently, as shown in FIG. 3(h), a transparent electrode layer that will serve as the pixel electrode 16 is deposited on the interlayer insulation film 28 and patterned to complete the manufacture of the active matrix substrate of the present embodiment. The pixel electrode 16 is connected to the drain electrode 24b of the TFT 13 via the contact hole 18 formed through the protection film 27 and the interlayer insulation film 28.

In the contact hole 15 formed through the interlayer insulation film 28, the pixel capacitor wire 14 is disposed opposing the pixel electrode 16 across the protection film 27. The metal wire 26c constituting the pixel capacitor wire 14, the pixel electrode 16, and the protection film 27 constitute a storage capacitor which serves as the pixel capacitor 14a for a pixel.

The dimensions of the pixel capacitor are determined by the dimensions of the contact hole 15 provided in the interlayer insulation film 28 (i.e., the area of the pixel capacitor 14a where the pixel electrode 16 is in contact with the protection film 27). The method of patterning the interlayer insulation film 28 varies depending on the material of the insulation film 28 and other factors. Generally, the interlayer insulation film 28 is patterned through (a) etching if made of a polyimide or similar resin, and (b) photolithography if made of an acrylic or similar resin. In either of the methods, precision and accuracy in patterning are sufficiently high, and the value of the pixel capacitor is readily and precisely controllable.

In the active matrix substrate structured as in the foregoing, the interlayer insulation film 28 is interposed between the pixel electrode 16 and the signal and scanning lines 11 and 12, permitting the pixel electrode 16 to overlap the signal lines 11 and the scanning lines 12. This structure allows improvements on the aperture ratio and enables the shielding of the electric field generated by the signal line 11 to prevent insufficient alignment from occurring to the liquid crystal.

Besides, the protection film 27 and the gate insulation film 22 may be substantially identical in thickness and material. No particular changes are needed in the step of forming the protection film 27 as long as the formation of the pixel capacitor 14a is concerned.

Conventionally, no conductive film (specifically, pixel electrode) is formed on electrode lines (signal lines, scanning lines, pixel capacitor wires, etc.) with a protection film being interposed in between; therefore, no attention has been paid to cracks of the protection film that develop in edge portions of the electrodes. With a priority being given to the tact time, the electrode line in many cases has a steep taper, and leak is likely to develop if the electrode line has a cross-section where the overlying, conductive film overlaps the edge of the electrode line. By contrast, in the present embodiment, as shown in FIG. 2, it is only in the contact hole 15 that the pixel electrode 16 is in contact with the electrode line with the protection film 27 interposed in between; therefore, leak is no likely to develop in the cracks of the edge portion. Further, in the taper portion of the contact hole 15, the alignment of liquid crystal molecules are likely to be disturbed by changes in thickness of the liquid crystal layer, and result in leaks of light; however, the leaking light is blocked by the underlying, pixel capacitor wire 14 (more precisely, the metal wire 26c), and does not interrupt a good display.

As discussed in the foregoing, an active matrix substrate that includes pixel capacitor wires 14 disposed parallel to signal lines 11 can be realized by the completely identical process as the conventional steps of manufacturing substrates only with minor changes in the pattern. In other words, an active matrix substrate can be manufactured with capabilities of preventing occurrence of noise and signal delays without an increase in the number of steps (eventually without an increase in the manufacturing costs of the active matrix substrate). Further, the manufacturing line for conventional liquid crystal display devices can be utilized without a change in the manufacturing process; therefore, active matrix substrates for use in high-performance liquid crystal display devices or sensors can be manufactured. No investment is necessary for a new infrastructure, and the productivity of the line is no likely to decrease.

In an active matrix substrate structured as in the foregoing, as previously mentioned, the pixel capacitor wire 14 crosses the scanning lines 12 alone and therefore has a greatly reduced time constant; the noise and delays in signal transmission can be reduced by great amounts. Therefore, the active matrix substrate in accordance with the present invention, if applied to an image sensor, greatly improves the S/N ratio of the image sensor.

That is, if the pixel capacitor wire 14 is disposed parallel to the signal lines 11, only one pixel that is located at a point where the pixel capacitor wire 14 crosses the selected scanning line 12 is activated and connected by means of electric capacity to a single pixel capacitor wire 14. As a result, at an instant when a certain scanning line 12 is selected, the electric potential of the pixel capacitor wire 14 is only affected by a change in electric potential of that single pixel, and therefore oscillates or shifts by an extremely small amount.

Further, since the pixel capacitor wire 14 is connected by means of electric capacity to non-selected scanning lines 12, etc., the electric charges of the selected pixel move through redistribution to the electrostatic capacitors constituted by the non-selected scanning liens 12 and the pixel capacitor wire 14. The phenomenon further reduces the oscillation of the electric potential of the pixel capacitor wire 14 and allows the pixel capacitor wire 14 to quickly return to normal voltage conditions.

Since the pixel capacitor wire 14 does not cross the signal lines 11, the electrostatic capacitors constituted by the non-selected scanning lines 12 and the pixel capacitor wire 14 are not affected by the signal lines 11. Consequently, the electrostatic capacitors constituted by the non-selected scanning lines 12 and the pixel capacitor wire 14 do not negatively affect the electric potential of the pixel where a signal is being read or written.

As in the foregoing, unlike conventional technology, the electric potential of the pixel capacitor wire 14 can be stabilized with little need to form the pixel capacitor wire 14 with a low resistance as a whole or to restrain the impedance of the pixel capacitor wire 14 with respect to an input terminal of the pixel capacitor wire 14.

Further, a signal of a constant amplitude and 180° out of phase with the signal supplied to the signal lines 11 may be supplied to opposite electrodes (not shown) and the pixel capacitor wire 14 in order to reduce the amplitude of the signal supplied to the signal lines 11. When this is the case, so-called floating gate drive is carried out whereby a signal having the same amplitude and phase as the signal supplied to the signal lines 11 is superimposed on the off electric potential of the scanning lines 12; therefore, the voltage difference between the pixel capacitor wires 14 and the scanning lines 12 is always constant. In other words, no capacitor components other than a stray capacity contribute to an increase in the time constant of the pixel capacitor wire

14, and it is safe to say that there are substantially no actual delays occurring in signal transmission. Besides, since the TFTs 13 (only one of them is shown) of those pixels that are connected to a common pixel capacitor wire 14 are not turned on simultaneously as mentioned previously; therefore, crosstalk and other problems are no likely to develop.

Figure 14:
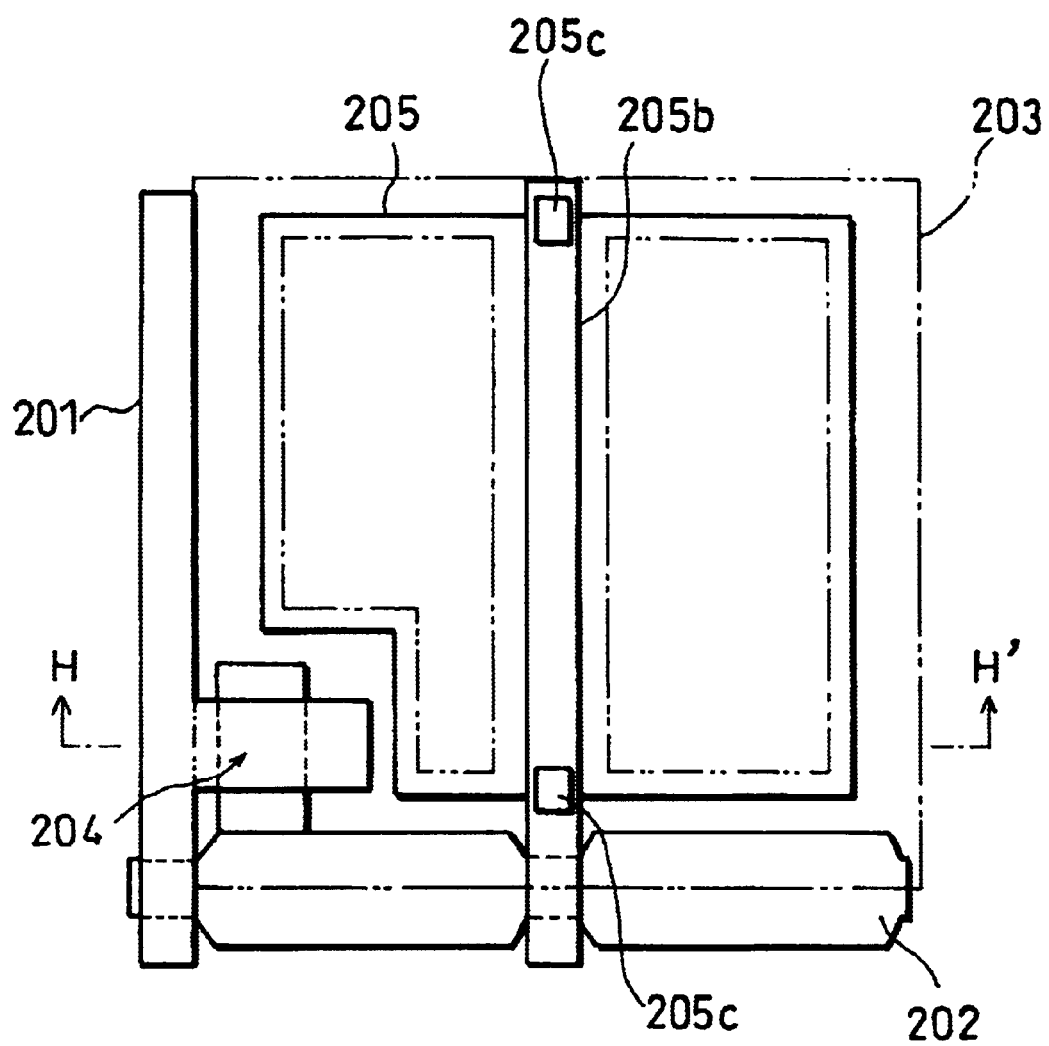
FIG. 14 is a schematic plan view showing an arrangement of an active matrix substrate for use in a conventional x-ray sensor.
Figure 15:
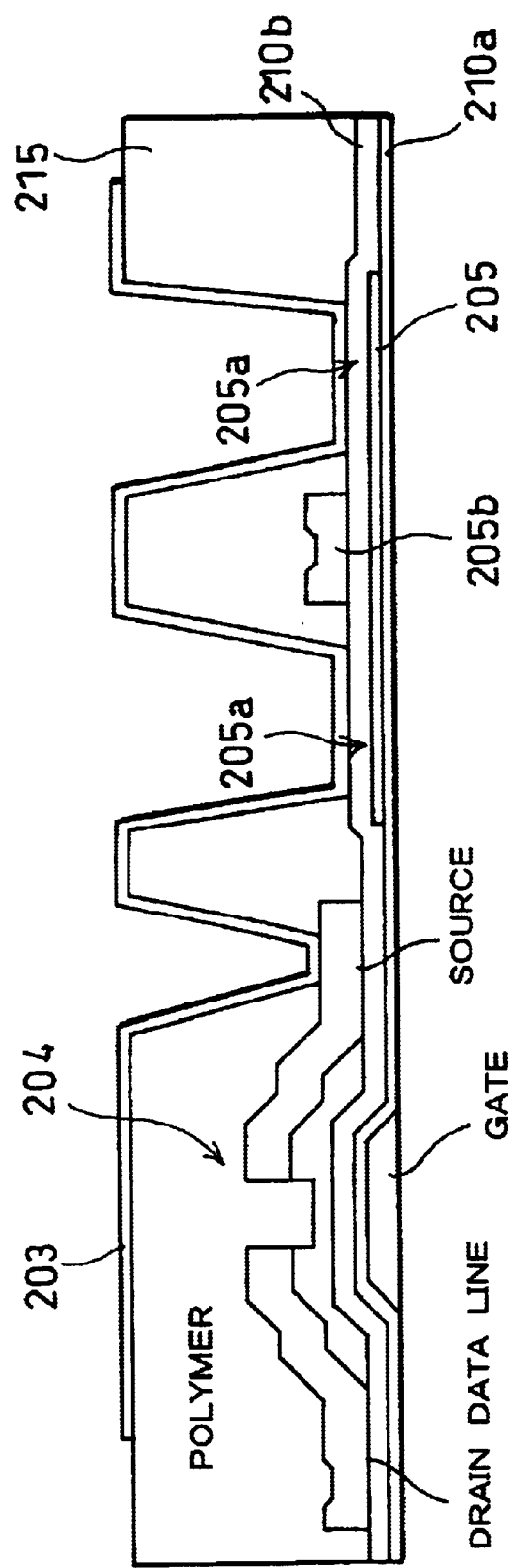
FIG. 15 is a cross-sectional view showing the conventional active matrix substrate shown in FIG. 14, taken along line H–H'.

Meanwhile, in the conventional active matrix substrate shown in FIG. 14 and FIG. 15, the pixel capacitor wire 205 is disposed parallel to the signal line 201. However, an additional step is necessary to form a pixel capacitor wire 205*b*; namely, the steps of (a) providing a transparent electrode film that will serve as the pixel capacitor electrodes 205, and (b) depositing, subjecting to photolithography, and etching the gate insulation film 210*b* to provide a contact section between the pixel capacitor wire 205*b* and the pixel capacitor electrode 205. Further, a high level of precision is required in the patterning of the gate insulation film 210*b*. This is achievable through the use of costly photomasks and precise controls of conditions in exposure to light and etching, but results in increased costs.

In the present embodiment, the pixel electrode 16 is fabricated from a transparent electrode layer. However, there are alternatives. For example, when the active matrix substrate is to constitute a liquid crystal display device of a reflective type, the pixel electrode 16 may be fabricated from a metal film.

Further, when there are few requirements on the aperture ratio and the area occupied by the pixel electrode 16, provided that the pixel electrode is further reduced in its circumference to eliminate the overlapping of the pixel electrode 16 with the signal line 11 and the scanning line 12, the problem of parasitic capacity is solved that develop between the signal line 11 and the pixel electrode 16 and between the scanning line 12 and the pixel electrode 16.

Further, if the parasitic capacity does not pose a problem, there is no need to provide the interlayer insulation film 28, and the steps of depositing and patterning the interlayer insulation film 28 can be omitted.

[Embodiment 2]

Figure 4:
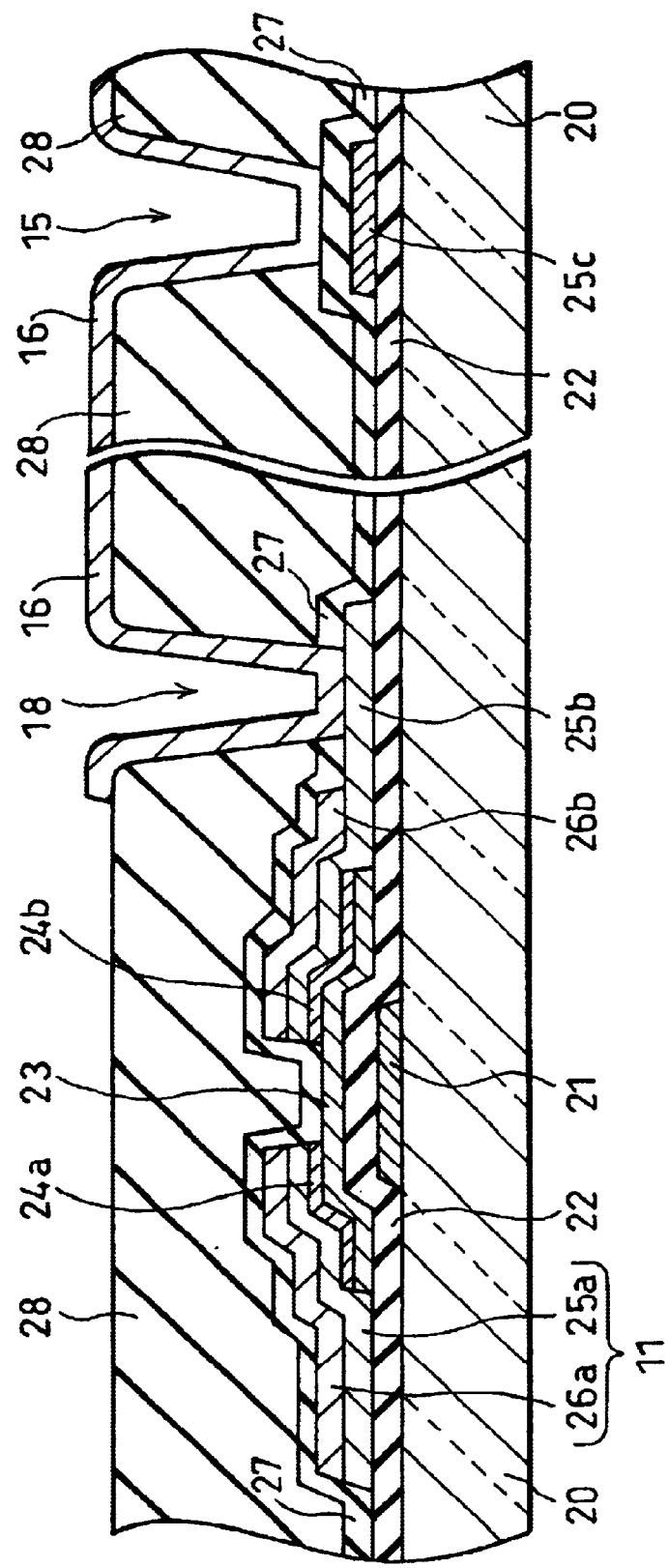
FIG. 4 is a cross-sectional view of an active matrix substrate of another embodiment in accordance with the present invention.

Referring to FIG. 4, the following description will discuss another embodiment in accordance with the present invention. Here, for convenience, members of the present embodiment that have the same arrangement and function as members of the first embodiment, and that are mentioned in the first embodiment are indicated by the same reference numerals and description thereof is omitted.

The active matrix substrate of the present embodiment differs from the active matrix substrate of the first embodiment in the arrangement of pixel capacitor wires. Specifically, in the present embodiment, as shown in FIG. 4, the pixel capacitor wire (storage capacitor common wire) that takes a dual role as a storage capacitor electrode has a single layer structure constituted by a transparent electrode (transparent electrode film) 25*c* alone. In other words, the patterning of the pixel capacitor wire of the present embodiment is carried out concurrently with the formation of the transparent electrode 25*a* constituting the signal line 11. With this arrangement, the pixel capacitor wire has a single layer structure constituted by the transparent electrode 25*c* alone; therefore, the aperture ratio of the pixel can be improved further over the arrangement of the first embodiment. Note that FIG. 4 corresponds to the cross-sectional view taken along line A–A" shown in FIG. 1 which illustrates the first embodiment.

The manufacturing process of an active matrix substrate of the present embodiment is identical to the manufacturing process explained in the first embodiment (see FIG. 3(*a*) through FIG. 3(*h*)), except that the metal wire 26*c* is further removed in the patterning of the metal layer deposited on the transparent electrode layer (electrode layer) 25, and therefore requires no additional steps.

Further, since the pixel capacitor wire is not a factor reducing the aperture ratio of the pixel, the value of the pixel capacitor (that is, the area of the transparent electrode 25*c* opposing the pixel electrode 16 across the protection film (insulation film) 27) can be increased as necessary. For example, crosstalk, when likely to occur due to the parasitic capacity between the signal line 11 and the pixel electrode 16, can be readily solved.

Recently, in some cases, the signal line 11 per se has a single layer structure constituted by the transparent electrode 25*a* alone to reduce costs. In such a case also, the pixel capacitor wire can be fabricated from the transparent electrode 25*c* in the same manner as in the foregoing.

In some cases, the fabrication of the pixel capacitor wire from the transparent electrode 25*c* causes a relatively large resistance compared to a metal wire. The phenomenon can be prevented from resulting in trouble by adjusting, as necessary, the value of the pixel capacity of the transparent electrode 25*c* which doubles as a pixel capacitor electrode (storage capacitor electrode).

[Embodiment 3]

Figure 5:
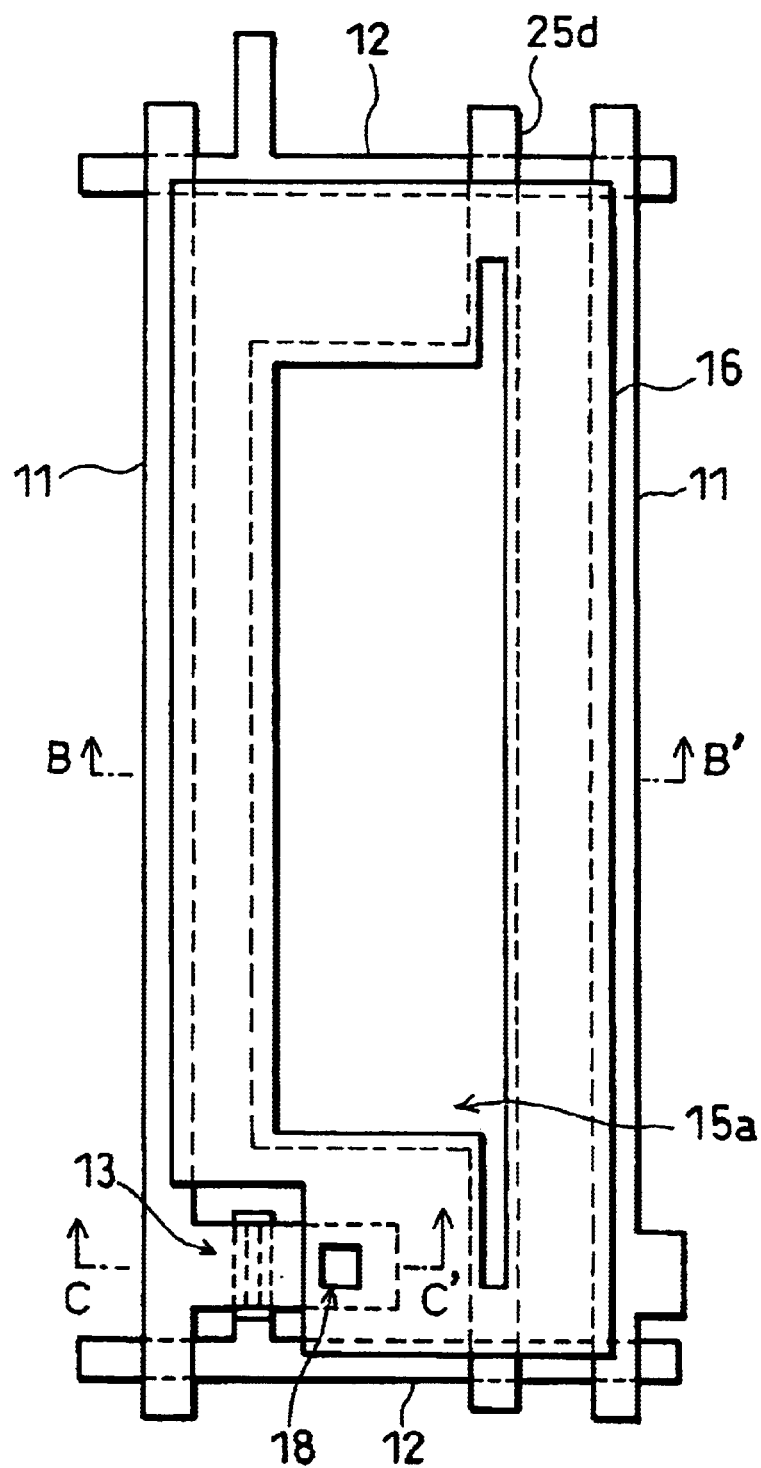
FIG. 5 is a schematic plan view showing an active matrix substrate that constitutes a major part of an x-ray sensor of a further embodiment in accordance with the present invention.
Figure 6:
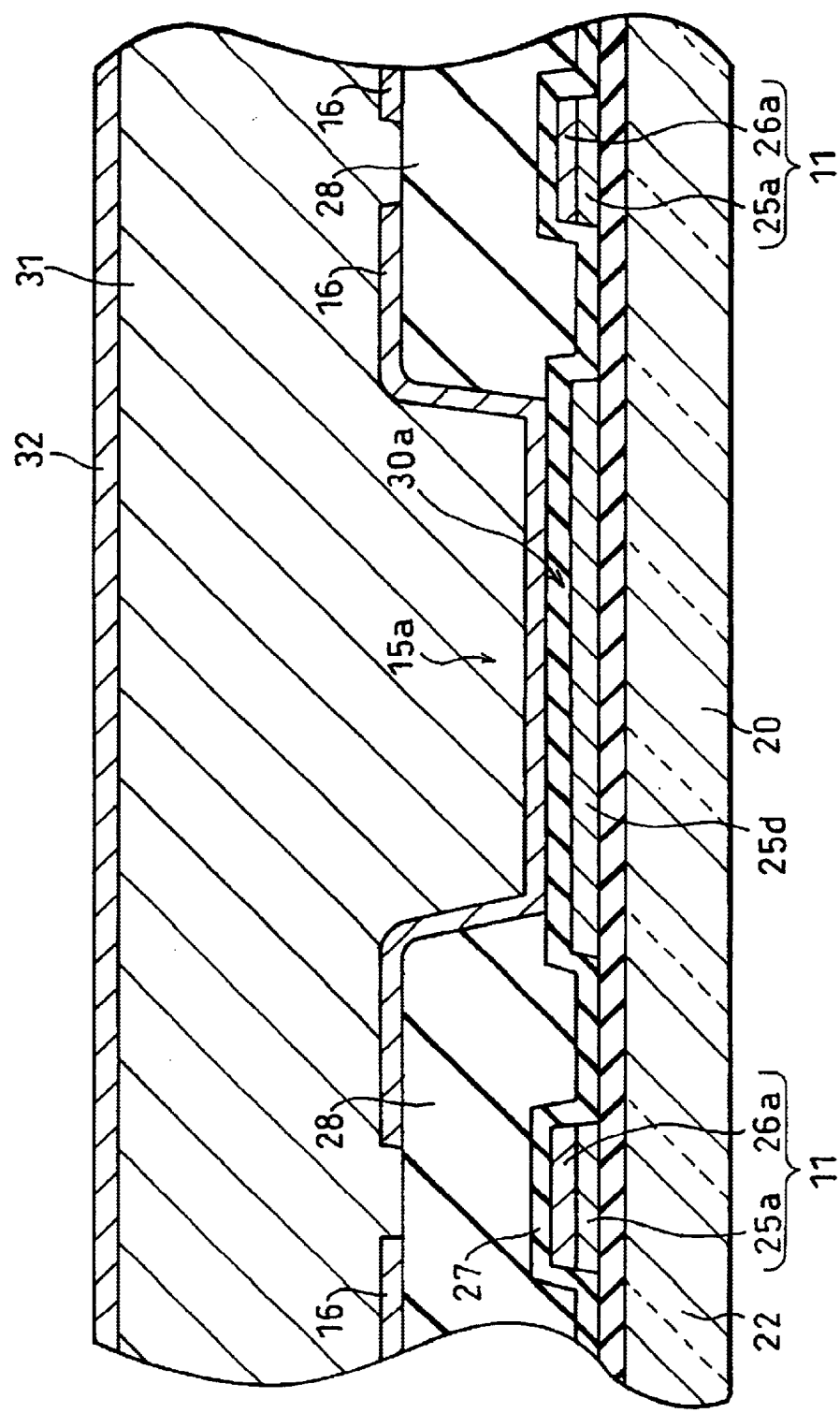
FIG. 6 is a cross-sectional view showing the x-ray sensor shown in FIG. 5, taken along line B–B'.

Chiefly referring to FIG. 5 and FIG. 6, the following description will discuss a further embodiment in accordance with the present invention. Here, for convenience, members of the present embodiment that have the same arrangement and function as members of the previous embodiments, and that are mentioned in the previous embodiments are indicated by the same reference numerals and description thereof is omitted.

As shown in FIG. 5 and FIG. 6, the active matrix substrate for use in a flat-panel-type x-ray sensor of the present embodiment (hereinafter will be simply referred to as an x-ray sensor) includes pixels each encircled by signal lines 11 and scanning lines 12 that are provided in a matrix, and each pixel has a TFT 13 as a switching element near the point where the signal line 11 crosses the scanning line 12. Each pixel is provided with a transparent electrode (transparent electrode film) 25*d* as a pixel capacitor wire (storage capacitor common wire), a pixel electrode 16, and a contact hole 15 formed through an interlayer insulation film 28. In the contact hole 15*a*, a transparent electrode 25*d* and a pixel electrode 16 are disposed opposing each other across a protection film (insulation film) 27, so as to form a pixel capacitor (storage capacitor) 30*a*. In other words, the transparent electrode 25*d* takes dual roles as a pixel capacitor wire and a pixel capacitor electrode (storage capacitor electrode) as in the previous embodiments.

The transparent electrode 25*d* is fabricated concurrently with the transparent electrode 25*a* that constitutes an underlayer of the signal line 11 through patterning the transparent electrode layer (electrode layer) 25 shown in FIG. 3(*c*) as in the second embodiment.

The cross-sectional structure taken along line C–C' in FIG. 5 is identical to that taken along line A–A' in FIG. 1, thereby not being shown in drawings. Further, the active matrix substrate includes deposited layers that has an identical structure (i.e., identical sequence in deposition of the layers) to those in the first and second embodiments, and changes are made only to the patterns of some layers; description about manufacturing steps are thereby omitted.

The structure of the x-ray sensor further includes a conversion layer (conversion section) 31 and a common electrode layer (bias voltage application means) 32 sequentially deposited on the active matrix substrate (see FIG. 6). The conversion layer 31 is not limited in any particular manner, provided that it generates electron-positive hole pairs upon reception of energy, such as x-rays: specific examples include layers formed by deposition of a-Se, Cd.Ta, and other such semiconductors in a suitable thickness. Suitably thin films of these materials may be deposited to form a pin connection and shot key connection as a precautionary measure to curb current leaks between pixels.

Next, operations of the x-ray sensor will be briefly explained. As an x-ray enters the x-ray sensor through the top (i.e., through the common electrode layer 32), the energy of the x-ray causes the conversion layer 31 to generate electron-positive hole pairs. Since the common electrode layer 32 is provided with a constant bias voltage and the transparent electrode 25d is maintained at a constant electric potential, the electron-positive hole pairs move as if they were attracted by the bias voltage and build up electric charges in the pixel capacitor 30a. The electric charges stored in the pixel capacitor 30a are read through the signal line 11 via the TFT 13 selected by means of the scanning line 12.

To improve the efficiency in collecting the electric charges converted from an x-ray and to prevent an abnormally increased pixel electric potential from causing leaks of electric charges from the TFT 13 or causing the destruction of the TFT 13 per se, the active matrix substrate of the present embodiment has a greatly increased pixel capacity (more specifically, a greatly increased area where the transparent electrode 25d opposes the pixel electrode 16).

Incidentally, the aperture ratio of an x-ray sensor is in many cases not necessarily as large as that of a liquid crystal display device of a transparent type; therefore, the materials composing the pixel capacitor wire and the pixel capacitor electrode are not limited in any particular manner. Even a metal wire is applicable.

However, due to the nature of the conversion layer 31, electric charges may still remain in the conversion layer 31 in small quantities after electric charges stored in the pixel capacitor 30a are read. These remaining electric charges possibly degrade signal precision and cause polarization, rendering the conversion layer 31 per se less reliable. To prevent this from happening, for example, a method is applicable whereby light is projected to the entirety of the x-ray sensor to refresh the conversion layer 31 (the conversion layer discharges the remaining electric charges) at fixed intervals (for example, at every interval between readout frames). When this is the case, light and x-ray are preferably projected from different sides; therefore, smaller light blocking area is preferred between the transparent substrate 20 and the conversion layer 31. In the present embodiment, the light blocking area between the transparent substrate 20 and the conversion layer 31 can be made extremely small, since the pixel capacitor wire (doubles as a pixel capacitor electrode) is fabricated from the transparent electrode 25d.

[Embodiment 4]

Figure 7:
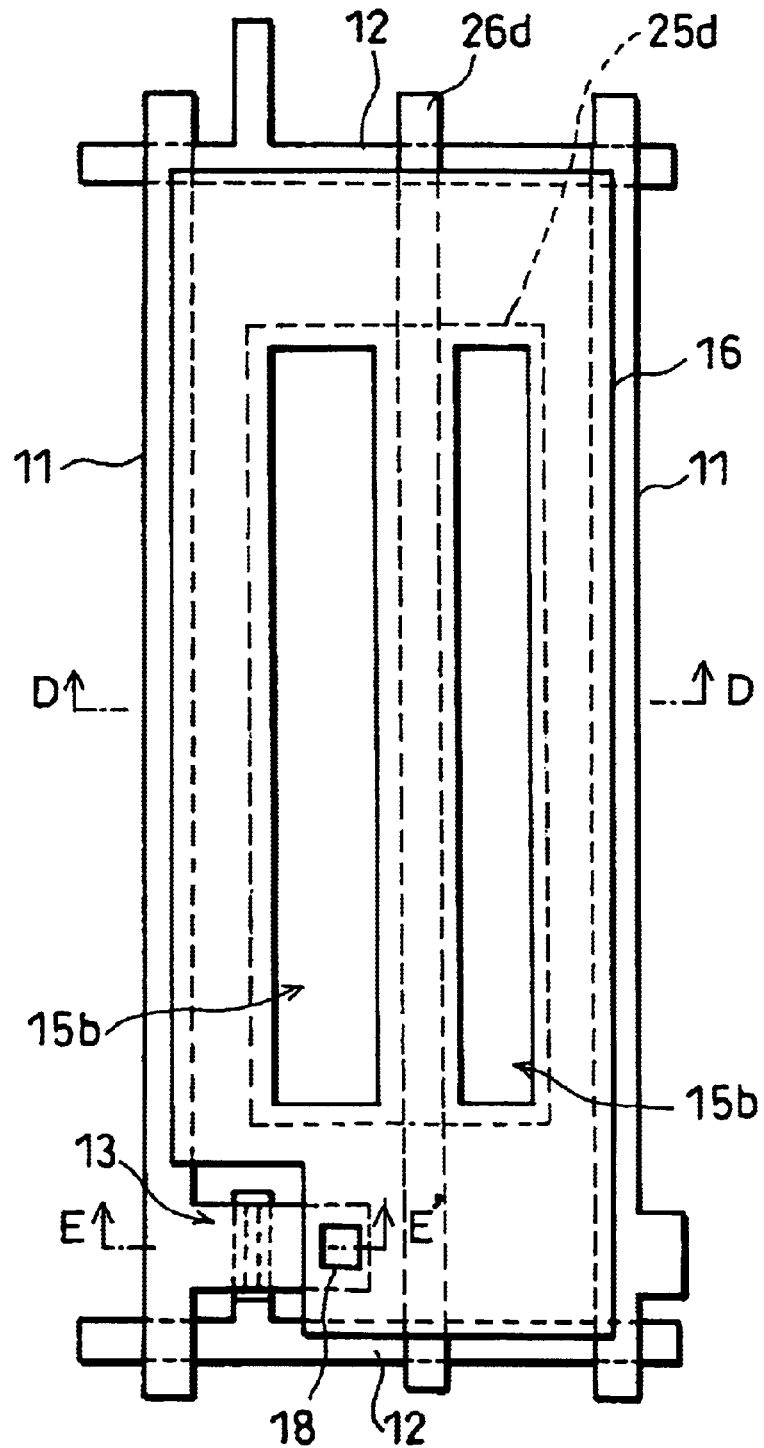
FIG. 7 is a schematic plan view showing an active matrix substrate that constitutes a major part of an x-ray sensor of still another embodiment in accordance with the present invention.
Figure 8:
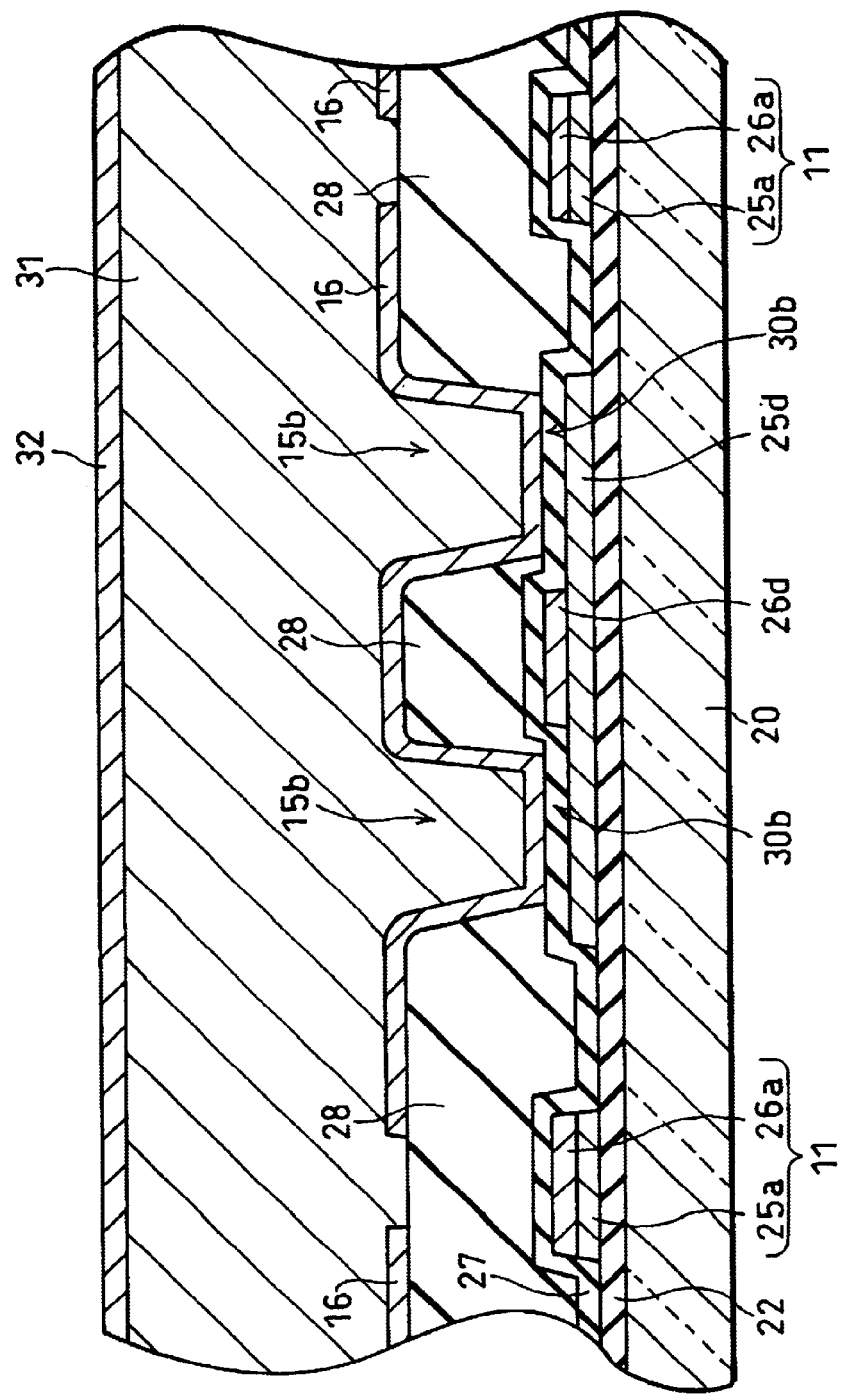
FIG. 8 is a cross-sectional view showing the x-ray sensor shown in FIG. 7, taken along line D–D'.
Figure 9:
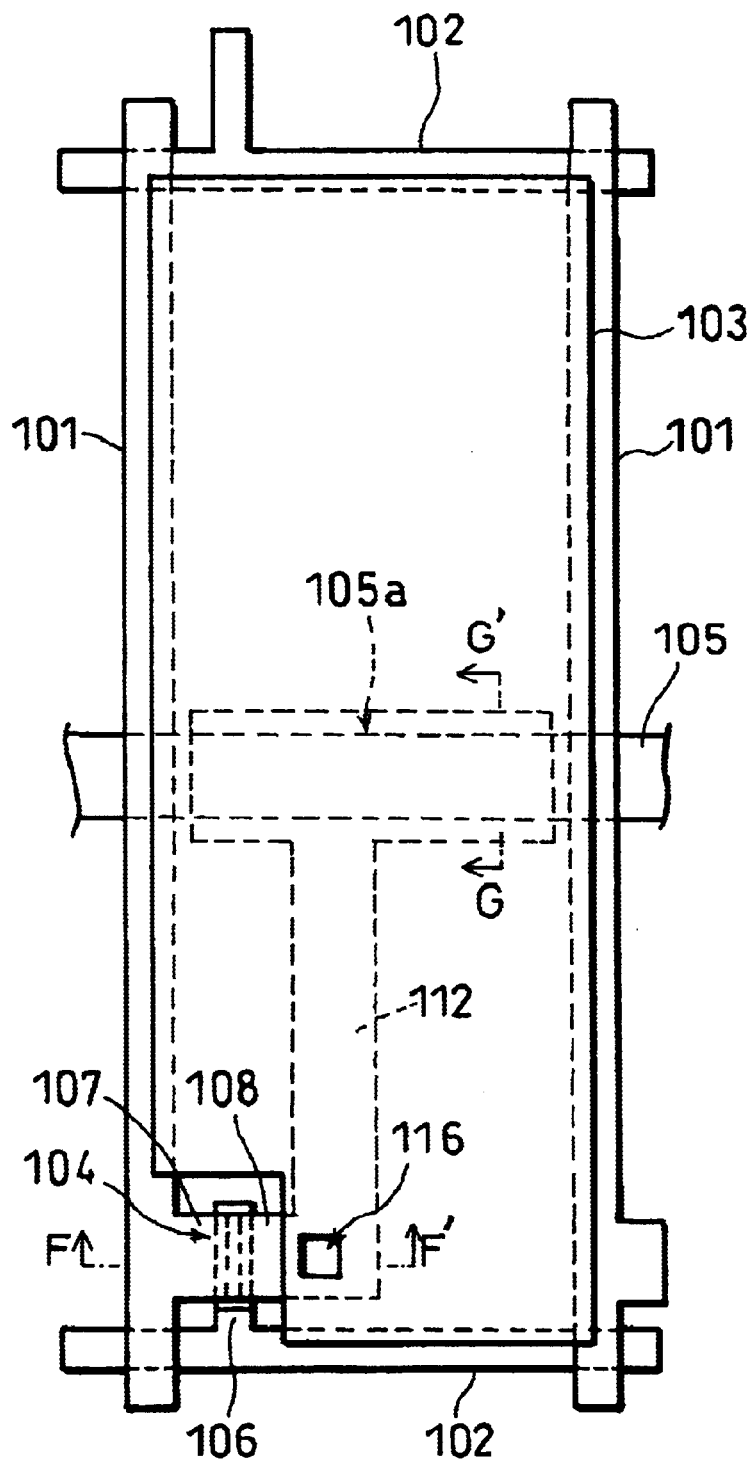
FIG. 9 is a schematic plan view showing an arrangement of a conventional active matrix substrate.
Figure 10:
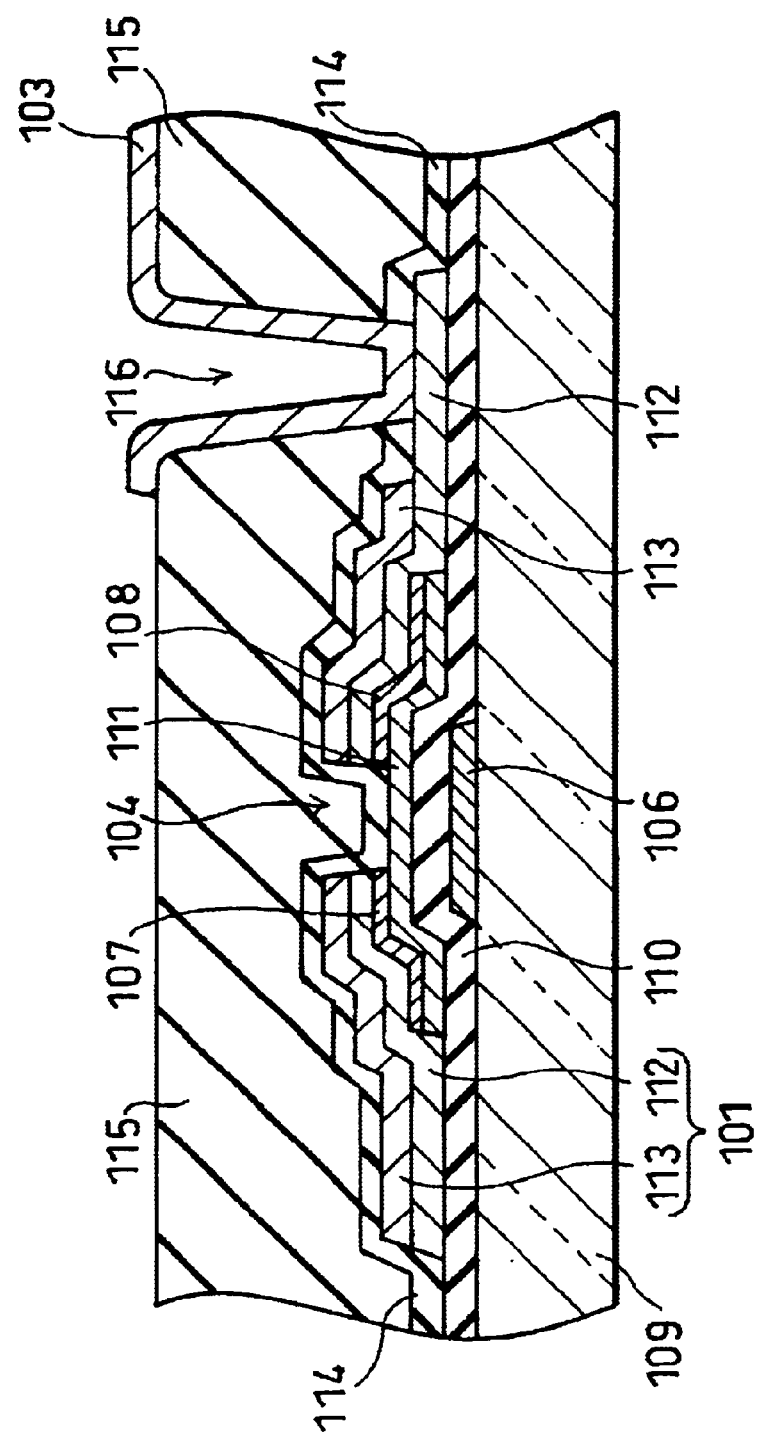
FIG. 10 is a cross-sectional view showing the conventional active matrix substrate shown in FIG. 9, taken along line F–F'.
Figure 11:
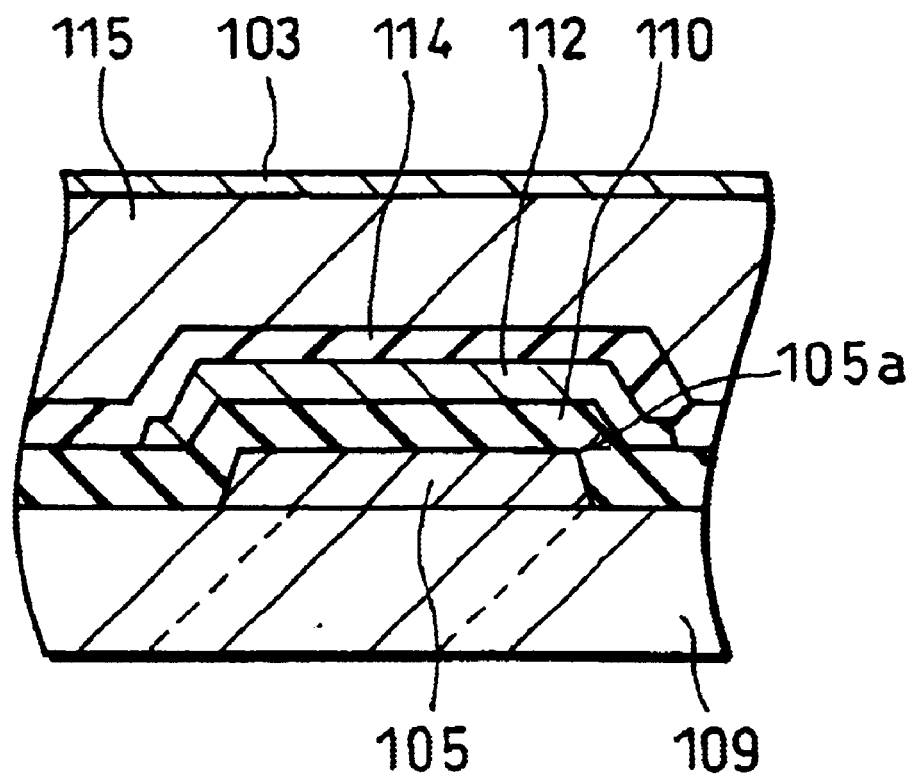
FIG. 11 is a cross-sectional view showing the conventional active matrix substrate shown in FIG. 9, taken along line G–G'.
Figure 13A:
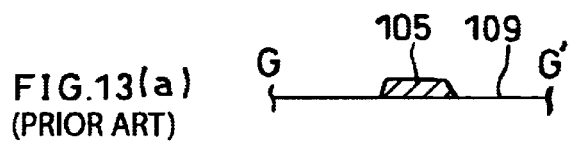
FIG. 13(a) through FIG. 13(h) are cross-sectional views showing manufacturing steps of the conventional active matrix substrate shown in FIG. 9, taken along line G–G'.
Figure 13B:
Figure 13C:
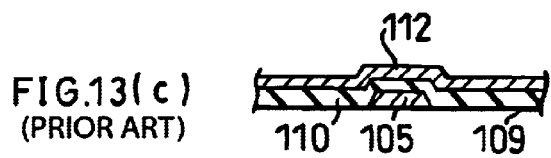
Figure 13D:
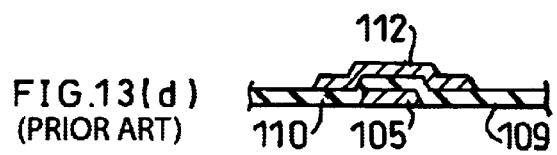
Figure 13E:
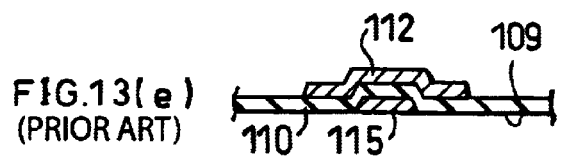
Figure 13F:
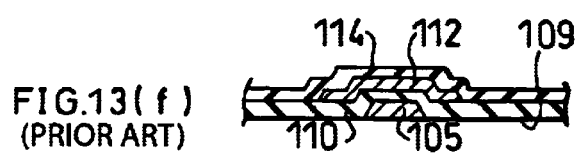
Figure 13G:
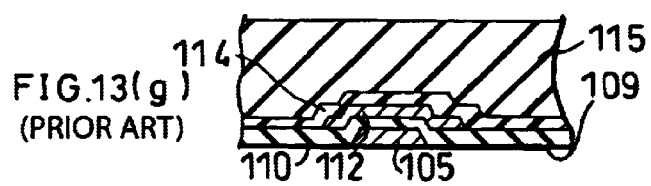
Figure 13H:
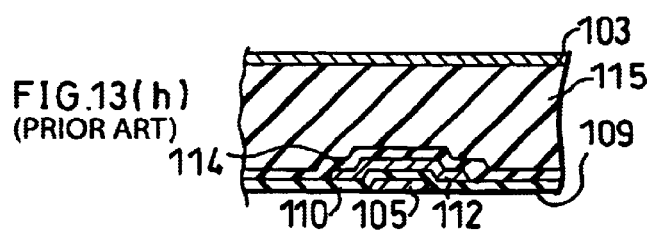

Chiefly referring to FIG. 7 and FIG. 8, the following description will discuss a further embodiment in accordance with the present invention. Here, for convenience, members of the present embodiment that have the same arrangement and function as members of the previous embodiments, and that are mentioned in the previous embodiments are indicated by the same reference numerals and description thereof is omitted.

The x-ray sensor of the present embodiment differs from the x-ray sensor of the third embodiment primarily in the arrangement of the pixel capacitor wires and the pixel capacitors. Specifically, in the present embodiment, a metal wire 26d that serves as a pixel capacitor wire (storage capacitor common wire) is formed on a transparent electrode (transparent electrode film) 25d that serves as a pixel capacitor electrode (storage capacitor electrode). A pixel capacitor wire and a pixel capacitor electrode are fabricated from the same layer as is the signal line 11. Specifically, the metal wire 26a serving as the upper layer of the signal line 11 and the metal wire 26d serving as the pixel capacitor wire are fabricated from a single metal layer through patterning thereof, while the transparent electrode 25a as the lower layer of the signal line 11 and the transparent electrode 25d serving as the pixel capacitor electrode are fabricated from a single transparent electrode layer (electrode layer) 25 through patterning thereof (see FIG. 3(c)).

In the arrangement of the present embodiment, the fabrication of at least the transparent electrode 25a serving as the lower layer of the signal line 11 and the transparent electrode 25d serving as the pixel capacitor electrode from the same layer suffices to give the present invention an advantage over conventional technology; the formation of the metal wire 26a serving as the upper layer of the signal line 11 is not essential. In other words, as previously mentioned, the signal line 11 may have a single layer structure.

Besides, as mentioned in the first embodiment, leak is likely to occur if the pixel electrode 16 has a cross-section where it overlaps the edge of the electrode line; therefore, the interlayer insulation film 28 is provided with two contact holes 15b where pixel capacitors (storage capacitors) 30b are formed so as to skirt the edges of the metal wire 26d. The pixel capacitors 30b sit flat because of the arrangement of the pixel electrode 16, the protection film (insulation film) 27, and the transparent electrode 25d.

The cross-sectional structure taken along line E–E' in FIG. 7 is identical to that taken along line A–A' in FIG. 1, thereby not being shown in drawings. Further, the active matrix substrate includes deposited layers that have an identical structure to those in the first and second embodiments, and changes are made only to the patterns of some layers; description about manufacturing steps are thereby omitted.

In the x-ray sensor of the present embodiment, the pixel capacitor wire, since being made of metal (metal wire 26d), has a reduced resistance in comparison to a pixel capacitor wire structured from a transparent electrode film. Besides, the pixel capacitor electrode is fabricated from the transparent electrode 25d; therefore, light and an x-ray can be projected from opposing sides so as to readily refresh the conversion layer 31.

The active matrix substrate for use in x-ray sensors of the third and fourth embodiments can be readily manufactured at low costs without new investment in manufacturing tools and facilities, because the same manufacturing process can be applied as that for conventional liquid crystal display devices only by adjusting the dimensions of the pixel capacitor and the time constant of the active element (switching element) so as to be optimal when used in a sensor.

Further, the signal line 11 does not cross the pixel capacitor wire; therefore, the load capacity on the signal line 11 can be greatly decreased, and noise and delays in signal transmission can be greatly restrained, and the impedance of the pixel capacitor wire can also be decreased. Moreover, when a certain line is selected by means of the scanning line 12, the noise generated in the pixel capacitor wire may propagate along the signal lines 11, but does not propagate along the scanning line 12, causing no interference with the data read through the pixels simultaneously selected.

The structure of the x-ray sensor is by no means limited to the foregoing example: an alternative example is to make use of a method whereby an x-ray is converted to visual light and then read using a photodiode. The method can be effected in various fashions: for example, (A) electric charges are stored in a pixel capacitor and then discharged according to a signal from the scanning lines, and the difference between the discharged electric charges and the initial electric charges is read, or (B) the current flowing through the photodiode is stored in the pixel capacitor and read. Despite that the layer deposition structure on the active matrix substrate is different in these methods and in the aforementioned method of converting x-ray energy directly into electric charges, an identical active matrix substrate can be used in all the methods, because a common structure is adoptable below pixel electrodes.

Further, if a light conductive film is used in place of the radiation-to-electric charges conversion film as the conversion layer 31, the image sensor will respond to magneto-electric radiation including visual light and infrared light instead of x-rays.

[Embodiment 5]

Referring to FIG. 16 through FIG. 19, the following description will discuss a further embodiment in accordance with the present invention. The manufacturing process of an active matrix substrate shown in FIG. 12(a) through FIG. 12(h) and FIG. 13(a) through FIG. 13(h) is applicable to the active matrix substrate of the present embodiment, and this is one of features of the active matrix substrate of the present embodiment. The following description is made based on these drawings and will focus on differences of the present embodiment from what is illustrated in them. Conventional materials and manufacturing method are applicable to the layers constituting the active matrix substrate of the present embodiment; therefore, description thereof in detail is omitted.

Figure 16:
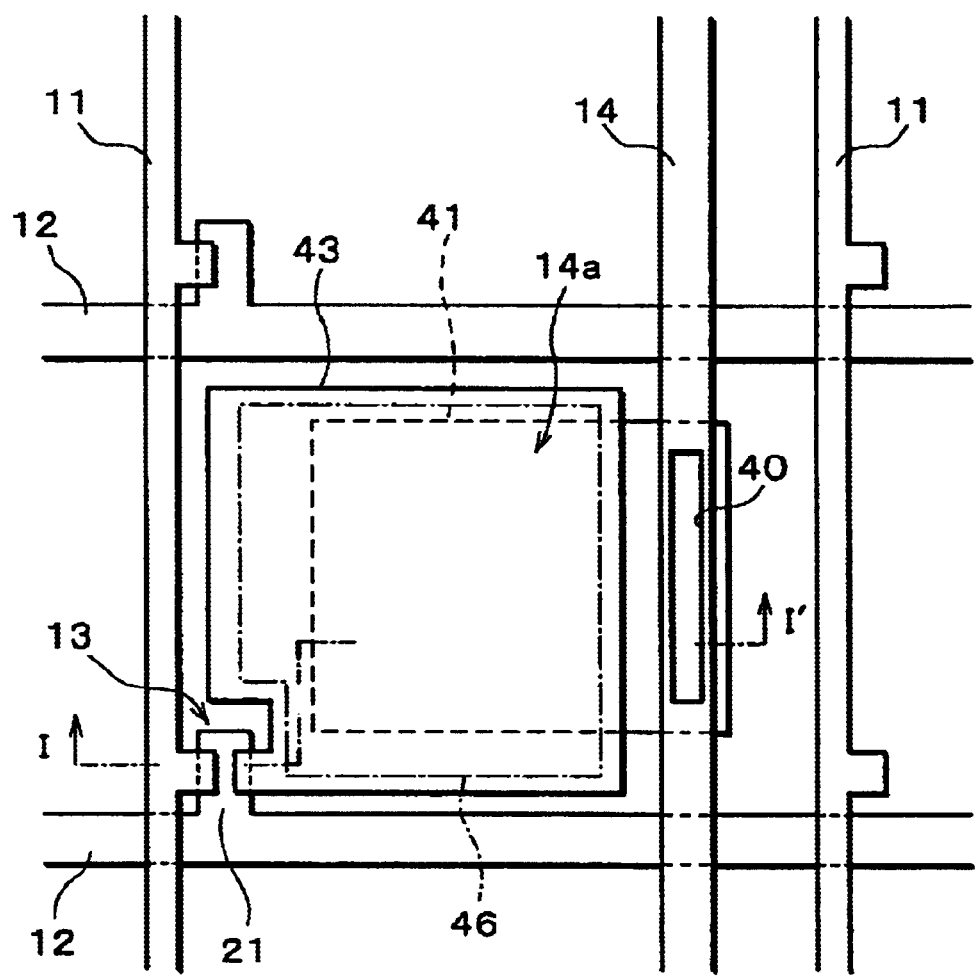
FIG. 16 is a schematic plan view showing an arrangement of an active matrix substrate of another embodiment in accordance with the present invention.
Figure 17:
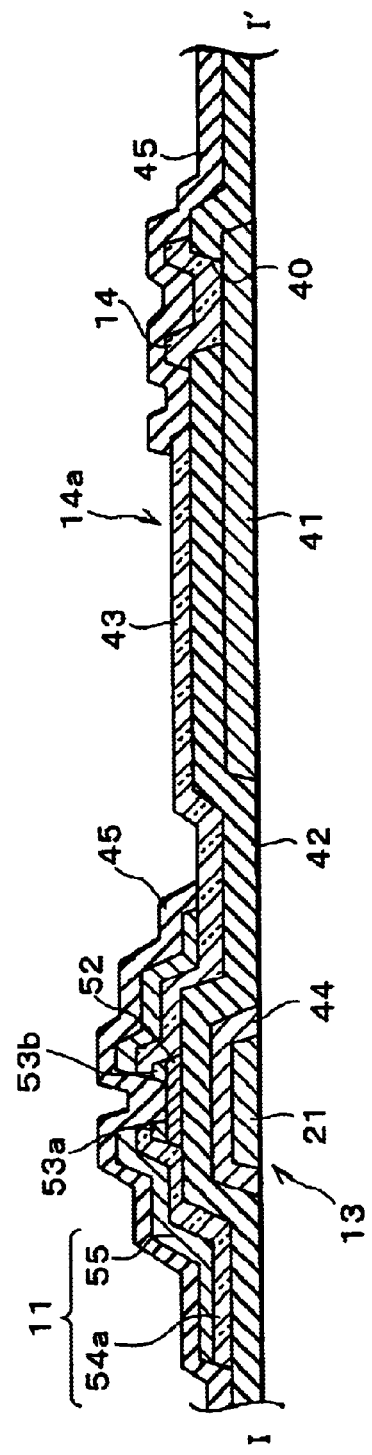
FIG. 17 is a cross-sectional view showing an active matrix substrate shown in FIG. 16, taken along line I–I'.

As shown in FIG. 16 and FIG. 17, an active matrix substrate of the present embodiment includes pixels (pixel area) each encircled by signal lines 11 and scanning lines 12 that are provided in a matrix, and each pixel has a TFT 13 as a switching element near the point where the signal line 11 crosses the scanning line 12.

A pixel capacitor wire (storage capacitor common wire) 14, disposed parallel to the signal lines 11, is a pixel capacitor common wire for connecting together a plurality of pixel capacitors (storage capacitors, supplementary capacitors) 14a provided to those pixels that are in a row parallel to the signal lines 11. For example, the pixel capacitor wire 14 is connected to common electrodes (not shown) of an opposite substrate if the active matrix substrate is used in a liquid crystal display device. In a contact hole 40, the pixel capacitor wire 14 is electrically connected to a pixel capacitor electrode 41 which is disposed opposing a pixel electrode 43 across a gate insulation film 42 as shown in FIG. 17, so that the pixel capacitor electrode 41 and the pixel electrode 43 constitute a pixel capacitor 14a.

Further, as will be mentioned below in the description about manufacturing steps, the pixel capacitor electrode 41 and the scanning line 12 are concurrently fabricated from the same layer through patterning thereof.

Now, referring to FIG. 18(a) through FIG. 18(g), the following description will discuss manufacturing steps of the active matrix substrate of the present embodiment specifically.

Figure 18A:
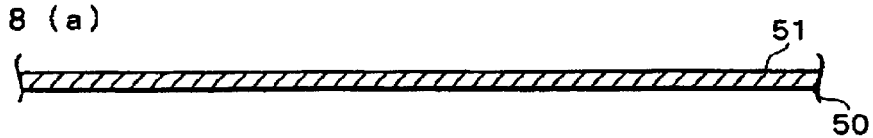
FIG. 18(a) through FIG. 18(g) are cross-sectional views showing manufacturing steps of the active matrix substrate shown in FIG. 16, taken along line I–I'.

As shown in FIG. 18(a), a metal film 51 (corresponding to an electrode layer) made of Ta, for example, is deposited on an insulating transparent substrate 50 made of glass, for example, and subsequently, subjected to photolithography and dry or wet etching so as to concurrently form the pixel capacitor electrode 41 (FIG. 18(b)) as well as a gate electrode 21 constituting a TFT 13 and a scanning line 12 (see FIG. 16). In this manner, the pixel capacitor electrode 41 and the scanning line 12 including the gate electrode 21 are concurrently fabricated from the same layer, i.e., the metal film 51, through patterning thereof. The pixel capacitor electrode 41 is provided to a portion that will serve as an underlying layer to the pixel electrode 43.

Subsequently, the gate electrode 21 and the scanning line 12 are anodized so as to form an anodization film 44 on the gate electrode 21 and the scanning line 12 (FIG. 18 (c)), while the gate electrode 21 and the scanning line 12 are electrically coupled to the anode of a power source. No anodization film is formed on the pixel capacitor electrode 41 which is fabricated from the same layer as are the gate electrode 21 and the scanning line 12. This is because the pixel capacitor electrodes 41, formed like mutually separated islands so that each of them is provided to a different pixel from the others, are electrically separated from external circuits and do not change while the scanning lines 12 are being anodized through electrical connection to an anode of a power supply.

Figure 18B:
Figure 18C:
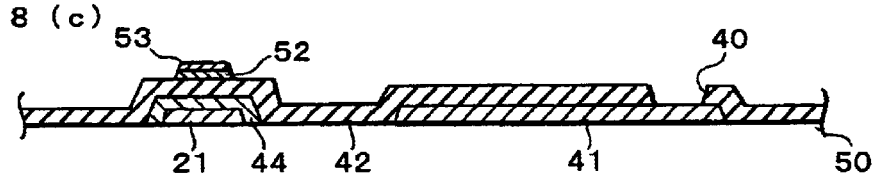

Next, a gate insulation film 42, a semiconductor layer 52, and an n$^+$-Si layer 53 are successively deposited and patterned as shown in FIG. 18(c). The n$^+$-Si layer 53 will be later fabricated into a source electrode 53a and a drain electrode 53b constituting the TFT 13. The deposition and patterning methods for these layers, as well as the pattern into which the layers are fabricated, are identical to those for the conventional substrate.

Specifically, among the deposited films (layers), the semiconductor layer 52 and the n$^+$-Si layer 53 can be concurrently patterned into the shape that the semiconductor layer 52 should be etched. The gap of the n$^+$-Si layer 53, which will serve as a channel section of the TFT 13, is yet to be formed. Next, the gate insulation film 42 is patterned. The patterning step is, however, for the purpose of providing an external contact section to the scanning lines 12 (see FIG. 16) near the terminals, as well as a contact section required to supply signals to the pixel capacitor wire 14 (see FIG. 16 and FIG. 17), for example, a contact section with a common electrode of the opposite substrate. Further, the patterning step is for forming a portion that will serve as a contact hole 40 for electrically connecting the pixel capacitor wire 14 to the pixel capacitor electrode 41 when the pixel capacitor wire 14 is disposed.

Figure 18D:
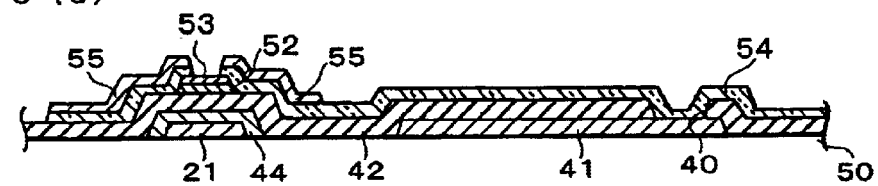
Figure 18E:
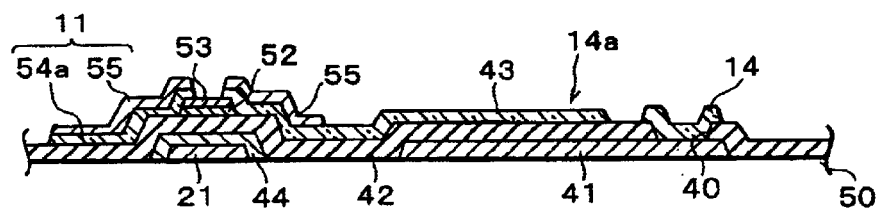

Next, a transparent conductive layer 54 (corresponding to a conductive layer), which will be fabricated into the signal line 11 and the pixel electrode 43, is deposited immediately followed by the deposition of a metal layer 55 (shown in FIG. 18(d) only in its patterned form). Thereafter, the metal layer 55 is patterned first as shown in FIG. 18(d). Subsequently to the patterning of the metal layer 55, the transparent conductive layer 54 is patterned so as to form a transparent electrode 54a, a pixel electrode 43, and a pixel capacitor wire 14 as shown in FIG. 18(e). That is, in the conventional step, only the signal line and the source and drain electrode for the TFT are formed. By contrast, in the present invention, concurrently with the deposition of the transparent conductive layer 54, the major portion of the signal line 11 and the major portion of the pixel capacitor wire 14 are formed parallel so that the major portion of the pixel capacitor wire 14 is parallel to the signal line Hence, the pixel electrode 43 and the pixel capacitor electrode 41 that has been formed of Ta in advance concurrently with the scanning line 12 constitute the pixel capacitor 14a across the gate insulation film 42.

The transparent electrode 54a and the metal layer 55 deposited thereon correspond to the signal line 11. Besides, the transparent conductive layer 54 is typically made of ITO (Indium Tin Oxide).

Figure 18F:
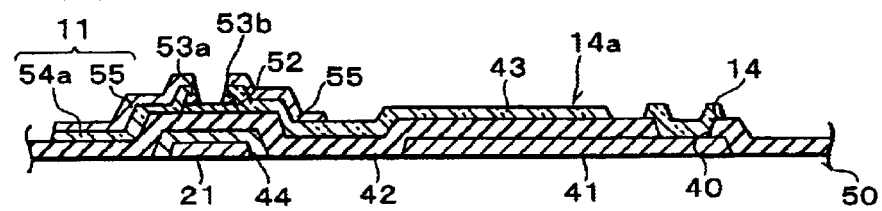

Subsequently to FIG. 18(e), as shown in FIG. 18(f), in a transistor section that will later serve as a TFT 13, the n$^+$-Si layer 53 is etched using the transparent conductive layer 54 and the metal layer 55 patterned as shown in FIG. 18(e) as a mask to form a channel for the TFT 13.

Figure 18G:
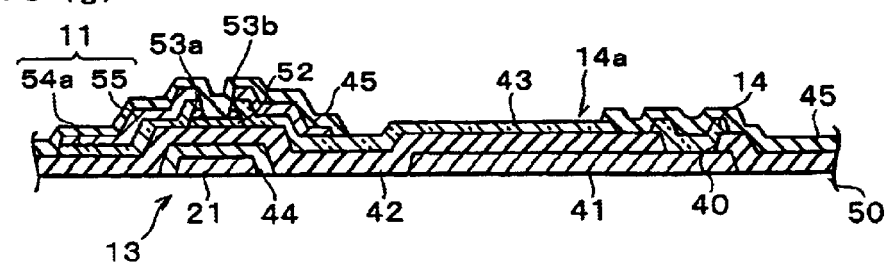

Next, as shown in FIG. 18(g), the protection film 45 for protecting the exposed semiconductor layer 52 is deposited and partly removed through etching where the protection film 45 overlies the pixel electrode 43, so as to form an aperture section 46 as shown in FIG. 16.

On the thus-completed active matrix section, a conversion layer made of selenium and the like is deposited, and then, electrodes are provided to the conversion layer to receive a bias voltage to complete manufacture of an image sensor.

As in the foregoing, the scanning line 12 and the gate electrode 21 of the TFT 13 have a double insulating layer structure constituted by the gate insulation film 42 and the anodization film 44. This is to prevent defective lines and other such serious display defects from occurring when the gate insulation film 42 develops cracks or perforations through which electricity leaks.

By contrast, in the pixel capacitor 14a, such leaks, if ever happen, are confined in tiny local areas; therefore, insulation is of less importance in the pixel capacitor 14a than in the scanning line 12 and the TFT 13. Rather, since the dielectric layer sandwiched between the pixel capacitor electrode 41 and the pixel electrode 43 in the pixel capacitor 14a has a single layer structure constituted by the gate insulation film 42, the dielectric layer has an increased permitivity and hence an increased electrostatic capacity per unit area. The dielectric layer therefore offers a relatively large supplementary capacity for the small area that it occupies.

Typically, the image sensor is specified to have a large supplementary capacity so as to prevent the electric charges generated in the conversion layer from undesirably increasing the electric potential of the pixel. Therefore, the image sensor becomes much more useful when it is structured to boast a larger electrostatic capacity per unit area.

Incidentally, the signal line 11 has a double layer structure as discussed in the foregoing for the purpose of allowing for a broken wire caused by dust accumulated during deposition of a layer and preventing the underlying layer from being damaged during the patterning of the overlying metal layer 55. The provision of the double layer signal line 11 is a conventional scheme to solve these problems.

Besides, possibly, the transparent conductive layer 54 may be deposited on the metal layer 55 or vice versa. In the present invention also, any of the two layers may be deposited on the other.

Further, in the present embodiment, the pixel capacitor wire 14 does not need to have a reduced resistance; therefore, no metal layer 55 is deposited on the transparent conductive layer 54, rendering the transparent conductive layer 54 as a single layer. However, if the gate insulation film 42 in the contact hole 40 has a sharp edge in its cross-section, the transparent conductive layer 54 is often damaged by the sharp edge. Therefore, to give more credibility to the deposition of the transparent conductive layer 54 in the contact hole 40, the transparent conductive layer 54, combined with the metal layer 55, preferably constitutes a double layer structure similarly to that found in the signal line 11.

In active matrix substrate of the present embodiment, as mentioned in the foregoing, the pixel capacitor wire 14 only crosses with the scanning line 12, thereby greatly reducing the time constant of the pixel capacitor wire 14. Accordingly, noise and delays in signal transmission hardly matter. Besides, as mentioned in the foregoing, the TFTs 13 belonging to those pixels that share a single pixel capacitor wire 14 are never turned on; therefore, it is no likely that the signals read from the pixels interfere with each other and degrades accuracy in the reading.

Further, if the pixel capacitor electrode 41 is fabricated from the same light blocking metal film as is the scanning line 12, so as to have an extended area, its use in a liquid crystal display device of a transparent type is likely to result in reduced aperture ratios, whereas its use in an image sensor is not problematic. This is because in the latter case, a part of the pixel electrode 43 that is in contact with the conversion layer is regarded as contributing to the aperture section, and a large supplementary capacity can be formed below the pixel electrode 43 from the same material as the scanning line 12 without a problem.

In the pixel, no pixel electrode 43 can be disposed in close proximity of the pixel capacitor wire 14, reducing the aperture area inevitably. However, in an image sensor, electric charges generated by an x-ray and the like are collected at the pixel electrode 43 due to a high voltage applied to the conversion layer; therefore, the reduce aperture area does not seriously affect the reading of signals.

As in the foregoing, the manufacture of an image sensor in accordance with the present invention follows the same process as the conventional manufacture of an active matrix substrate, with only patterns being modified. As a result, the number of steps can be prevented from increasing, and eventually, the manufacturing cost of an active matrix substrate can be prevented from rising.

Meanwhile, the previously-explained conventional active matrix substrate for use in a sensor where the pixel capacitor common wire 205b is disposed parallel to the signal line 201 as shown in FIG. 14 has the same advantages as to noise and signal delays as those of the present invention. That being said, in the present invention, the pixel capacitor electrode 41 is formed from the same material in the same step as the scanning line 12; unlike the active matrix substrate shown in FIG. 14, there is no need to form the underlying gate insulation film 210a prior to the formation of the pixel capacitor electrode 205.

In other words, in the arrangement shown in FIG. 15, the underlying gate insulation film 210a is deposited, and the pixel capacitor electrode 205 is deposited and patterned successively, after the formation of the scanning line 202 including the gate electrode. By contrast, by the process in accordance with the present invention, there is no step corresponding to the step of depositing the underlying gate insulation film 210a, and the pixel capacitor electrode 41 and the scanning line 12 are deposited and patterned concurrently. Therefore, the process in accordance with the present invention is more flexible in reducing the number of steps and costs than the process of manufacturing an active matrix substrate as shown in FIG. 15.

After the gate insulation film 210b is completely formed in the step shown in FIG. 14, the film arrangement appears simpler than the film arrangement in accordance with the present invention at a first sight. However, the total number of steps is inevitably larger in such a process that includes the step shown in FIG. 14 than in the process in accordance with the present invention, if the following two points are considered: (1) In the present invention, the pixel capacitor wire 14 does not necessarily have a double layer structure as mentioned in the foregoing, (2) In FIG. 14, no protection film is formed to protect the semiconductor layer, but an inorganic protection film is preferably interposed between the semiconductor layer and the interlayer insulation film (polymer layer) that is typically formed from an organic film so as to improve on the credibility of the device.

[Embodiment 6]

Figure 19:
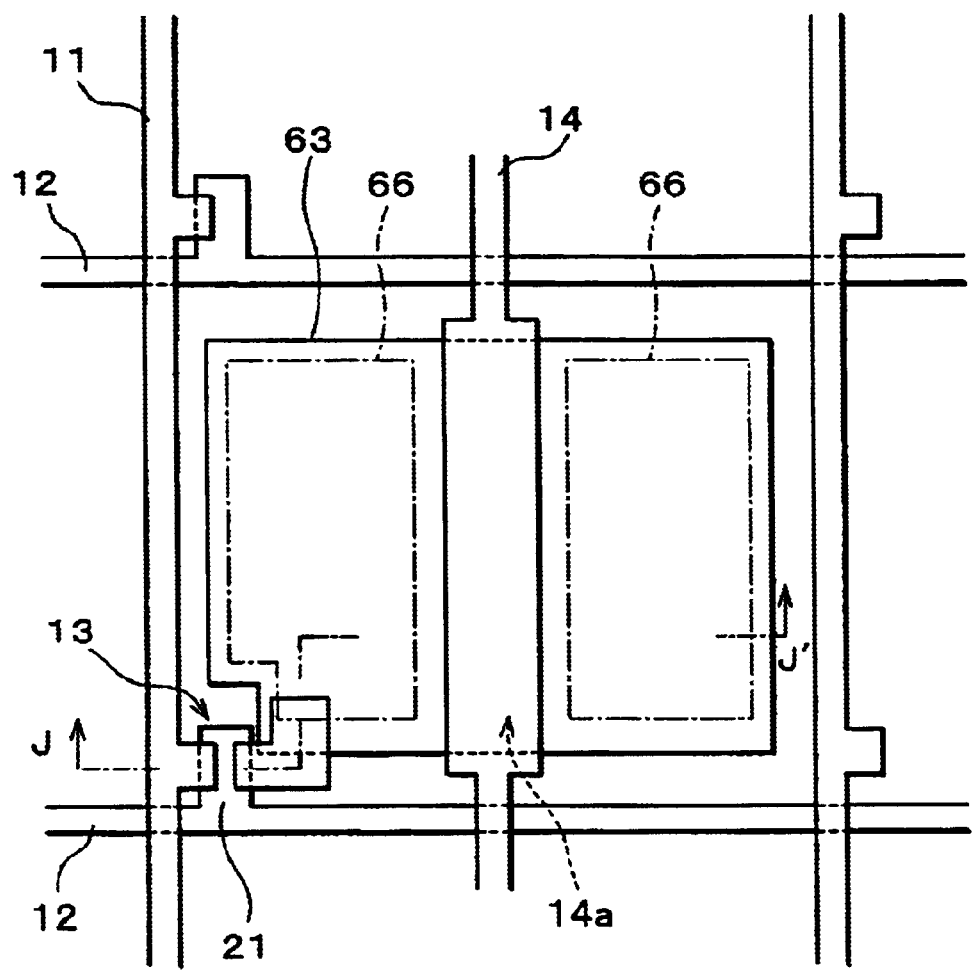
FIG. 19 is a schematic plan view showing an arrangement of an active matrix substrate of another embodiment in accordance with the present invention.
Figure 20:
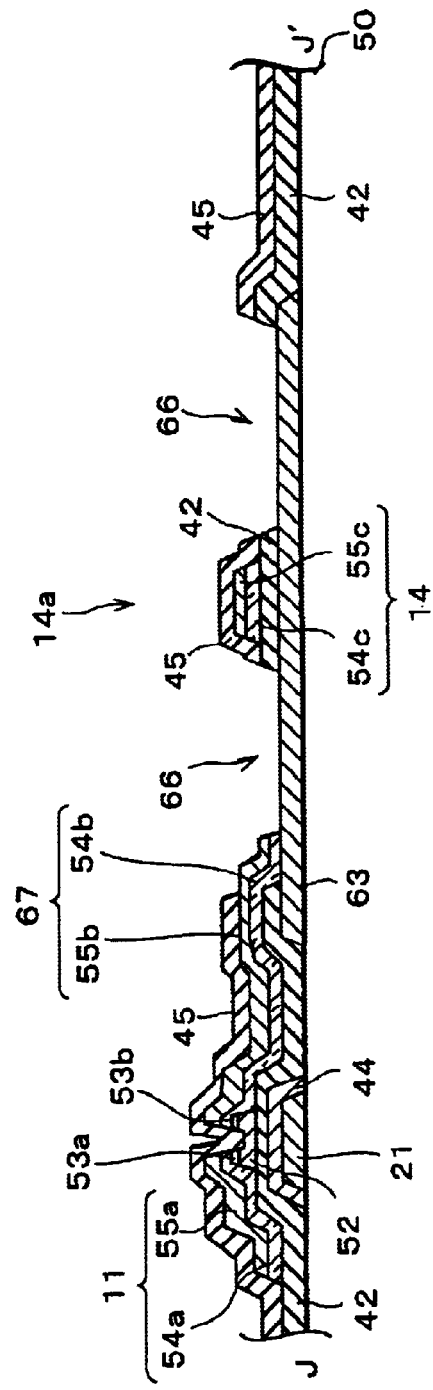
FIG. 20 is a cross-sectional view showing the active matrix substrate shown in FIG. 19, taken along line J–J'.

Referring to FIG. 19 and FIG. 20, the following description will discuss a further embodiment in accordance with the present invention. Here, for convenience, members of the present embodiment that have the same arrangement and function as members of the previous embodiments, and that are mentioned in the previous embodiments are indicated by the same reference numerals and description thereof is omitted. Besides, conventional materials and manufacturing method are applicable to the layers constituting the active matrix substrate of the present embodiment. Therefore, the manufacturing method of the layers constituting the active matrix substrate of the present embodiment is similar to those discussed earlier in reference to FIG. 3(a) through FIG. 3(h) and FIG. 18(a) through (g), and will be discussed only in reference to those Figures; detailed step diagrams are omitted.

As shown in FIG. 19 and FIG. 20, the active matrix substrate of the present embodiment has features in such an arrangement that a pixel electrode 63 and scanning lines 12 including a gate electrode 21 are concurrently fabricated from a single layer through patterning thereof and a pixel capacitor wire 14 is provided parallel to signal lines 11 so as to pass near the center of that area where a pixel is formed encircled by the signal lines 11 and the scanning lines 12.

As shown in FIG. 20, the pixel capacitor wire 14 and the pixel electrode 63 constitute the pixel capacitor 14a, as the pixel capacitor wire 14 is disposed on the pixel electrode 63 with the gate insulation film 42 being interposed in between.

Now, the following description will discuss manufacturing steps of the active matrix substrate of the present embodiment more specifically.

Similarly to the step shown in FIG. 18(a) discussed in the last embodiment, a metal film (correspond to an electrode layer) made of, for example, Ta is deposited on the insulating transparent substrate 50 made of, for example, glass, and then subjected to photolithography and dry or wet etching similarly to the step shown in FIG. 18(b), so as to concurrently form the gate electrode 21 constituting the TFT 13 and the scanning line 12 and the pixel electrode 63 in an island-like shape (see FIG. 19 and FIG. 20). In this manner, the pixel electrode 63 and the scanning line 12 including the gate electrode 21 are concurrently formed from the same metal film through patterning thereof.

Subsequently, the gate electrode 21 and the scanning line 12 are anodized so as to form an anodization film 44 on the gate electrode 21 and the scanning line 12, while the gate electrode 21 and the scanning line 12 are electrically coupled to the anode of a power source. No anodization film is formed on the pixel electrode 63 which is fabricated from the same layer as are the gate electrode 21 and the scanning line 12. This is because the pixel electrodes 63, formed like mutually separated islands so that each of them is provided to a different pixel from the others, are electrically separated from external circuits and do not change while the scanning lines 12 are being anodized through electrical connection to an anode of a power supply.

Next, a gate insulation film 42, a semiconductor layer 52, and an n$^+$-Si layer are successively deposited. The n$^+$-Si layer will be later fabricated into a source electrode 53a and a drain electrode 53b. The semiconductor layer 52 and the n$^+$-Si layer are then patterned, which is immediately followed by the patterning of the gate insulation film 42. Specifically, the gate insulation film 42 is etched so as to leave a portion thereof corresponding to the pixel capacitor wire 14 intact near the middle of the pixel electrode 63 and to form substantially rectangular aperture sections 66 flanking that portion.

Next, similarly to the steps shown in FIG. 3(c) and FIG. 3(d), the signal line 11 constituted by the transparent electrode 54a and the metal wire 55a, the connection electrode 67 constituted by the transparent electrode 54b and the metal wire 54b, and the pixel capacitor wire 14 constituted by the transparent electrode 54c and the metal wire 54c are formed together. In other words, the transparent electrode 54b of the signal line 11 and the transparent electrode 54c of the pixel capacitor wire 14 are fabricated from the same transparent conductive layer through patterning thereof, and the metal wire 54b of the signal line 11 and the metal wire 54c of the pixel capacitor wire 14 are fabricated from the same metal layer (conductive layer) through patterning thereof.

Here, the transparent electrode 54b and the metal wire 54b constituting the connection electrode 67 are extended from the position where the drain electrode 53b of the TFT 13 is formed, so as to reach the previously formed pixel electrode 63 and become electrically coupled to the pixel electrode 63 at the aperture section 66 on the side of the drain electrode 53b.

Subsequently, similarly to FIG. 3(e) and FIG. 3(f), the channel of the TFT 13 and the protection film 45 are formed. The protection film 45 is formed in the same pattern as is the gate insulation film 42; therefore, the photomask used for the patterning of the gate insulation film 42 can be used as it is, which will contribute to a reduction in the manufacturing cost of the active matrix substrate.

In the foregoing, the gate insulation film 42 is patterned after the formation of the semiconductor layer 52 and the n$^+$-Si layer and before the deposition of the transparent conductive layer and the metal layer which will be concurrently fabricated into the signal line 11 and the pixel capacitor wire 14. Alternatively, the gate insulation film 42 and the protection film 45 may be patterned concurrently after the deposition of the protection film 45. This is possible because the protection film 45 is made of the substantially same material as is the gate insulation film 42.

By concurrently patterning the protection film 45 and the gate insulation film 42 in this manner, the number of steps is greatly reduced, and large cost reductions are successfully achieved. Besides, since the formation of the aperture section 66, which will expose the pixel electrode 63, is carried out in a finishing stage, the surface of the pixel electrode 63 is contaminated minimally before a conversion layer is deposited on the pixel electrode 63. The conversion layer can therefore be formed in a stable manner.

Incidentally, in the present embodiment, to increase the pixel capacitor 14a, the pixel capacitor wire 14 formed on the pixel electrode 63 needs to expanded in width; therefore, the aperture sections 66 should inevitably be scaled down.

However, in a reverse situation where the pixel capacitor 14a is allowed to be relatively small, no area needs to be set aside to accommodate a contact hole 40 as shown in FIG. 16 discussed in the last embodiment. Further, no spatial room needs to be interposed between the pixel electrode 43 and the pixel capacitor wire 14 and between the pixel capacitor wire 14 and the signal line 11, whereas the room is not disposable in the arrangement shown in FIG. 16.

Consequently, if the pixel capacitor 14a is allowed to be relatively small, the aperture sections 66 are allowed to be made relatively large. The pixel capacitor 14a is allowed to be relatively small when, for example, the device is designed only for a high speed video recording or designed compatibly for both video and still picture recordings; in the latter case, however, each still picture image is obtained by synthesizing image data representative of two or more frames, which is often done for noise reduction and other purposes. In these events, without specifying the pixel capacitor wire 14 to a large value, the electric potential of the pixel can be prevented from rising excessively, which otherwise could be a cause for leak of electric charges or destruction of the TFT 13.

Generally, it is difficult to form a contact hole that has a low resistance and permits establishment of good contact, because the contact hole is physically a small dent and foreign objects including scum are easy to pile up on the bottom of the contact hole when the contact hole is etched out. Besides, because of the pile-up of foreign objects, the smaller the contact hole, the greater the contact resistance per unit area. Therefore, in the last embodiment, the contact hole 40 may be a cause for trouble if it is reduced too much in size. The above is reasons why a marginal area needs to be set aside to form the contact hole 40 in the arrangement shown in FIG. 16.

Note that in the present embodiment, the foregoing reasons are taken well into account and the aperture section 66 is designed with a maximum aperture area; therefore, foreign objects including scum are no likely to collect, enabling the connection electrode 67 to be electrically coupled to the pixel electrode 63 in the aperture section 66 in a satisfactory fashion.

Besides, unlike the arrangement shown in FIG. 16, the pixel capacitor wire 14 can be disposed to pass through the center of the pixel, separate portions where electric charges are hardly storable are created between adjacent pixels and in the center of the pixel by such specification that the gap between the pixel electrodes 63 belonging to adjacent pixels is smaller than the gap between the pixel electrodes 43 shown in FIG. 16. This arrangement increases efficiency in collecting electric charges.

In the foregoing, the present embodiment is discussed on the assumption that the scanning line 12 and the pixel electrode 63 are fabricated from the same Ta layer; however, Ta is not the only material for them. A proper material may be selected from Al, Mo, and other materials, provided that it satisfies compatibility with the physical nature of the conversion layer and allows effective use of the conventional manufacturing line for the active matrix substrate.

[Embodiment 7]

Figure 21:
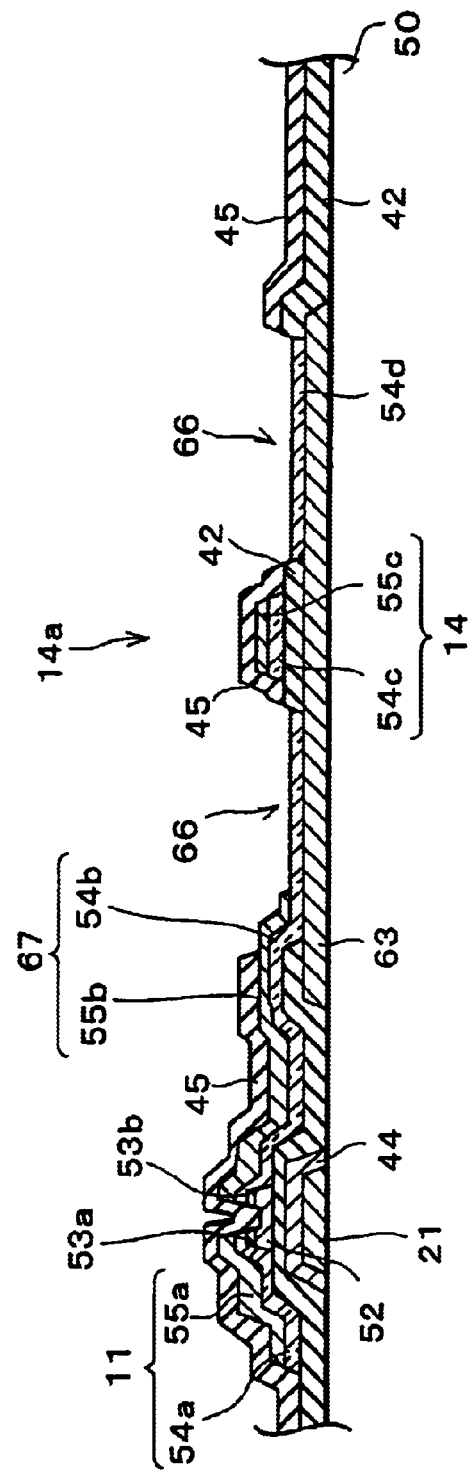
FIG. 21 is a schematic cross-sectional view showing an arrangement of an active matrix substrate of another embodiment in accordance with the present invention.
Figure 22:
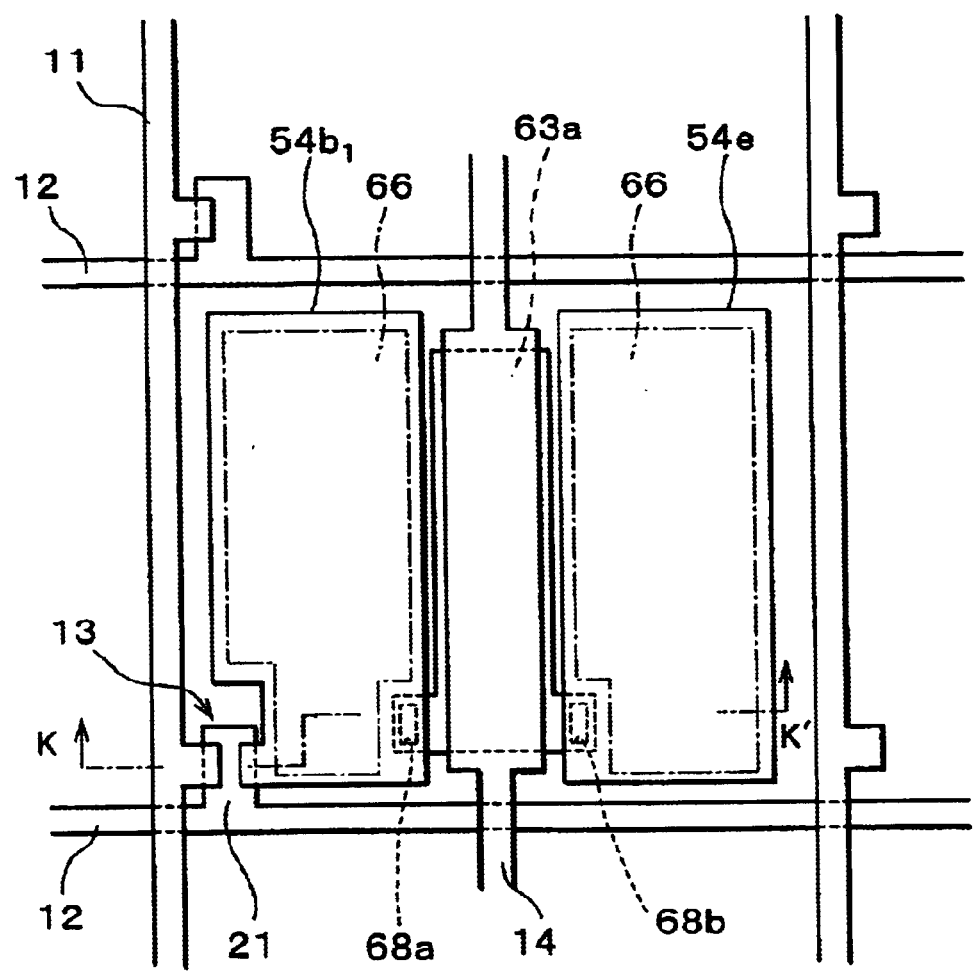
FIG. 22 is a schematic plan view showing a variety of the active matrix substrate shown in FIG. 21.
Figure 23:
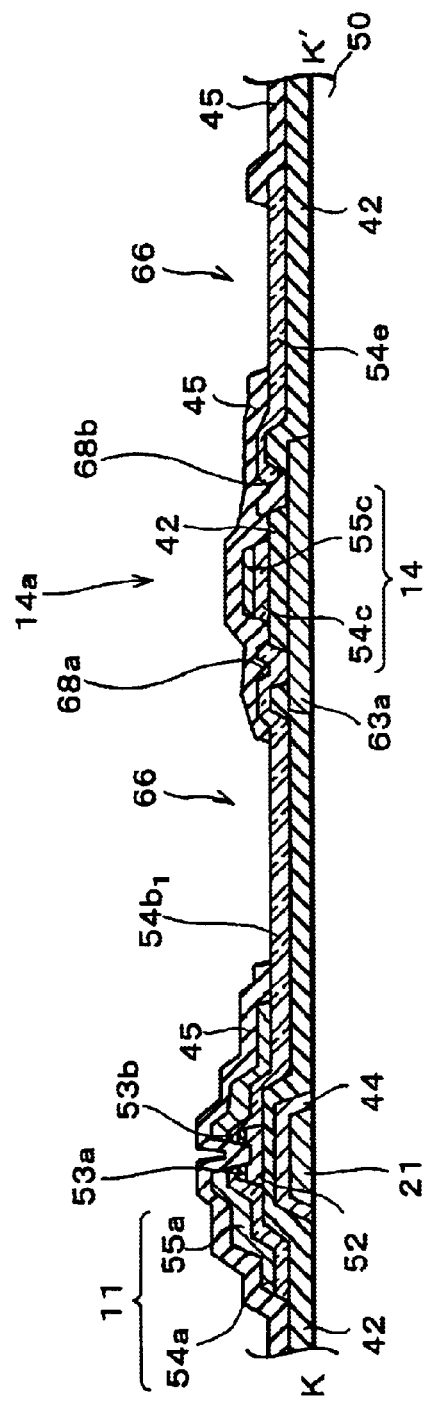
FIG. 23 is a cross-sectional view showing an active matrix substrate shown in FIG. 22, taken along line K–K'.

Referring to FIG. 21 through FIG. 23, the following description will discuss a further embodiment in accordance with the present invention. Here, for convenience, members of the present embodiment that have the same arrangement and function as members of the previous embodiments, and that are mentioned in the previous embodiments are indicated by the same reference numerals and description thereof is omitted.

In the arrangement of the sixth embodiment, if the effective use of the conventional manufacturing line for the active matrix substrate takes precedence, it may become difficult to make a right choice as to the material for the scanning line 12 and the pixel electrode 63 that satisfies compatibility with the physical nature of the conversion layer.

Besides, the metal layer serving as the pixel electrode 63, if left exposed, is highly likely to be oxidized at its surface, which may interrupt a satisfactory level of conductance with the conversion layer. Especially, when the conversion layer is made of an amorphous selenium, since the amorphous selenium is highly susceptible to heat and water, a step of cutting or a step of mounting a circuit may be performed prior to deposition of an amorphous selenium. It is essential that the surface conditions of the pixel electrode 63 do not degrade until the amorphous selenium is deposited thereon after the cutting or mounting step is performed.

Accordingly, the aforementioned aperture section 66 may be covered with a transparent conductive layer as in the present embodiment shown in FIG. 21. The transparent conductive layer is preferably made of ITO, which is conventionally used for the pixel electrode in the active matrix substrate.

Further, the step of patterning transparent electrodes 54a, 54b, and 54c that will constitute a signal line 11, a connection electrode 67, and a pixel capacitor wire 14 respectively is applicable to the step of covering the aperture section 66 with a transparent conductive layer after the patterning of the metal wires 54a, 54b, and 54c that will constitute the signal line 11, the connection electrode 67, and the pixel capacitor wire 14 respectively. Hence, the active matrix substrate can be manufactured with improved reliability and increased yields, without losing any of the advantages of the present embodiment and modifying the manufacturing steps of the conventional active matrix substrate.

More specifically, when the transparent conductive layer deposited on the pixel electrode 63 to form the transparent electrodes 54a, 54b, and 54c is patterned, as shown in FIG. 21, the transparent electrode 54b and the transparent conductive film 54d are left unremoved on the aperture sections 66 so as not to be in contact with the transparent electrode 54c constituting the pixel capacitor wire 14.

FIG. 22 and FIG. 23 show a modification of the arrangement shown in FIG. 21. In the modification, the pixel electrode 63 is replaced by an underlying pixel electrode 63a (corresponding to the second pixel electrode) that is shorter than the pixel electrode 63 shown in FIG. 21, but slightly longer than the pixel capacitor wire 14, when measured parallel to the scanning line 12. In accordance with this, as shown in FIG. 23, a gate insulation film 42 and a transparent electrode $54b_1$, (corresponding to a first pixel electrode) or a gate insulation film 42 and a transparent electrode 54e (corresponding to first pixel electrode) are deposited in the aperture section 66.

That is, the transparent electrodes $54b_1$, and 54e made of ITO assume the role of a pixel electrode to collect electric charges.

The pixel capacitor 14a is constituted by the underlying pixel electrode 63a and the pixel capacitor wire 14 provided thereon. Therefore, an area is set aside on a corner of the underlying pixel electrode 63a closest to the drain electrode 53b so as to accommodate a contact hole 68a in which electric connection is established between the drain electrode 53b and the underlying pixel electrode 63a. Another area is set aside on another corner of the underlying pixel electrode 63a opposite to the contact hole 68a so as to accommodate a contact hole 68b in which electric connection is established between the drain electrode 53b and the transparent electrode 54e deposited in the other aperture section 66 via the underlying pixel electrode 63a.

In an active matrix substrate of such a structure, the area occupied by the aperture section 66 and efficiency in collecting electric charges remain substantially the same as those in the sixth embodiment. It is safe to say that other advantages of the sixth embodiment discussed earlier are not at all lost in the present embodiment, except that the gate insulation film 42 is patterned so as to form the contact holes 68*a* and 68*b* using a different photomask from the one used in the patterning of the protection film 45.

Further, the transparent electrode 54*a* constituting the signal line 11, the transparent electrodes $^{54}b_1$, and 54*e* as first pixel electrodes, and the transparent electrode 54*c* constituting the pixel capacitor wire 14 can be fabricated from the same conductive layer through patterning thereof. Hence, the number of steps is reduced, and cost reductions are successfully achieved.

Further, in the structure of the present embodiment, the width of the underlying pixel electrode 63*a* is set shorter than the width of the pixel electrode 63 shown in FIG. 21; therefore, light can pass through most part of the pixel. This is convenient when light is projected to the entirety of the active matrix substrate on its side facing the transparent substrate 50, i.e., on the side opposite to the side where an x-ray is projected, so as to refresh the conversion layer.

In other words, due to the nature of the conversion layer, electric charges may still remain in the conversion layer in small quantities after electric charges are read. These remaining electric charges possibly degrade signal precision and cause polarization, rendering the conversion layer per se less reliable. Accordingly, in some cases, the conversion layer can be effectively refreshed by projecting light to the conversion layer at a constant cycle, for example, at every interval between read-out frames. When this is the case, the light blocking areas, including the gate electrode and the pixel electrode, are preferably small, so as to sufficiently irradiate the conversion layer with the light projected to the entirety of the active matrix substrate on its side facing the transparent substrate 50.

[Embodiment 8]

Figure 24:
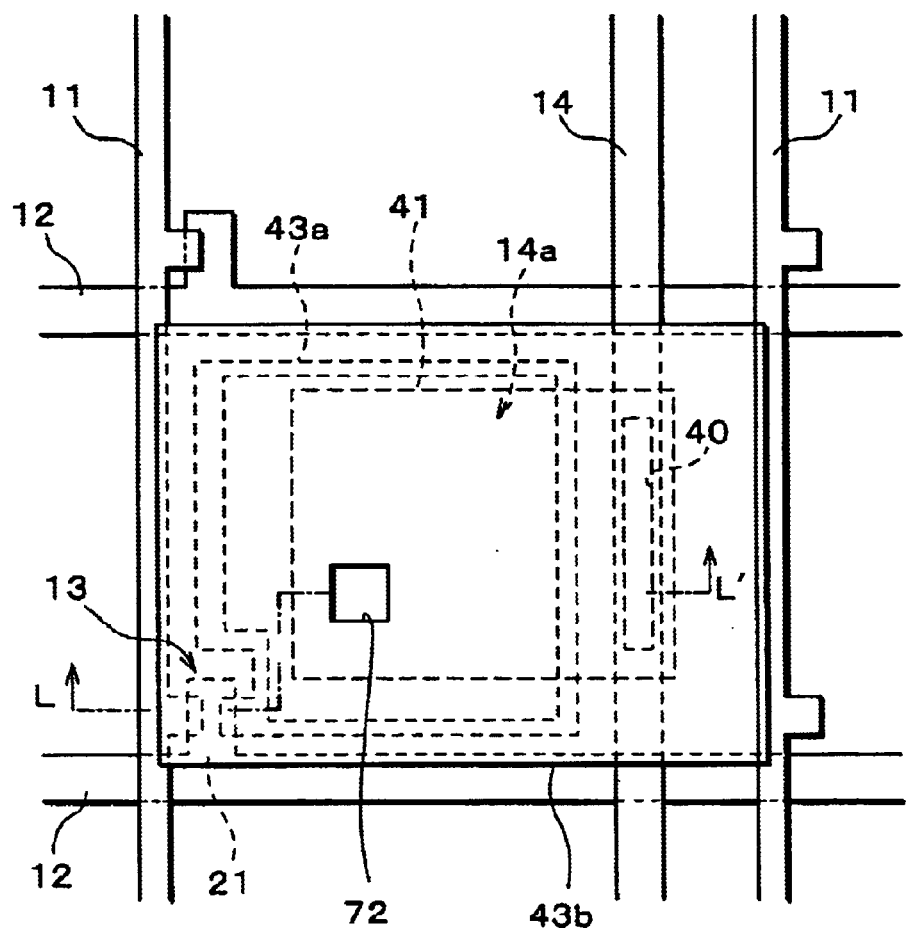
FIG. 24 is a schematic plan view showing an arrangement of an active matrix substrate of another embodiment in accordance with the present invention.
Figure 25:
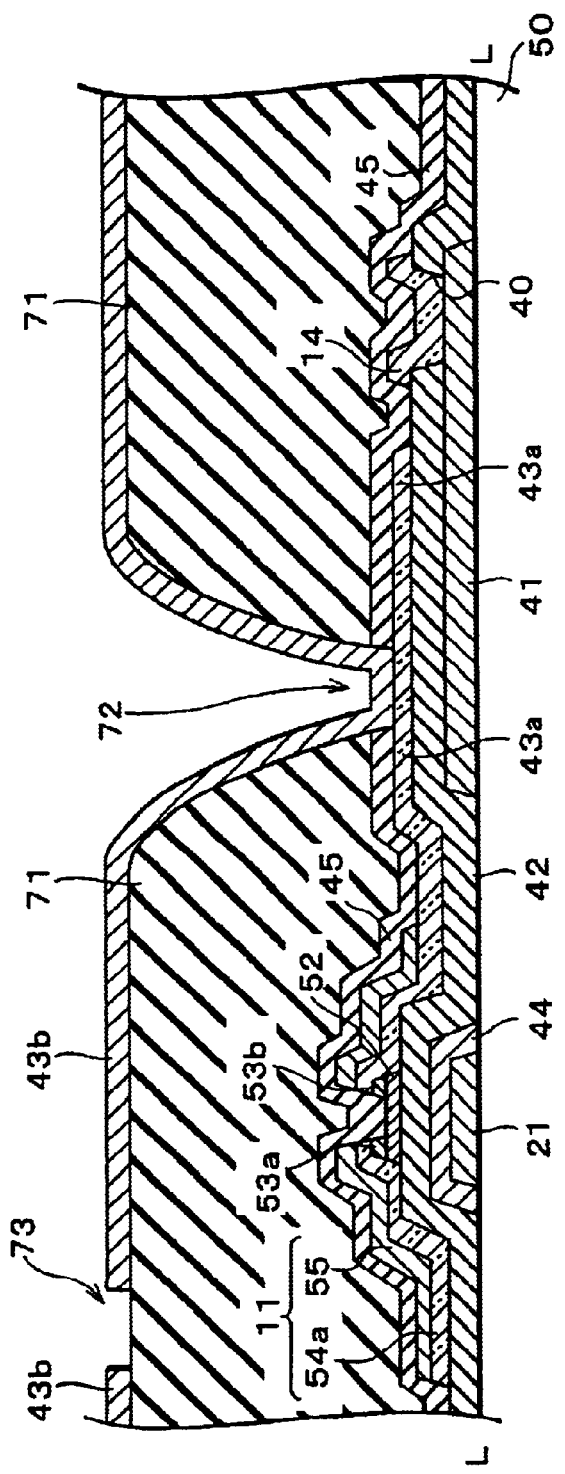
FIG. 25 is a cross-sectional view showing an active matrix substrate shown in FIG. 24, taken along line L–L'.

Referring to FIG. 24 and FIG. 25, the following description will discuss a further embodiment in accordance with the present invention. Here, for convenience, members of the present embodiment that have the same arrangement and function as members of the previous embodiments, and that are mentioned in the previous embodiments are indicated by the same reference numerals and description thereof is omitted.

The arrangement of the present embodiment has a feature in that an underlying pixel electrode 43*a* (corresponding to a second pixel electrode) is provided in place of the pixel electrode 43 shown in FIG. 16 and FIG. 17 of the fifth embodiment, and that an overlying pixel electrode 43*b* (corresponding to a first pixel electrode) is disposed on the underlying pixel electrode 43*a* with an interlayer insulation film 71 being interposed in between, and also in that the overlying pixel electrode 43*b* is disposed to overlie a signal line 11, a scanning line 12, and a pixel capacitor wire 14.

Therefore, the active matrix substrate of the present embodiment employs the arrangement of the active matrix substrate shown in FIG. 16 and FIG. 17 with little modification. Specifically, the underlying pixel electrode 43*a* can assume the function as the foregoing pixel electrode 43 only by removing the protection film 45 according to the aperture section 46 shown in FIG. 16, if the interlayer insulation film 71 and the overlying pixel electrode 43*b* are not provided.

Further, the underlying pixel electrode 43*a* corresponds to the "pixel electrode" in claims which recite, "the storage capacitor is formed between the pixel electrode and the storage capacitor electrode", because the underlying pixel electrode 43*a* is a conductive body layer that is fabricated from the transparent conductive layer 54 through patterning thereof and connected to the drain electrode 53*b*, and the underlying pixel electrode 43*a* and the pixel capacitor electrode 41 constitute a pixel capacitor.

In manufacture, the steps illustrated in FIG. 18(*a*) through FIG. 18(*f*) are performed as they are, so as to deposit a protection film 45. Then, the protection film 45 is partly removed so as to form a precursor to a contact hole 72 through which the overlying pixel electrode 43*b* is electrically coupled to the underlying pixel electrode 43*a*, and an acrylic photosensitive resin is applied. Subsequently, the precursor to the contact hole 72 is exposed to light for development, so as to complete the formation of the contact hole 72 that passes through the protection film 45 and the interlayer insulation film 71.

Thereafter, the overlying pixel electrode 43*b* made of ITO is deposited to complete the manufacture of an active matrix substrate. The overlying pixel electrode 43*b* is connected through the contact hole 72 to the underlying pixel electrode 43*a* that is a transparent conductive film extending from a drain electrode 53*b* of the TFT 13.

In the present embodiment, the overlying pixel electrode 43*b* is disposed partly overlapping the signal line 11, the scanning line 12, and the pixel capacitor wire 14; therefore, the aperture area is greatly increased.

In an image sensor, as mentioned in the foregoing, the area through which light passes does not serve as an aperture section; instead, the area where a pixel electrode is in contact with a conversion layer serves as an aperture section. Therefore, in the arrangement of the present embodiment, substantially the whole area serves as an aperture section, except the area where a gap 73 is formed in the overlying pixel electrode 43*b* between adjacent pixels (see FIG. 25). Electric charges generated in the conversion layer are collected by the overlying pixel electrode 43*b* at a maximum efficiency.

Besides, the interlayer insulation film 71 is provided in a thickness of 3 μm by spin coating; therefore, the surface of the interlayer insulation film 71 can be formed extremely flat. This enables a conversion layer of a high quality to be formed from amorphous selenium in a stable manner.

Specifically, when a conversion layer is formed from amorphous selenium, if the underlying layer is not substantially flat, the amorphous selenium crystallizes starting at mounds and dents on the surface of the underlying layer, and fails to give desired properties to the conversion layer. By contrast, when the interlayer insulation film 71 is formed by spin coating, the interlayer insulation film 71 covers the mounds and dents and thus flattens the underlying layer; the amorphous selenium is given nowhere to start crystallizing. In addition, since the contact hole 72 is formed by photolithography, the contact hole 72 has a smooth edge and does not permit the amorphous selenium to start crystallizing at the contact hole 72.

Note that in the arrangement of the present embodiment, the overlying pixel electrode 43*b* is disposed so as to overlap the signal line 11; however, needless to say, the overlying pixel electrode 43*b* is preferably disposed so as not to overlap the signal line 11 if the permitivity and thickness of the interlayer insulation film 71 are likely to excessively increase the electrostatic capacity between the overlying pixel electrode 43*b* and the signal line 11 and thereby to cause an increase in the capacity and noise in the signal line 11.

If the overlying pixel electrode 43*b* is disposed so as not to overlap the signal line 11, the same advantages are still available in comparison to the arrangement of the fifth embodiment where the electric charges can be collected highly efficiently and the crystallization of amorphous selenium can be prevented.

As already mentioned above, active matrix substrates with an interlayer insulation film are applied in conventional liquid crystal display devices. The manufacturing process for those liquid crystal display devices is applicable to the manufacture of active matrix substrates of the present embodiment only by modifying the pattern in the patterning, which results in reduced manufacturing cost.

Incidentally, the arrangement of the present embodiment is applicable to liquid crystal display devices as well as to active matrix substrates for use in image sensors. However, the pixel capacitor wire 14 and the pixel capacitor electrode 41 are fabricated from a light blocking metal layer; therefore, the arrangement, if applied to liquid crystal display devices of a transparent type, is not practical because of too low an aperture ratio (in this case, the ratio of area through which light can pass). Meanwhile, if the arrangement is applied to liquid crystal display devices of a reflective type that are getting increasing demand in the market recently, the existence of the light blocking pattern below the overlying pixel electrode 43b does not raise a problem.

Note that if the active matrix substrate of the present embodiment is applied to a liquid crystal display device of a reflective type, needless to say, the overlying pixel electrode 43b needs to be made from a metal with a high reflectance, such as aluminum, instead of ITO.

[Embodiment 9]

Referring to FIG. 26 through FIG. 29, the following description will discuss a further embodiment in accordance with the present invention. Here, for convenience, members of the present embodiment that have the same arrangement and function as members of the previous embodiments, and that are mentioned in the previous embodiments are indicated by the same reference numerals and description thereof is omitted.

An active matrix substrate of the present embodiment is different from the active matrix substrate of the seventh embodiment shown in FIG. 23 in that the former lacks the aperture section 66, the contact hole 68b and the transparent electrode 54e, and instead, includes an interlayer insulation film 71 and an overlying pixel electrode 43b' that are stacked, and a contact hole 68a of the gate insulation film 42 that is located right below a contact hole 72a of the interlayer insulation film 71, so as to provide electrical connection linking an underlying pixel electrode 63a, the overlying pixel electrode 43b', and a transparent electrode 54b$_2$.

The transparent electrode 54b$_2$ functions as a connection electrode for electrically connecting the drain electrode 53b to the overlying pixel electrode 43b'. The pixel capacitor wire 14 is constituted by a transparent electrode 54c' and a metal wire 54c' corresponding respectively to the transparent electrode 54c and the metal wire 54c.

Therefore, the manufacturing process of the seventh embodiment is applicable after only slight modification: in the manufacturing steps for the active matrix substrate shown in FIG. 23, no contact hole 68b is formed if the contact hole 68a is etched out in the gate insulation film 42, and no transparent electrode 54e is formed if the transparent electrodes 54a, 54b$_2$, and 54c' are formed.

Subsequently, a protection film 45 is formed and partly removed to form a precursor to a contact hole 68a. Then, similarly to the process in the eighth embodiment, a contact hole 72a is formed, in place of the contact hole 72, in the interlayer insulation film 71 and the overlying pixel electrode 43b'.

The active matrix substrate of the present embodiment, if applied to image sensors, gives the same advantages as those of the foregoing eighth embodiment. Meanwhile, the active matrix of the present embodiment, if applied to liquid crystal display devices, is advantageous in its versatility such that it is also applicable to transparent types as well as to reflective types.

This is because a relatively narrow light blocking underlying pixel electrode 63a is formed under the pixel capacitor wire 14 so as to constitute the pixel capacitor 14a. Thus, light is blocked only by the signal line 11, the scanning line 12, and the surrounding part of the pixel capacitor wire 14, and an area in the underlying pixel electrode 63a which accommodates the contact hole 68a; the same level of aperture ratio is ensured for the pixel as in the active matrix substrate using a conventional interlayer insulation film.

Further, a metal layer constituting the signal line 11 and the scanning line 12 is always disposed below the part not covered with the overlying pixel electrode 43b, such as the gap 73 (see FIG. 27) between adjacent pixels; therefore, the present embodiment can retain an advantage of the conventional active matrix substrate incorporating an interlayer insulation film whereby the opposite substrate across the liquid crystal can dispense with a black matrix. In addition, the present embodiment has the aforementioned unique advantage imparted by the signal line 11 only crossing the scanning line 12.

In the present embodiment, the contact hole 68a and the contact hole 72a are formed in the same position through the gate insulation film 42, the protection film 45, and the interlayer insulation film 71. This arrangement prevents a decrease in the aperture ratio as a result of the provision of separate light blocking areas where the contact holes 68a and 72a are formed respectively, and also enables the underlying pixel electrode 63a to block light so as to prevent disturbance in the alignment of the liquid crystal caused by the contact hole 72a of the interlayer insulation film 71.

Besides, the arrangement in which the contact hole 68a and the contact hole 72a are provided in the same position enables the use of the same photomask, contributing a reduction in manufacturing costs.

In the foregoing, the gate insulation film 42 is patterned prior to the deposition of the transparent conductive layer constituting the transparent electrode 54b$_2$, and the like and the metal layer constituting the metal wire 54c and the like. Instead, the gate insulation film 42 may be patterned simultaneously with the protection film 45 subsequently to the deposition of the protection film 45. A further alternative is to pattern the interlayer insulation film 71 and subsequently pattern the protection film 45 and the gate insulation film 42 simultaneously using the patterned interlayer insulation film 71 in place of a resist without performing a photolithography step.

Figure 28:
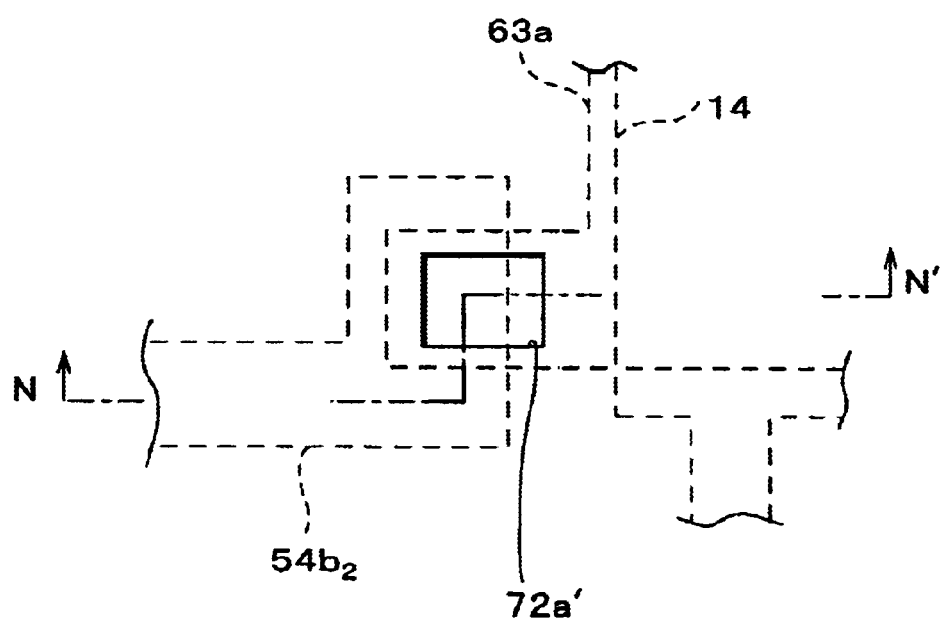
FIG. 28 is a schematic plan view showing a major part of a variety of the active matrix substrate shown in FIG. 26, which is modified in neighborhoods of contact holes.
Figure 29:
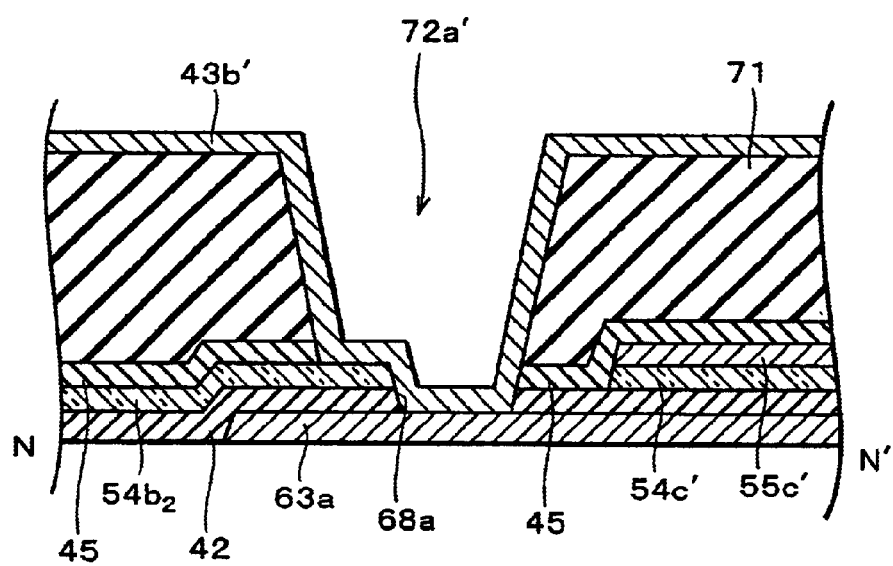
FIG. 29 is a cross-sectional view showing the active matrix substrate shown in FIG. 28, taken along line N–N'.

FIG. 28 and FIG. 29 show the aforementioned preferred structure. FIG. 28 is a major part plan view showing only a neighborhood of the a contact hole 72a' corresponding to a neighborhood of the contact hole 72a shown in FIG. 26. FIG. 29 is a cross-sectional view taken along line N–N' shown in FIG. 28.

Figure 26:
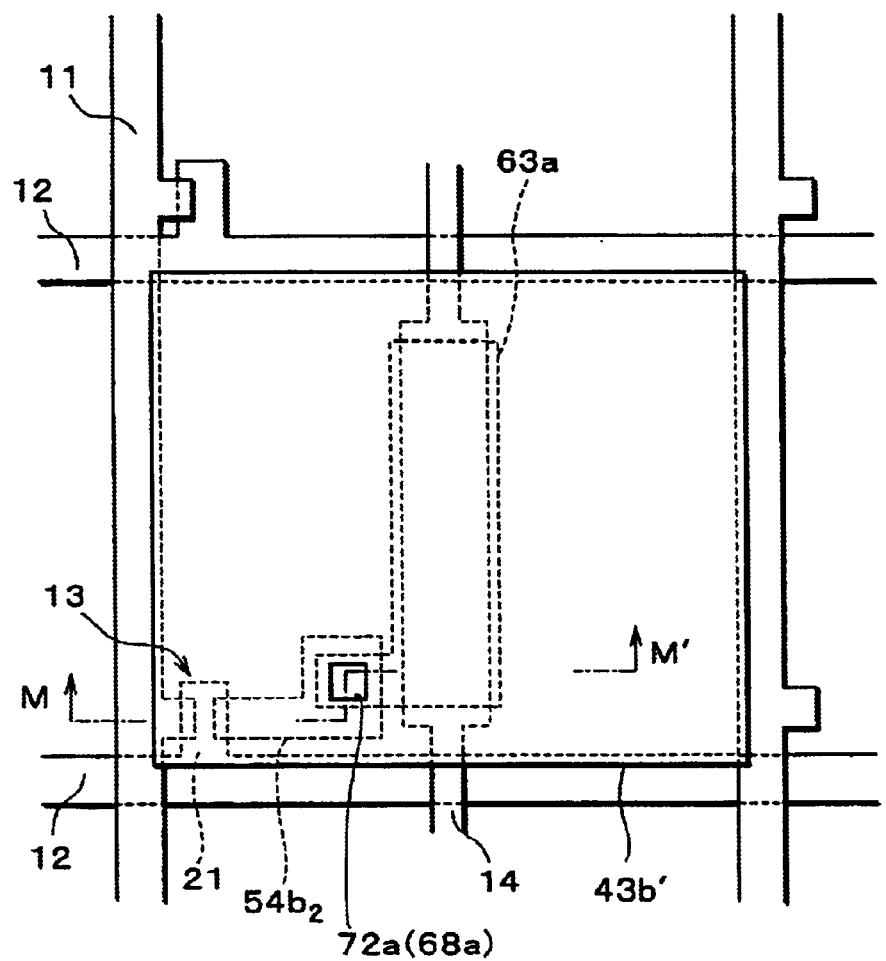
FIG. 26 is a schematic plan view showing an arrangement of an active matrix substrate of another embodiment in accordance with the present invention.
Figure 27:
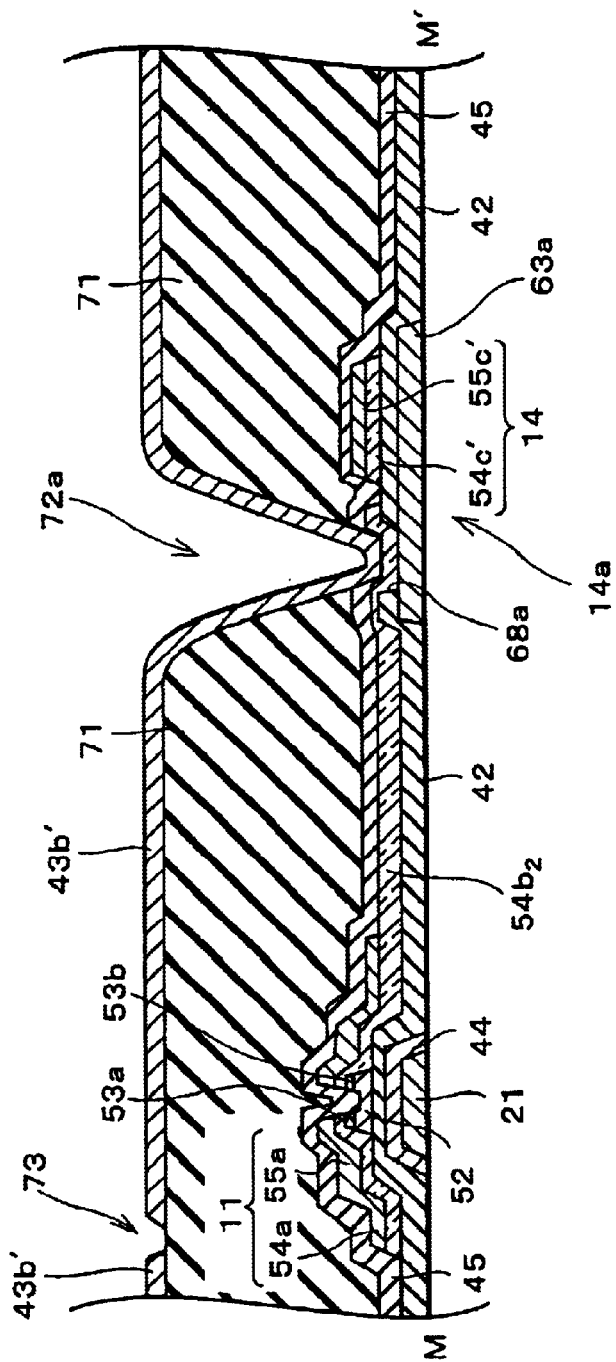
FIG. 27 is a cross-sectional view showing the active matrix substrate shown in FIG. 26, taken along line M–M'.

In the structure shown in FIG. 26 and FIG. 27, the protection film 45 and the gate insulation film 42, although sharing a common pattern, cannot be simultaneously patterned, because the transparent electrode 54b$_2$ is interposed between the protection film 45 and the gate insulation film 42. In other words, in order to connect the transparent electrode 54b$_2$ to the underlying pixel electrode 63a, the gate insulation film 42 needs to be patterned prior to the deposition of the transparent conductive layer constituting the transparent electrode $54b_2$ and the like, so as to form the contact hole 68a.

By contrast, according to the arrangement shown in FIG. 28 and FIG. 29, the gate insulation film 42 is deposited on the underlying pixel electrode 63a, and thereafter the transparent electrode $54b_2$ is patterned without performing the patterning step of the gate insulation film 42. In other words, the transparent electrode $54b_2$, is not formed where the contact hole 68a is to be formed. Therefore, by simultaneously patterning the protection film 45 and the gate insulation film 42 using the subsequently patterned interlayer insulation film 71 in place of a mask, the protection film 45 is etched in a size corresponding to the contact hole 72a', while the gate insulation film 42 is etched in a size corresponding to the contact hole 68a which is smaller than the contact hole 72a' with the interlayer insulation film 71 and the transparent electrode $54b_2$ serving in place of a mask.

The etching is possible because the protection film 45 and the gate insulation film 42 are composed of the same material or of materials sharing similar properties (e.g., $SiN_x$ or $SiO_2$), and also are sufficiently different from the transparent electrode $54b_2$ (e.g., ITO) in the selection ratios of an etchant. Specifically, the protection film 45 and the gate insulation film 42 are simultaneously patterned using buffered hydrofluoric acid or a similar etchant that does not decompose the ITO. The etchant therefore selectively remove the gate insulation film 42 where the transparent electrode $54b_2$ exists and where the transparent electrode $54b_2$ does not exist.

Thus, a deposition body constituted by the transparent electrode $54b_2$ and the gate insulation film 42 remains unetched in a portion of the contact hole 72a'. Meanwhile, in the other portion of the contact hole 72a', such a deposition body does not exist, leaving the underlying pixel electrode 63a being exposed. By providing the overlying pixel electrode 43b' on both of the portions, the transparent electrode $54b_2$ can be electrically connected to the underlying pixel electrode 63a via the overlying pixel electrode 43b'. Note that the transparent electrode $54b_2$ functions as a connection electrode for electrically connecting the drain electrode 53b to the overlying pixel electrode 43b'.

The simultaneous patterning of the protection film 45 and the gate insulation film 42, and the possible omission of the photolithography step by using the interlayer insulation film 71 in place of a resist, reduce the number of steps greatly and thereby enable a great reduction in the manufacturing cost to be achieved.

[Embodiment 10]

Figure 30:
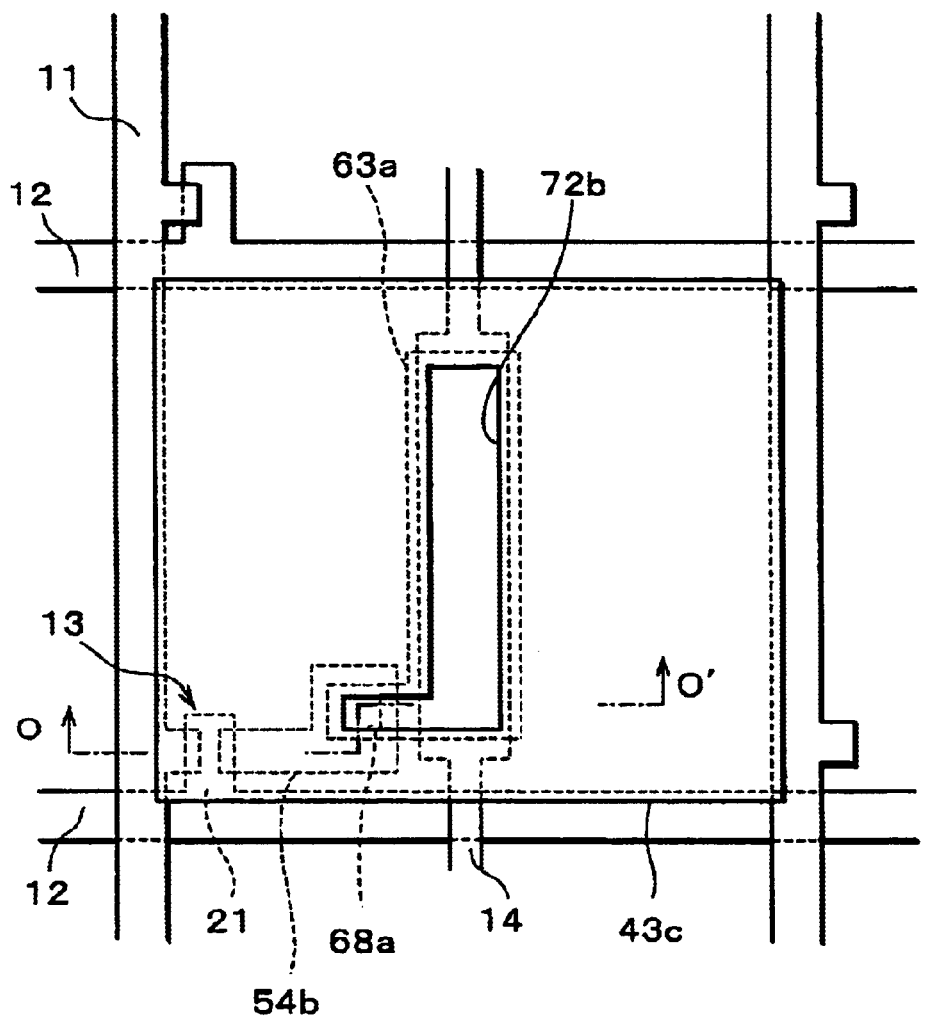
FIG. 30 is a schematic plan view showing an arrangement of an active matrix substrate of a further embodiment in accordance with the present invention.
Figure 31:
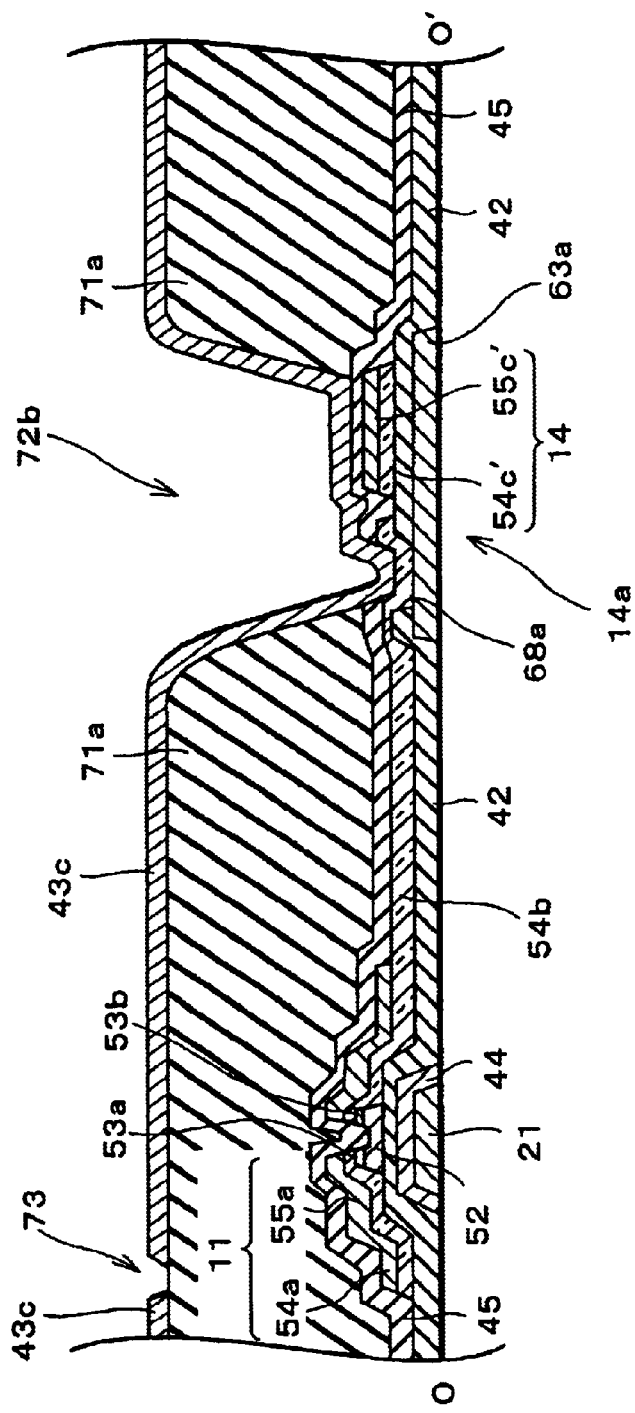
FIG. 31 is a cross-sectional view showing the active matrix substrate shown in FIG. 30, taken along line 0–0'.

Referring to FIG. 30 and FIG. 31, the following description will discuss a further embodiment in accordance with the present invention. Here, for convenience, members of the present embodiment that have the same arrangement and function as members of the previous embodiments, and that are mentioned in the previous embodiments are indicated by the same reference numerals and description thereof is omitted.

The active matrix substrate of the present embodiment includes the same arrangement with the active matrix substrate of the ninth embodiment 9 shown in FIG. 27, except the pattern of the interlayer insulation film, and accordingly, the manners whereby the overlying pixel electrode is deposited.

Specifically, the contact hole 72b is not formed in the interlayer insulation film 71a by the same pattern as the contact hole 68a is formed in the gate insulation film 42. The contact hole 72b is etched out larger than the contact hole 72a shown in FIG. 27 by removing the interlayer insulation film 71 so as to uncover the contact hole 68a and the pixel capacitor wire 14.

In the arrangement, the overlying pixel electrode 43c and the pixel capacitor wire 14 constitute an electrostatic capacity across the protection film 45. Thus, the pixel capacitor wire 14 is flanked by the protection film 45 and the gate insulation film 42 which are in turn flanked by the overlying pixel electrode 43c and the underlying pixel electrode 63a; therefore, the pixel capacitor 14a can double its capacity.

This is because of no other reason but the electrostatic capacity constituted by the overlying pixel electrode 43c and the pixel capacitor wire 14 reinforcing the electrostatic capacity constituted by the underlying pixel electrode 63a and the pixel capacitor wire 14.

The protection film 45 is formed by depositing about 3000 Å thick silicon nitride film that is substantially the same film as the gate insulation film 42. The electrostatic capacity constituted by the overlying pixel electrode 43c and the pixel capacitor wire 14 is substantially as large as the electrostatic capacity constituted by the underlying pixel electrode 63a and the pixel capacitor wire 14.

The pixel capacitor 14a of the foregoing double layer structure occupies a reduced area and thus further improves on the aperture ratio, when adopted in an active matrix substrate in a liquid crystal display device. Besides, the double layer structure enables the pixel capacitor 14a to be readily modified and aptly adopted in an image sensor which needs an extremely large pixel capacitor.

Besides, in comparison to the conventional manufacturing process of an active matrix substrate, the steps do not increase in number at all, and do not need to be fundamentally changed; this enables cheap manufacture of an excellent-performance active matrix substrate, an improved aperture ratio, a reduced load on the pixel capacitor wire and the signal line, an increased pixel capacitor, and further advantages.

The following description will present in organized manner, and further explain, functions and effects of arrangements of the active matrix substrates in accordance with the present invention.

An active matrix substrate in accordance with the present invention incorporates all the features of either a first basic arrangement in accordance with the present invention or a second basic arrangement in accordance with the present invention, and additionally may be such that the storage capacitor electrode is a transparent electrode film, where the first basic arrangement of an active matrix substrate is such that the active matrix substrate includes:
a pixel electrode provided for each pixel constituted by a scanning line and a signal line that are disposed in a matrix as a whole;
a switching element located near a point where the scanning line crosses the signal line, so as to be connected to the scanning line, the signal line, and the pixel electrode;
a storage capacitor electrode for constituting a storage capacitor with the pixel electrode therebetween; and
a storage capacitor common wire disposed parallel to the signal line, wherein
the signal line, the storage capacitor electrode, and the storage capacitor common wire are fabricated from a single electrode layer through patterning thereof, and the second basic arrangement of an active matrix substrate is such that the active matrix substrate includes:
a pixel electrode provided in each pixel area bounded by a scanning line and a signal line that are disposed in a matrix as a whole;
a switching element connected to the scanning line, the signal line, and the pixel electrode;

a storage capacitor electrode for constituting a storage capacitor with the pixel electrode therebetween; and a storage capacitor common wire disposed parallel to the signal line so as to be connected to the storage capacitor electrode, wherein the signal line and the storage capacitor electrode are fabricated from a single electrode layer through patterning thereof.

With the foregoing arrangement, the active matrix substrate does not decrease the aperture ratio of the pixels when incorporated in, for example, a liquid crystal display device. Besides, if the active matrix substrate is used in an image sensor, the light blocking area can be reduced between the transparent substrate and the conversion layer in the image sensor; therefore, the conversion layer can be refreshed efficiently by the method of projecting light to the entirety of the image sensor.

If the storage capacitor common wire is also a transparent electrode film, the aperture ratio of the pixels is further improved, and the foregoing effects are thereby enhanced.

An active matrix substrate in accordance with the present invention incorporates all the features of either one of the first and second basic arrangements, and additionally may be such that the pixel electrode is disposed opposing the storage capacitor electrode across an insulation film for covering the switching element.

With the arrangement, a storage capacitor is constituted by a pixel electrode, an insulation film covering a switching element, and a storage capacitor electrode. Accordingly, with no additional special steps (for example, a step of forming a dielectric layer between a pixel electrode and a storage capacitor electrode), a storage capacitor can be readily formed, and active matrix substrates can be manufactured with improved productivity.

An active matrix substrate in accordance with the present invention may be such that an interlayer insulation film is interposed between the pixel electrode and the insulation film, and also that the pixel electrode is disposed opposing the storage capacitor electrode in contact hole formed through the interlayer insulation film.

With the arrangement, an interlayer insulation film, as well as an insulation film, is interposed between the pixel electrode and the electrode lines (referring to the scanning line, the signal line, the connection electrode, and other electrode wires disposed below the pixel electrode); therefore, the pixel electrode and the electrode lines less affect each other. Besides, the dimensions of the storage capacitor are limited by the dimensions of the contact hole formed through the interlayer insulation film; therefore, the use of a readily patterned interlayer insulation film allows easy and precise control on the value of the storage capacitor.

An active matrix substrate in accordance with the present invention incorporates all the features of a third basic arrangement in accordance with the present invention, and additionally may be such that the signal line and the pixel electrode are fabricated from a single conductive layer through patterning thereof, where the third basic arrangement of an active matrix substrate is such that the active matrix substrate includes:

a pixel electrode provided in each pixel area bounded by a scanning line and a signal line that are disposed in a matrix as a whole;

a switching element connected to the scanning line, the signal line, and the pixel electrode;

a storage capacitor electrode for constituting a storage capacitor; and a storage capacitor common wire disposed parallel to the signal line so as to be connected to the storage capacitor electrode, wherein the storage capacitor is formed between the pixel electrode and the storage capacitor electrode, and the scanning line and the storage capacitor electrode are fabricated from a single electrode layer through patterning thereof.

In the arrangement, the scanning lines are fabricated from the same layer as the storage capacitor electrode, and the signal lines are fabricated from the same layer as the pixel electrode; therefore, after concurrently fabricating the scanning lines and the storage capacitor electrode, the signal lines and the pixel electrode can be fabricated concurrently again. As a result, active matrix substrates that exhibit excellent performance for the cost expended can be manufactured using a device for manufacturing conventional active matrix substrates, with a smaller number of steps.

An active matrix substrate in accordance with the present invention, in order to solve the foregoing problems, may further include an interlayer insulation film on which the pixel electrode is provided.

With the arrangement, the pixel electrode is provided as a top layer of the active matrix, and the pixel electrode can be thereby disposed on the scanning lines, the signal lines, and the storage capacitor common wire; therefore, the pixel can be given a greatly increased aperture area in design. That is, the entire area, except the part required to accommodate a gap between pixel electrodes of adjacent pixels, can serve as an aperture section for the pixel.

Therefore, the active matrix substrate, if incorporated in an image sensor by depositing a conversion layer thereon, can collect electric charges generated in the conversion layer to the pixel electrode at a maximum efficiency, because in the image sensor the area where the pixel electrode is in contact with the conversion layer serves as the aperture section for the pixel.

Further, since the aperture ratio of the pixel can be increased sufficiently, the active matrix substrate is suitably incorporated not only in an image sensor, but also in a liquid crystal display device.

An active matrix substrate in accordance with the present invention incorporates all the features of a fourth basic arrangement in accordance with the present invention, and additionally may be such that the signal line and the storage capacitor electrode are fabricated from a single conductive layer through patterning thereof, where the fourth basic arrangement of an active matrix substrate is such that the active matrix substrate includes:

a pixel electrode provided in each pixel area bounded by a scanning line and a signal line that are disposed in a matrix as a whole;

a switching element connected to the scanning line, the signal line, and the pixel electrode;

a storage capacitor electrode for constituting a storage capacitor with the pixel electrode therebetween; and a storage capacitor common wire disposed parallel to the signal line so as to be connected to the storage capacitor electrode, wherein the scanning line and the pixel electrode are fabricated from a single electrode layer through patterning thereof.

In the arrangement, the scanning lines are fabricated from the same electrode layer as is the pixel electrode, and the signal lines are fabricated from the same electrode layer as is the storage capacitor electrode; therefore, after concurrently fabricating the scanning lines and the pixel electrode, the signal lines and the storage capacitor electrode can be fabricated concurrently again. As a result, active matrix substrates that exhibit excellent performance for the cost expended can be manufactured using a device for manufacturing conventional active matrix substrates, with a smaller number of steps.

An active matrix substrate in accordance with the present invention may be such that the conductive layer is patterned so as to cover a pixel aperture section of the pixel electrode.

With the arrangement, the conversion layer can be deposited so as not to be in direct contact with the pixel electrode; therefore, the pixel electrode is not necessarily made from a material that is compatible with the physical properties of the conversion layer. As a result, the material for the electrode layer fabricated into the scanning lines and the pixel electrode can be chosen from a wider range of selection. Meanwhile, the conductive layer can be made from ITO or other materials that are compatible with the physical properties of the conversion layer and capable of forming a surface that hardly deteriorates.

Hence, unlike the case where the conversion layer is deposited directly on the pixel electrode, no inconvenience is likely to arise where a bare surface of the pixel electrode in the aperture section would be oxidized and could interrupt a satisfactory level of conductance with the conversion layer.

An active matrix substrate in accordance with the present invention incorporates all the features of a fifth basic arrangement in accordance with the present invention, and additionally may be such that the signal lines, the first pixel electrode, and the storage capacitor electrode are fabricated from a single conductive layer through patterning thereof, where the fifth basic arrangement of an active matrix substrate is such that the active matrix substrate includes:
a first pixel electrode provided for each pixel area bounded by a scanning line and a signal line that are disposed in a matrix as a whole;
a switching element connected to the scanning line, the signal line, and the first pixel electrode;
a second pixel electrode connected to the first pixel electrode;
a storage capacitor electrode for constituting a storage capacitor with the second pixel electrode therebetween; and
a storage capacitor common wire disposed parallel to the signal line so as to be connected to the storage capacitor electrode, wherein
the scanning line and the second pixel electrode are fabricated from a single electrode layer through patterning thereof.

In the arrangement, the scanning lines are fabricated from the same layer as the second pixel electrode, whereas the signal lines, the first pixel electrode, and the storage capacitor electrode are fabricated from the same layer; therefore, after concurrently fabricating the scanning lines and the second pixel electrode, the signal lines, the first pixel electrode, and the storage capacitor electrode can be fabricated concurrently again. As a result, active matrix substrates that exhibit excellent performance for the cost expended can be manufactured using a device for manufacturing conventional active matrix substrates, with a smaller number of steps.

An active matrix substrate in accordance with the present invention may further include a connection electrode for connecting the first pixel electrode to the switching element, wherein
the signal line, the connection electrode, and the storage capacitor electrode are fabricated from a single conductive layer through patterning thereof.

With the arrangement, the first pixel electrode is connected to the switching element via the connection electrode; therefore, for example, the first pixel electrode can be provided as the top layer with an insulation layer interposed between the first pixel electrode and the connection layer. This enables the first pixel electrode to be disposed on the scanning lines, the signal lines, and the storage capacitor common wire, and thereby enables the manufacture of an active matrix substrate with a greatly increased aperture area for a pixel.

Further, since the scanning lines and the second pixel electrodes are fabricated from a single layer, and the signal lines, the connection electrode, and the storage capacitor electrode are also fabricated from a single layer, after concurrently fabricating the scanning lines and the second pixel electrode, the signal lines, the connection electrode, and the storage capacitor electrode can be fabricated concurrently again. As a result, active matrix substrates that exhibit more excellent performance for the cost expended can be manufactured using a device for manufacturing conventional active matrix substrates, with a smaller number of steps.

An active matrix substrate in accordance with the present invention may be such that the conductive layer allows light to pass therethrough.

With the arrangement, as earlier mentioned, even if the second pixel electrode blocks light, the second pixel electrode only needs to be provided in an area sufficient for the formation of a storage capacitor, the area where the second pixel electrode is not provided can contribute to the aperture section of the pixel. It is in this aperture section where a light-passing conductive layer is deposited; therefore, light can also pass through the completed aperture section.

As a result, active matrix substrates can be manufactured that are suitable for use in liquid crystal display devices of a transparent type. In addition, if the active matrix substrate is adopted in an image sensor, a sufficient amount of light can be projected on the conversion layer from a desired direction to refresh the conversion layer.

An active matrix substrate in accordance with the present invention may be such that the first pixel electrode and the storage capacitor electrode constitute the storage capacitor across the protection film.

With the arrangement, the storage capacitor electrode is disposed so as to constitute a storage capacitor with the second pixel electrode therebetween; therefore, the storage capacity of a pixel can be doubled by arranging the storage capacitor electrode so as to constitute a storage capacitor with the first pixel electrode across the protection film.

As a result, even if the light blocking second pixel electrode is formed in a limited area from the same electrode layer as is the scanning line, a necessary storage capacitor is still available. The active matrix substrate including such an arrangement can provide a large aperture area when incorporated in a liquid crystal display device of a transparent type.

Further, when incorporated in an image sensor which requires an extremely large storage capacitor, the active matrix substrate readily provides a storage capacitor of the required level.

An active matrix substrate in accordance with the present invention may further include an interlayer insulation film on which the first pixel electrode is provided.

With the arrangement, the first pixel electrode is disposed as the top layer of the active matrix substrate; therefore, the first pixel electrode can be disposed on the scanning lines, the signal lines, and the storage capacitor common wire. As a result, the aperture area of the pixel can be set to an greatly increased value. That is, the entire area between adjacent pixels, except the part required to accommodate a gap between first pixel electrodes, can serve as an aperture section for the pixel.

Hence, if an image sensor is constituted by the foregoing active matrix substrate and a conversion layer deposited thereon; the area where the first pixel electrode is in contact with the conversion layer serves as an aperture section for a pixel; therefore, in the image sensor, the first pixel electrode can collect those electric charges generated in the conversion layer at a maximum efficiency.

Further, since the aperture ratio of the pixel can be increased sufficiently, the active matrix substrate is suitably incorporated not only in an image sensor, but also in a liquid crystal display device.

An active matrix substrate in accordance with the present invention, in order to solve the problem, may be such that the scanning lines are anodized.

With the arrangement, the scanning lines are insulated from the other wires with improved reliability. Therefore, active matrix substrates can be manufactured with improved yields, and it is better ensured that defective lines and other such serious display defects are prevented from developing from insufficiently insulated scanning lines.

Meanwhile, the storage capacity electrode, the pixel electrode, or the second pixel electrode fabricated from the same electrode layer as is the scanning lines through patterning thereof are preferably not anodized. When this is the case, the insulation layer interposed between the pixel electrode and the capacitor storage electrode constituting the storage capacitor or the insulation layer interposed between the second pixel electrode and the capacitor storage electrode constituting the storage capacitor can have a single layer structure constituted by the gate insulation film. As a result, the permitivity can be increased, and the electrostatic capacity per unit area can be hence increased, enabling a relatively large supplementary capacity to be obtained for a relatively small area.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. An active matrix substrate, comprising:
   a pixel electrode provided for each of a plurality of pixels constituted by a scanning line and a signal line;
   a switching element connected to the scanning line, the signal line, and the pixel electrode;
   a storage capacitor electrode constituting a storage capacitor with the pixel electrode therebetween; and
   a storage capacitor common wire disposed parallel to the signal line, wherein
      the signal line, the storage capacitor electrode, and the storage capacitor common wire are fabricated from a single electrode layer through patterning thereof.

2. An active matrix substrate, comprising:
   a pixel electrode provided in each of a plurality of pixel areas bounded by a scanning line and a signal line;
   a switching element connected to the scanning line, the signal line, and the pixel electrode;
   a storage capacitor electrode for constituting a storage capacitor with the pixel electrode therebetween; and
   a storage capacitor common wire disposed parallel to the signal line and connected to the storage capacitor electrode, wherein
      the signal line and the storage capacitor electrode are fabricated from a single electrode layer through patterning thereof.

3. The active matrix substrate as defined in claim 1, wherein the storage capacitor electrode is a transparent electrode film.

4. The active matrix substrate as defined in claim 1, wherein
   the signal line, the storage capacitor common wire, and the storage capacitor electrode include two deposited layers each constituted by either a transparent electrode film or a metal film.

5. The active matrix substrate as defined in claim 1, wherein
   the pixel electrode opposes the storage capacitor electrode across an insulation film covering the switching element.

6. The active matrix substrate as defined in claim 5, further comprising an interlayer insulation film interposed between the pixel electrode and the insulation film, wherein
   the pixel electrode opposes the storage capacitor electrode in a contact hole formed through the interlayer insulation film.

7. The active matrix substrate as defined in claim 5, further comprising an interlayer insulation film provided on the insulation film, wherein
   the pixel electrode is disposed on the interlayer insulation film, and
   the interlayer insulation film is provided with a first contact hole for connecting the pixel electrode to the switching element and a second contact hole for accommodating the pixel electrode opposing the storage capacitor electrode.

8. The active matrix substrate as defined in claim 5, further comprising an interlayer insulation film interposed between the pixel electrode and the insulation film, wherein
   the storage capacitor common wire is formed on the storage capacitor electrode so as to be narrower than the storage capacitor electrode, and
   the pixel electrode opposes the storage capacitor electrode in a contact hole formed through the interlayer insulation film.

9. A method of manufacturing an active matrix substrate including:
   a pixel electrode provided for each of a plurality of pixels constituted by a scanning line and a signal line;
   a switching element connected to the scanning line, the signal line, and the pixel electrode;
   a storage capacitor electrode constituting a storage capacitor with the pixel electrode therebetween; and
   a storage capacitor common wire parallel to the signal line, wherein
      the signal line, the storage capacitor electrode, and the storage capacitor common wire are fabricated from a single electrode layer through patterning thereof,
      said method comprising the step of fabricating the signal line, the storage capacitor electrode, and the storage capacitor common wire from a single electrode layer through patterning thereof.

10. An image sensor, comprising:
   an active matrix substrate;
   a conversion section for converting incident magnetoelectric radiation to electric charges; and
   a bias voltage applicator for causing a storage capacitor to store the electric charges, wherein
   the active matrix substrate includes:
      a pixel electrode provided for each of a plurality of pixels constituted by a scanning line and a signal line;
      a switching element connected to the scanning line, the signal line, and the pixel electrode;
      a storage capacitor electrode constituting a storage capacitor with the pixel electrode therebetween; and
      a storage capacitor common wire disposed parallel to the signal line, wherein
         the signal line, the storage capacitor electrode, and the storage capacitor common wire are fabricated from a single electrode layer through patterning thereof.

* * * * *